(12) United States Patent
Wingard et al.

(10) Patent No.: US 9,292,436 B2
(45) Date of Patent: Mar. 22, 2016

(54) VARIOUS METHODS AND APPARATUS TO SUPPORT TRANSACTIONS WHOSE DATA ADDRESS SEQUENCE WITHIN THAT TRANSACTION CROSSES AN INTERLEAVED CHANNEL ADDRESS BOUNDARY

(75) Inventors: Drew E. Wingard, Palo Alto, CA (US); Chien-Chun Chou, Saratoga, CA (US); Stephen W. Hamilton, Pembroke Pines, FL (US); Ian Andrew Swarbrick, Sunnyvale, CA (US); Vida Vakilotojar, Mountain View, CA (US)

(73) Assignee: Sonics, Inc., Milpitas, CA (US)

( * ) Notice: Subject to any disclaimer, the term of this patent is extended or adjusted under 35 U.S.C. 154(b) by 2372 days.

(21) Appl. No.: 12/145,052

(22) Filed: Jun. 24, 2008

(65) Prior Publication Data

US 2008/0320254 A1    Dec. 25, 2008

Related U.S. Application Data

(60) Provisional application No. 60/946,096, filed on Jun. 25, 2007.

(51) Int. Cl.
*G06F 12/06* (2006.01)
*G06F 15/173* (2006.01)

(52) U.S. Cl.
CPC ...... *G06F 12/0607* (2013.01); *G06F 15/17375* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 5,708,659 | A | 1/1998 | Rostoker et al. |
| 5,781,918 | A * | 7/1998 | Lieberman et al. ............... 711/5 |
| 5,948,089 | A | 9/1999 | Wingard et al. |
| 6,182,183 | B1 | 1/2001 | Wingard et al. |
| 6,249,144 | B1 | 6/2001 | Agrawal et al. |
| 6,330,225 | B1 | 12/2001 | Weber et al. |
| 6,393,500 | B1 | 5/2002 | Thekkath |
| 6,466,825 | B1 | 10/2002 | Wang et al. |
| RE37,980 | E | 2/2003 | Elkhoury et al. |
| 6,526,462 | B1 | 2/2003 | Elabd |

(Continued)

FOREIGN PATENT DOCUMENTS

WO    WO2009/002998    12/2008

OTHER PUBLICATIONS

Cross Reference to Related Applications Under 37 C.F.R. § 1.78, 2 pages, Jul. 1, 2011.

(Continued)

*Primary Examiner* — Jared Rutz
(74) *Attorney, Agent, or Firm* — Rutan & Tucker, LLP

(57) ABSTRACT

A method, apparatus, and system are described, which generally relate to an interconnect routing transactions to target IP cores, including two or more channels making up a first aggregate target. The two or more channels populate an address space assigned to the first aggregate target and appear as a single target to the initiator IP cores. The interconnect implements chopping logic to chop an individual transaction from a first initiator IP core whose address sequence crosses a channel address boundary from a first channel to a second channel within the first aggregate target into two or more burst transactions. A first chopped burst transaction is chopped to fit within the address boundaries of the first channel and a second chopped burst transaction is chopped to fit within the address boundaries of the second channel.

20 Claims, 24 Drawing Sheets

(56) References Cited

U.S. PATENT DOCUMENTS

| | | |
|---|---|---|
| 6,578,117 B2 | 6/2003 | Weber |
| 6,725,313 B1 | 4/2004 | Wingard et al. |
| 6,874,039 B2 | 3/2005 | Ganapathy et al. |
| 6,877,076 B1 | 4/2005 | Cho et al. |
| 7,116,131 B1 | 10/2006 | Chirania et al. |
| 7,120,712 B2 | 10/2006 | Wingard et al. |
| 7,120,765 B2 | 10/2006 | Dodd et al. |
| 7,149,829 B2 | 12/2006 | Weber et al. |
| 7,155,554 B2 | 12/2006 | Vinogradov et al. |
| 7,194,561 B2 | 3/2007 | Weber |
| 7,325,221 B1 | 1/2008 | Wingard et al. |
| 7,543,088 B2 | 6/2009 | Weber et al. |
| 7,543,093 B2 | 6/2009 | Chou et al. |
| 7,552,292 B2 | 6/2009 | Hsieh et al. |
| 7,587,535 B2 | 9/2009 | Sawai |
| 7,598,726 B1 | 10/2009 | Tabatabaei |
| 7,852,343 B2 | 12/2010 | Tanaka et al. |
| 7,899,953 B2 | 3/2011 | Inoue |
| 2002/0083256 A1 | 6/2002 | Pannell |
| 2002/0129173 A1 | 9/2002 | Weber et al. |
| 2002/0129210 A1 | 9/2002 | Arimilli et al. |
| 2003/0004699 A1 | 1/2003 | Choi et al. |
| 2003/0023794 A1 | 1/2003 | Venkitakrishnan et al. |
| 2003/0074520 A1 | 4/2003 | Weber |
| 2003/0088721 A1 | 5/2003 | Sharma |
| 2004/0010652 A1 | 1/2004 | Adams et al. |
| 2004/0177186 A1 | 9/2004 | Wingard et al. |
| 2005/0210164 A1 | 9/2005 | Weber et al. |
| 2006/0047890 A1 | 3/2006 | Van De Waerdt |
| 2006/0218315 A1 | 9/2006 | Okajima et al. |
| 2007/0094429 A1 | 4/2007 | Wingard et al. |
| 2008/0086577 A1 | 4/2008 | Huang |
| 2008/0235421 A1 | 9/2008 | Jayaratnam et al. |
| 2008/0320255 A1 | 12/2008 | Wingard et al. |
| 2008/0320268 A1 | 12/2008 | Wingard et al. |
| 2008/0320476 A1 | 12/2008 | Wingard et al. |
| 2009/0235020 A1 | 9/2009 | Srinivasan et al. |
| 2010/0042759 A1 | 2/2010 | Srinivasan et al. |

OTHER PUBLICATIONS

Ahn, Jung Ho et al, The Design Space of Data-Parallel Memory Systems, IEEE, 12 pages, Nov. 2006.

EP 08780967.9 filed Jun. 25, 2008 Search Report dated Dec. 29, 2010.

Intel Dual-Channel DDR Memory Architecture White Paper informational brochure, Infineon Technologies North America Corporation and Kingston Technology, Company, Inc., 14 pages, Sep. 2003.

OCP (Open Core Protocol) Specification, Release 2.0, OCP International Partnership, OCP-IP Association, 210 pages, 2003.

PCT/US2008/068107 filed Jun. 25, 2008 International Preliminary Report on Patentability dated Jan. 15, 2010.

PCT/US2008/068107 filed Jun. 25, 2008 Search Report dated Oct. 8, 2008.

PCT/US2008/068107 filed Jun. 25, 2008 Written Opinion dated Oct. 8, 2008.

U.S. Appl. No. 12/145,257, filed Jun. 24, 2008 Non-Final Office Action dated Feb. 2, 2011.

U.S. Appl. No. 12/573,669, filed Oct. 5, 2009 Non-Final Office Action dated Apr. 12, 2011.

Weber, Wolf-Dietrich et. al, A Quality-of-Service Mechanism for Interconnection Networks in System-on-Chips, 1530-1591/05, IEEE, 6 pages, 2005.

Weber, Wolf-Dietrich, Efficient Shared DRAM Subsystems for SOCs, Sonics, Inc, Systems on the ICs, pp. 6 pages, 2001.

Wingard, Drew, A Non-Blocking Intelligent Interconnect for AMBA-Connected SoCs, Sonics, Inc., CoWare Arm Developer's Conference, 39 pages, Oct. 6, 2005.

Wingard, Drew, Socket-based Design Using Decoupled Interconnects, Interconnect-Centric Design for Advanced SOC and NOC, 30 pages, 2002.

Wingard, Drew, Sonics SOC Integration Architecture presentation, Systems-On-ICS, 25 pages, Jan. 28, 1999.

Wingard, Drew, Tiles: the Heterogeneous Processing Abstraction for MPSoc presentation, Sonics, Smart Interconnect IP, 5 pages, Jul. 7, 2004.

U.S. Appl. No. 13/276,041, Oct. 18, 2011, Wingard et al.

ExParte Quayle Office Action for U.S. Appl. No. 12/402,704 mailed May 24, 2011, 7 pages.

Final Office Action for U.S. Appl. No. 12/573,669 mailed Sep. 8, 2011, 43 pages.

Haverinen, Anssi, et al, SystemC™ based SoC Communication Modeling for the OCP™ Protocol, V1.0, Oct. 14, 2002, 39 pages.

Advisory Action for U.S. Appl. No. 12/573,669 mailed Dec. 19, 2011, 4 pages.

Office Action for U.S. Appl. No. 12/573,669 mailed Apr. 25, 2012, 44 pages.

\* cited by examiner

562 ↘

| active_targets value | Actual number of active channels in this region | targets mapped to channels | legal for targets with these member counts (if boot/runtime configurable) |
|---|---|---|---|
| <u>564</u> | <u>566</u> | <u>568</u> | <u>570</u> |
| 0 | 0 | none | 8,4,2,1 |
| 1 | 8 | 0-7 | 8 |
| 2 | 4 | 0-3 | 8,4 |
| 3 | 4 | 4-7 | 8 |
| 4 | 2 | 0,1 | 8,4,2 |
| 5 | 2 | 2,3 | 8,4 |
| 6 | 2 | 4,5 | 8 |
| 7 | 2 | 6,7 | 8 |
| 8 | 1 | 0 | 8,4,2,1 |
| 9 | 1 | 1 | 8,4,2 |
| 10 | 1 | 2 | 8,4 |
| 11 | 1 | 3 | 8,4 |
| 12 | 1 | 4 | 8 |
| 13 | 1 | 5 | 8 |
| 14 | 1 | 6 | 8 |
| 15 | 1 | 7 | 8 |

Figure 5

VARIOUS METHODS AND APPARATUS TO SUPPORT TRANSACTIONS WHOSE DATA ADDRESS SEQUENCE WITHIN THAT TRANSACTION CROSSES AN INTERLEAVED CHANNEL ADDRESS BOUNDARY

RELATED APPLICATIONS

This application is related to and claims the benefit of U.S. Provisional Patent Application Ser. No. 60/946,096, titled "AN INTERCONNECT IMPLEMENTING INTERNAL CONTROLS," filed Jun. 25, 2007.

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to an interconnect implementing internal controls. In an embodiment, the interconnect supports transactions whose data address sequence within that transaction crosses an interleaved channel address boundary

BACKGROUND OF THE INVENTION

When an SOC has multiple DRAM interfaces for accessing multiple DRAMs in parallel at differing addresses, each DRAM interface can be commonly referred to as a memory "channel". In the traditional approach, the channels are not interleaved, so the application software and all hardware blocks that generate traffic need to make sure that they spread their traffic evenly across the channels to balance the loading. Also, in the past, the systems use address generators that split a thread into multiple requests, each request being sent to its own memory channel. This forced the software and system functional block to have to be aware of the organization and structure of the memory system when generating initiator requests. Also, in some super computer prior systems, the system forced dividing up a memory channel at the size of burst length request. Also, in some prior art, requests from a processor perform memory operations that are expanded into individual memory addresses by one or more address generators (AGs). To supply adequate parallelism, each AG is capable of generating multiple addresses per cycle to the multiple segments of a divided up memory channel. The memory channel performs the requested accesses and returns read data to a reorder buffer (RB) associated with the originating AG. The reorder buffer collects and reorders replies from the memory channels so they can be presented to the initiator core.

In the traditional approach, the traffic may be split deeply in the memory subsystem in central routing units, which increases traffic and routing congestion, increases design and verification complexity, eliminates topology freedom, and increases latencies. The created centralized point can act as a bandwidth choke point, a routing congestion point, and a cause of longer propagation path lengths that would lower achievable frequency and increase switching power consumption. Also, some systems use re-order buffers to maintain an expected execution order of transactions in the system.

In the typical approach, area-consuming reorder buffering is used at the point where the traffic is being merged on to hold response data that comes too early from a target.

SUMMARY OF THE INVENTION

A method, apparatus, and system are described, which generally relate to an integrated circuit having an interconnect that implements internal controls. The interconnect may maintain transaction path order to support outstanding transactions to multiple targets while maintaining transaction ordering; maintain request path order; maintain response path order; interleave channels in an aggregate target with unconstrained burst sizes; have configurable parameters for channels in an aggregate target and mapping of address regions onto the one or more aggregate targets; chop individual transactions whose data address sequence within that transaction crosses an interleaved channel address boundary in an aggregate target; chop individual 2-Dimensional (2D) transactions that cross channel boundaries headed for channels in an aggregate target so that two or more of the chopped portions retain their 2D burst attributes, as well as implement many other internal controls.

In an embodiment, the interconnect supports transactions whose data address sequence within that transaction crosses an interleaved channel address boundary.

BRIEF DESCRIPTION OF THE DRAWINGS

The drawings refer to embodiments of the invention as follows.

FIG. 5 illustrates an embodiment of a look up table receiving a region's parameter values from a central configuration register to allow flexible re-configuration of a multiple channel aggregate target.

Figure 1:
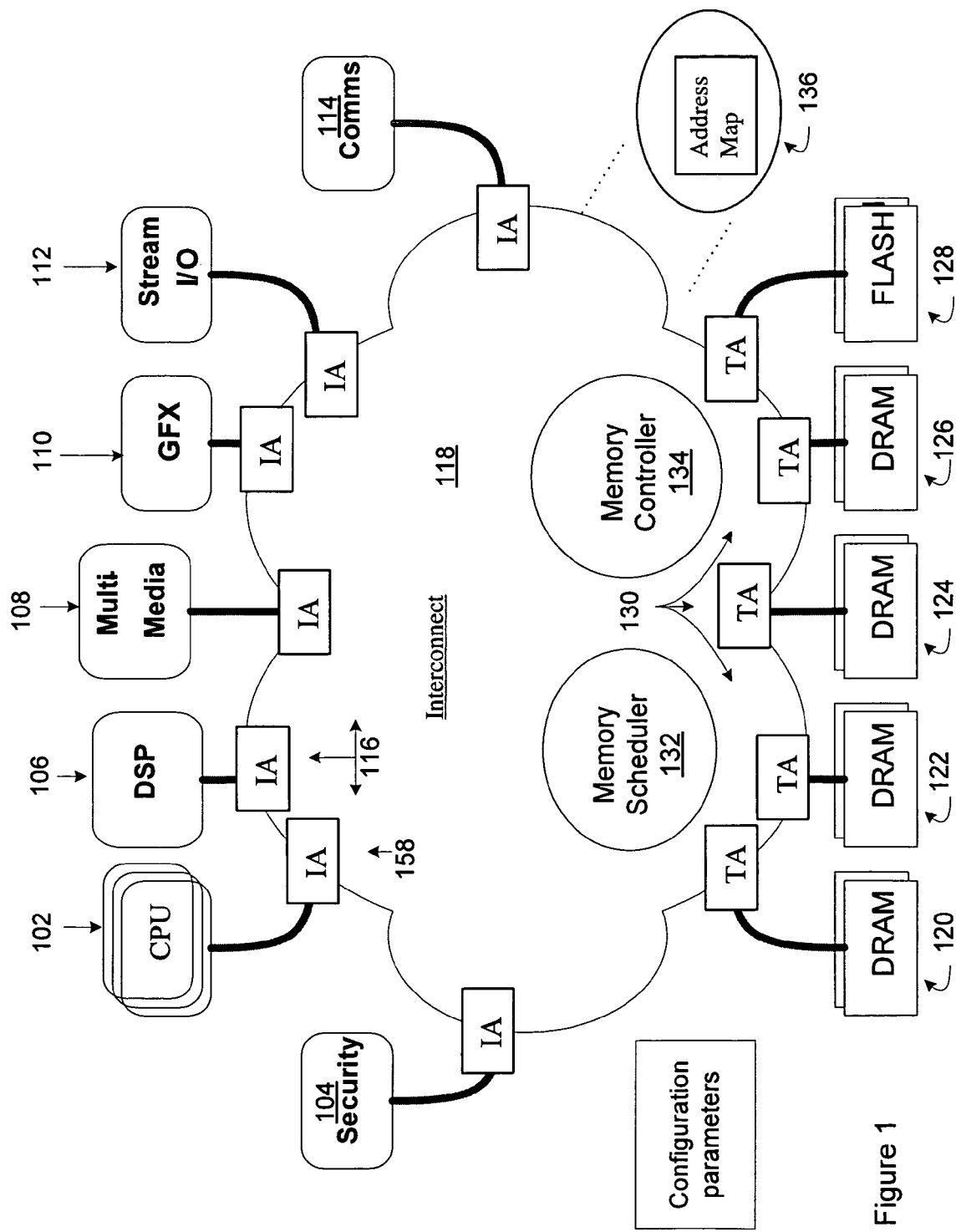
FIG. 1 illustrates a block diagram of an embodiment of a System-on-a-Chip having multiple initiator IP cores and multiple target IP cores that communicate transactions over an interconnect.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory channels in an aggregate target, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references, such as first target, may be made. However, the specific numeric reference should not be interpreted as a literal sequential order but rather interpreted that the first target is different than a second target. Thus, the specific details set forth are merely exemplary. The specific details may be varied from and still be contemplated to be within the spirit and scope of the present invention.

In general, a method, apparatus, and system are described, which generally relate to an integrated circuit having an interconnect that implements internal controls. The interconnect may maintain request path order; maintain response path order; interleave channels in an aggregate target with unconstrained burst sizes; have configurable parameters for channels in an aggregate target; chop individual transactions that cross channel boundaries headed for channels in an aggregate target; chop individual transactions that cross channel boundaries headed for channels in an aggregate target so that two or more or the chopped portions retain their 2D burst attributes, as well as implement many other internal controls.

Most aspects of the invention may be applied in most networking environments and an example integrated circuit such as a System-on-a-Chip environment will be used to flesh out these aspects of the invention.

FIG. 1 illustrates a block diagram of an embodiment of a System-on-a-Chip having multiple initiator IP cores and multiple target IP cores that communicate read and write requests as well as responses to those requests over an interconnect. Each initiator IP core such as a CPU IP core 102, an on-chip security IP core 104, a Digital Signal Processor (DSP) 106 IP core, a multimedia IP core 108, a Graphics IP core 110, a streaming Input-Output (I/O) IP core 112, a communications IP core 114, such as a wireless transmit and receive IP core with devices or components external to the chip, etc. and other similar IP cores may have its own initiator agent 116 to interface with the interconnect 118. Each target IP core such as a first DRAM IP core 120 through a fourth DRAM IP core 126 as well as a FLASH memory IP core 128 may have its own target agent 130 to interface with the interconnect 118. Each DRAM IP core 120-126 may have an associated memory scheduler 132 as well as DRAM controller 134.

The Intellectual Property cores (IP) have self-contained designed functionality to provide that macro function to the system. The interconnect 118 implements an address map 136 with assigned address for the target IP cores 120-128 and potentially the initiator IP cores 102-114 in the system to route the requests and potentially responses between the target IP cores 120-128 and initiator IP cores 102-114 in the integrated circuit. One or more address generators may be in each initiator IP core to provide the addresses associated with data transfers that the IP core will initiate to memories or other target IP cores. All of the IP cores may operate at different performance rates (i.e. peak bandwidth, which can be calculated as the clock frequency times the number of data bit lines (also known as data width), and sustained bandwidth, which represents a required or intended performance level). Most of the distinct IP cores communicate to each other through the memory IP cores 120-126 on and off chip. The DRAM controller 134 and address map 136 in each initiator agent 116 and target agent 130 abstracts the real IP core addresses of each DRAM IP core 120-126 from other on-chip cores by maintaining the address map and performing address translation of assigned logical addresses in the address map to physical IP addresses.

The address mapping hardware logic may also be located inside an initiator agent. The DRAM scheduler & controller may be connected downstream of a target agent. Accordingly, one method for determining the routing of requests from initiators to targets is to implement an address mapping apparatus that associates incoming initiator addresses with specific target IP cores. One embodiment of such an address mapping apparatus is to implement target address decoding logic in each initiator agent. In order for a single initiator to be able to access all of the target IP core locations, the initiator may need to provide more total address values than a single target IP core contains, so the interconnect may translate the initiator address into a target IP core address. One embodiment of such a translation is to remove the initiator address bits that were used to decode the selected target IP core from the address that is presented to the target IP core.

The interconnect 118 provides a shared communications bus between IP core sub-systems 120-128 and 102-114 of the system. All the communication paths in the shared communication bus need not pass through a single choke point rather many distributed pathways may exist in the shared communication bus. The on-chip interconnect 118 may be a collection of mechanisms that may be adapters and/or other logical modules along with interconnecting wires that facilitate address-mapped and arbitrated communication between the multiple Intellectual Property cores 102-114 and 120-128.

The interconnect 118 may be part of an integrated circuit, such as System-on-a-Chip, that is pipelined with buffering to store and move requests and responses in stages through the System-on-a-Chip. The interconnect 118 may have flow control logic that is 1) non-blocking with respect to requests from another thread as well as with respect to requiring a response to an initial request before issuing a subsequent request from the same thread, 2) implements a pipelined protocol, and 3) maintains each thread's expected execution order. The interconnect also may support multiple memory channels, with 2D and address tiling features, response flow control, and chopping of individual burst requests. Each initiator IP core may have its own initiator agent to interface with the interconnect. Each target IP core may have its own target agent to interface with the interconnect.

The System-on-a-Chip may be pipelined to store and move requests and responses in stages through the System-on-a-Chip. The flow control logic in the interconnect is non-blocking with respect to requests from another thread as well as with respect to requiring a response to a first request before issuing a second request from the same thread, pipelined, and maintains each thread's execution order.

Each memory channel may be an IP core or multiple external DRAM chips ganged together to act as a single memory make the width of a data word such as 64 bits or 128 bits. Each IP core and DRAM chip may have multiple banks inside that IP core/chip. Each channel may contain one or more buffers that can store requests and/or responses associated with the channel. These buffers can hold request addresses, write data words, read data words, and other control information associated with channel transactions and can help improve memory throughput by supplying requests and write data to the memory, and receiving read data from the memory, in a pipelined fashion. The buffers can also improve memory throughput by allowing a memory scheduler to exploit address locality to favor requests that target a memory page that is already open, as opposed to servicing a different request that forces that page to be closed in order to open a different page in the same memory bank.

One benefit of a multi-channel aggregate targets is that it provides spatial concurrency to target access, thus increasing effective bandwidth over that achievable with a single target of the same width. An additional benefit is that the total burst size of each channel is smaller than the total burst size of a single channel target with the same bandwidth, since the single channel target would need a data word that is as wide as the sum of the data word sizes of each of the multiple channels in an aggregate target. The multi-channel aggregate target can thus move data between the SoC and memory more efficiently than a single channel target in situations where the data size is smaller than the burst size of the single channel target. In an embodiment, this interconnect supports a strict super-set of the feature set of the previous interconnects.

Connectivity of multi-channel targets may be primarily provided by cross-bar exchanges that have a chain of pipeline points to allow groups of channel targets to be separated on the die. The multiple channel aggregate target covers the high performance needs of digital media dominated SOCs in the general purpose (memory reference and DMA) interconnect space.

Also, the memory channels in an aggregate target may support configurable configuration parameters. The configurable configuration parameters flexibly support a multiple channel configuration that is dynamically changeable and enable a single already-designed System-on-a-Chip design to support a wide range of packaging or printed circuit board-level layout options that use different on-chip or external memory configurations by re-configuring channel-to-region assignments and interleaving boundaries between channels to better support different modes of operation of a single package.

Interleaved Channels in an Aggregate Target with Unconstrained Burst Sizes

Many kinds of IP core target blocks can be combined and have their address space interleaved. The below discussion will use discreet memory blocks as the target blocks being interleaved to create a single aggregate target in the system address space. An example "aggregate target" described below is a collection of individual memory channels, such as distinct external DRAM chips, that share one or more address regions that support interleaved addressing across the aggregate target set. Another aggregate target is a collection of distinct IP blocks that are being recognized and treated as a single target by the system.

Figure 2:
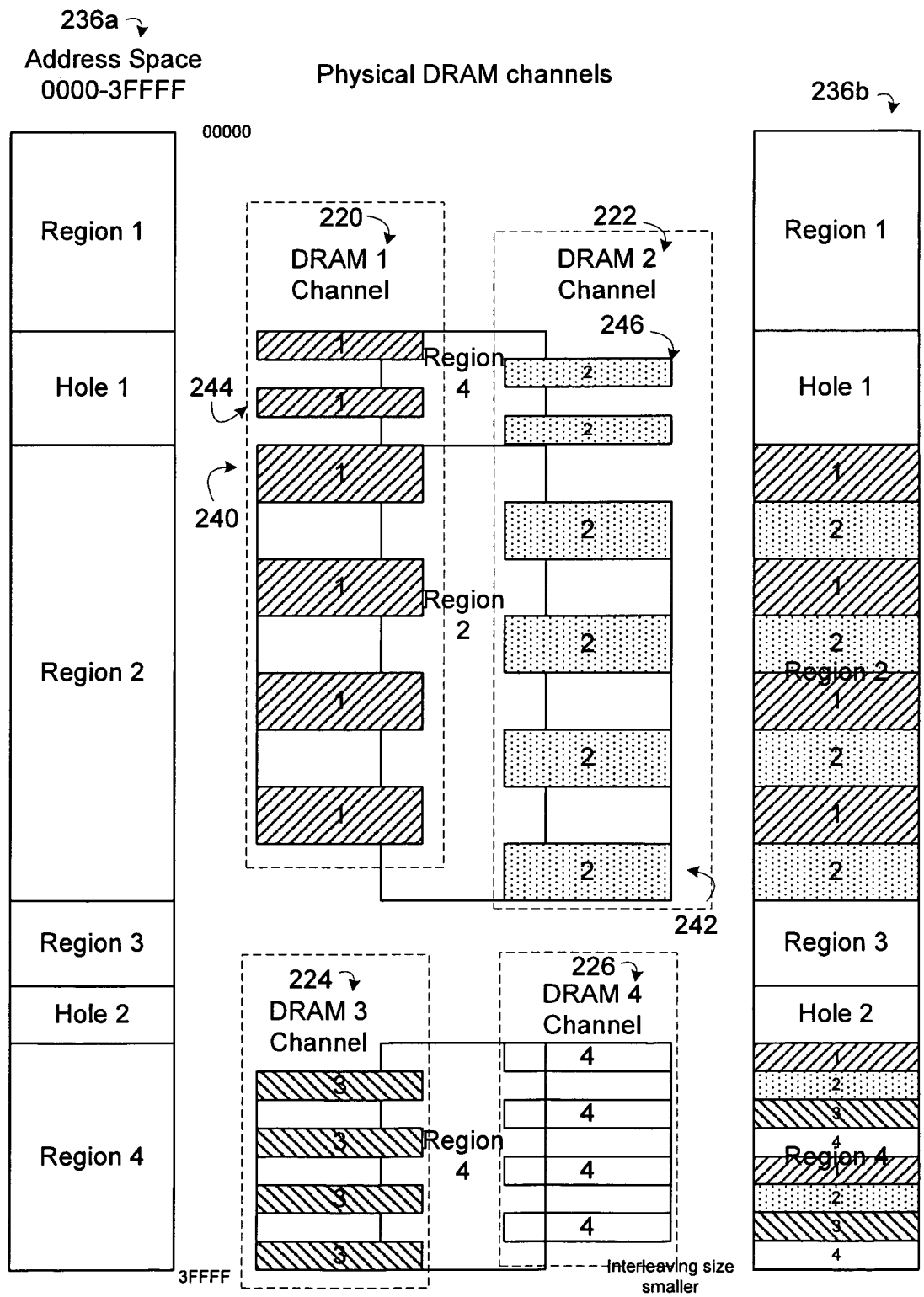
FIG. 2 illustrates an embodiment of a map of contiguous address space in which distinct memory IP cores are divided up in defined memory interleave segments and then interleaved with memory interleave segments from other memory IP cores.

FIG. 2 illustrates an embodiment of a map of contiguous address space in which distinct memory IP cores are divided up in defined memory interleave segments and then interleaved with memory interleave segments from other memory IP cores. Two or more discreet memories channels including on chip IP cores and off chip memory cores may be interleaved with each other to appear to system software and other IP cores as a single memory (i.e. an aggregate target) in the system address space. Each memory channel may be an on-chip IP memory core, an off-chip IP memory core, a standalone memory bank, or similar memory structure. For example, the system may interleave a first DRAM channel 220, a second DRAM channel 222, a third DRAM channel 224, and a fourth DRAM channel 226. Each memory channel 220-226 has two or more defined memory interleave segments such as a first memory interleave segment 240 and a second memory interleave segment 242. The two or more defined memory interleave segments from a given discreet memory channel are interleaved with two or more defined memory interleave segments from other discreet memory channels in the address space of a memory map 236b. The address map 236a may be divided up into two or more regions such as Region 1 thru Region 4, and each interleaved memory segment is assigned to at least one of those regions and populates the system address space for that region as shown in 236b, eventually being mappable to a physical address, in the address space.

For example, memory interleave segments from the first and second DRAM channels 220 and 222 are sized and then interleaved in region 2 of the address map 236b. Also, memory interleave segments from the third and fourth DRAM channels 224 and 226 are sized (at a granularity smaller than interleave segments in the first and second DRAM channels) and then interleaved in region 4 of the address map 236b. Memory interleave segments from the first and second DRAM channels 220 and 222 are also interleaved in region 4 of the address map 236b. Thus, a memory channel may have defined memory interleave segments in the address space of two or more regions and can be implemented through an aliasing technique. Memory interleave segments from the first DRAM channel 220 of a first size, such as a first memory interleave segment 240, are controlled by a configurable parameter of the second region in the address map 236b and interleave segments of a second size, such as a third memory interleave segment 244, are controlled by a configurable parameter of the fourth region in the address map 236b.

Thus, each memory channel 220-226 has defined memory interleave segments and may have memory interleave segments of different sizes. Each corresponding region 4 in the system address map 236b has a configurable parameter, which may be programmable at run time or design time by software, to control the size granularity of the memory interleave segments in the address space assigned to that region potentially based on anticipated type of application expected to have transactions (including read and write requests) with the memory interleave segments in that region. As discussed, for example, the second region in the address map 236b has defined memory interleave segments allocated to that region from the first memory channel 220 that have a configured granularity at a first amount of bytes. Also, the fourth region in the address map 236b has defined memory interleave segments allocated to that region from the first memory channel 220 that have a configured granularity at a second amount of bytes. Also, each region, such as region 4, may have defined memory interleave segments allocated to that region from two or more memory channels 220-226.

Figure 3:
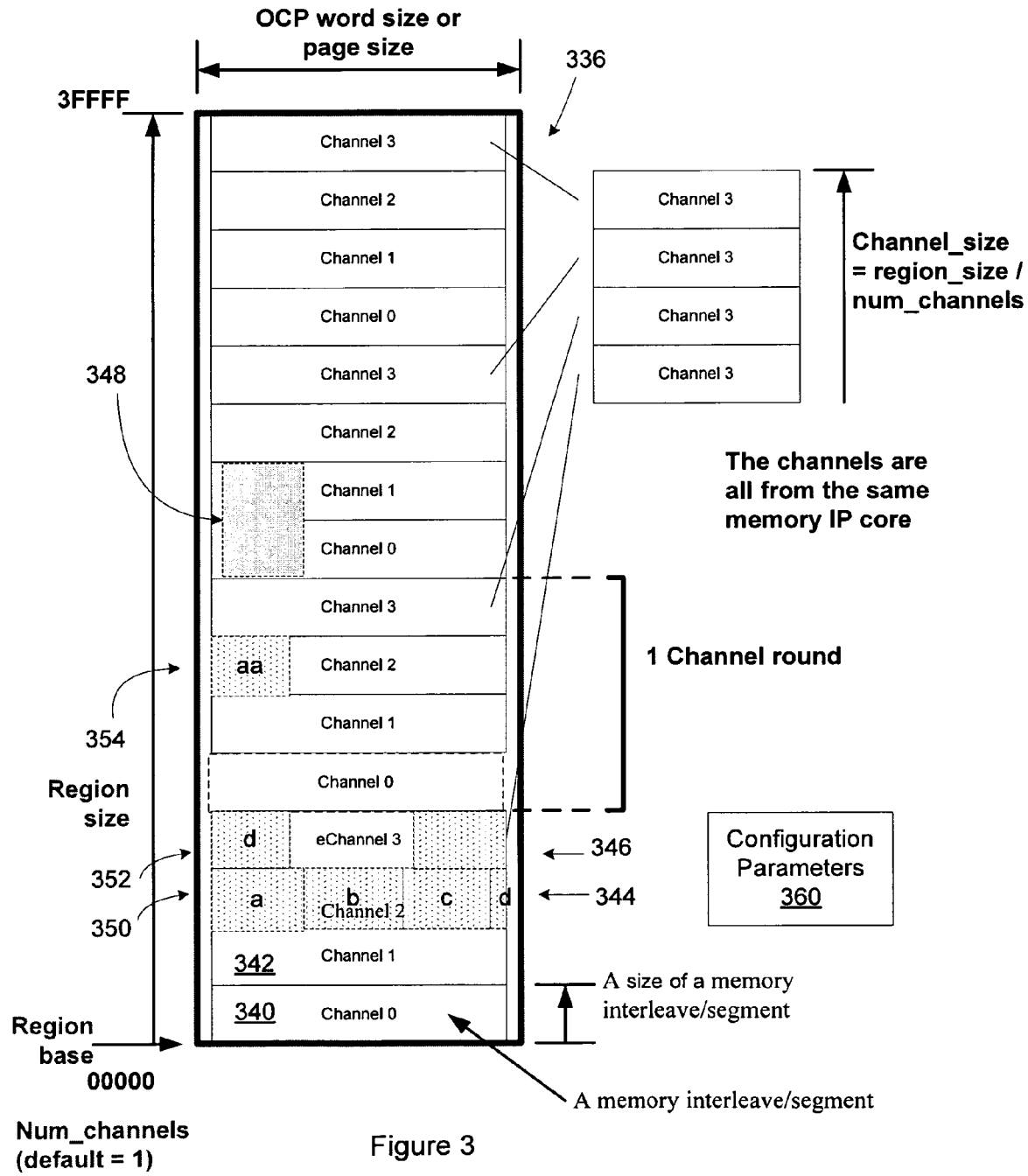
FIG. 3 shows an embodiment of a map of an address region for multiple interleaved memory channels.

FIG. 3 shows an embodiment of a map of an address region for multiple interleaved memory channels. The address region 346 or the address map 336 may have address space for example from 00000 to 3FFFF in the hexadecimal numbering system. The address region 346 has interleaved addressing across multiple channels in an aggregated target. The global address space covered by the address region 346 may be partitioned into the set of defined memory interleave segments from the distinct memory channels. The defined memory interleave segments are non-overlapping in address space and collectively cover and populate the entire region 346 in that address space. Each interleaved memory segment from an on-chip or off-chip IP memory core/channel is then sequential stacked with the defined interleaved segments from the other on-chip IP memory cores to populate address space in the address map. The maximum number of channels associated with a region may be a static value derived from the number of individual targets associated with the region, and from the nature of the target. Individual targets and multi-ported targets may have a single channel; multi-channel targets have up to 2, 4, or 8 channels. In an embodiment, a num_channels attribute is introduced for the "region" construct provided in the RTL.conf syntax and is used to indicate the maximum number of active channels an address region can have. It may be possible to configure the address map to use fewer than the static number of individual targets associated with the region. The first defined memory interleave segment 340 in the region 336 is mapped to channel 0. The second defined memory interleave segment 342 in the region 336 is mapped to channel 1. The third defined memory interleave segment 344 in the region 336 is mapped to channel 2. The next defined memory interleave segment 346 in the region 336 is mapped to channel 3. This process continues until a memory interleave segment is mapped to the last channel active in this region. This completes what is known as a "channel round". The sequential stacking process of memory interleave segments in the address space assigned to a region is then repeated until enough channel rounds are mapped to completely cover the address space assigned to a particular region. This address region 336 will be treated as an aggregate target. A request, for data, such as a first request 348 from that aggregate target in this region may then require response data spans across multiple defined memory interleave segments and thus across multiple discrete memory IP cores. Also, a physical memory location in an on chip or off chip memory may actually be assigned to multiple regions in the system address space and thus have multiple assigned system addresses from that address map to the same physical memory location. Such multiple mapping, sometimes termed address aliasing, can be used to support multiple ways of addressing the same memory location or to support dynamic allocation of the memory location to either one region or the other, when the different regions have different interleaving sizes or channel groupings and may therefore have different access performance characteristics.

Each memory interleave segment is defined and interleaved in the system address space at a size granularity unconstrained by a burst length request allowed by the DRAM memory design specification by a system designer. The size granularity of memory interleave segment may be a defined length between a minimum DRAM burst length request allowed by the DRAM memory design specification configured into the DRAM and an anticipated maximum DRAM memory page length as recognized by the memory configuration. The size of this granularity is a configurable value supplied by user, such as software programmable. For example, the defined length supplied by the user may be between 64 Bytes and 64 Kilobytes.

Logically, this aggregated target presents itself as a single target to other IP cores but interleaves the memory interleave/segments in the address map of the system from multiple on-chip IP memory cores/memory channels. Thus, each DRAM IP core/channel may be physically divided up into interleaving segments at a size granularity supplied by the user. An initiator agent interfacing the interconnect for a first initiator IP core interrogates the address map based on a logical destination address associated with a request to the aggregate target of the interleaved two or more memory channels and determines which memory channels will service the request and how to route the request to the physical IP addresses of each memory channel in the aggregate target servicing that request so that any IP core need not know of the physical IP addresses of each memory channel in the aggregate target.

The access load to each memory core automatically statistically spreads application traffic across the channels by virtue of the system designer configuring the granularity of the interleave segments based on the address patterns associated with expected request traffic to that region/aggregated target. Requests sent by a single initiating thread to a multi-channel address region can cross the interleave boundary such that some transfers are sent to one channel target while others are sent to another channel target within the aggregate target. These requests can be part of a request burst that crossed a channel interleave boundary or independent transactions. Thus, if the expected request traffic that for system is dominated by requests that linearly access memory location by virtue of the code in the programs they run, the size granularity is set up such that the several requests will be serviced by a first memory channel followed by maybe one request falling on both sides of a memory channel boundary followed by several requests being serviced by a second memory channel. The traffic spreading is due to system addressing, size granularity of the memory segment, and the memory channels being stacked sequentially. Thus, for example, requests a-c 350 from a same thread may be serviced by exclusively by memory channel 2, while request d 352 is partially serviced by both memory channel 2 and memory channel 3. This way of sequentially stacking of defined memory interleave segments in the address space from different memory cores/channels allows the inherent spreading/load balancing between memory cores as well as takes advantage of the principle of locality (i.e. requests in thread tend to access memory address in locally close to the last request and potentially reuse the same access data).

Each region in the address map may set its own configurable parameter to control the size granularity of the memory interleave segments in the address space assigned to that region based on 1) address patterns associated with anticipated programs using memory in that region and 2) to take advantage of a principle of address locality of a type of anticipated program using the memory in that region. The interleaving of the multiple memory channels in the address space of the system address map enables automatic statistical spreading of application traffic across each of the memory channels over time, to avoid "hot spots" of uneven load balancing between distinct IP memory cores that can arise when too much traffic targets a subset of the channels making up the aggregated target. By the time the start of the next set of requests is serviced by channel 2, request aa 354, channel 2 should have responded to requests a-d while the requests between e and aa 354 from that thread have been serviced by the other channels making up the aggregate target.

Thus, the system may extract maximum throughput from modern DRAMs by exploiting parallelism and locality. Parallelism is utilized by pipelining memory requests to high-bandwidth DRAM components and also by interleaving accessing over multiple memory channels. Data-parallel memory systems may use memory access scheduling to enhance locality by ordering memory accesses. The ordering improves performance by reusing open rows (i.e. DRAM pages) and by minimizing internal bank conflicts and read-write turnaround penalties.

The system designer may know the typical request size or address increments based on that request size and the order in which request accesses typically occur. Different regions in the address map 336 may be configured to store different types of data/data objects. By defining the right size of granularity of each memory interleave segment within a given region, then several requests will access a same memory channel before needing to cross into another channel boundary, thereby tying up this single memory resource for a couple of cycles rather than multiple memory resources for the same number of cycles. Plus, the page buffer in a first memory core will have previously accessed data in the memory interleave segment and correspondingly stored accessed data in the page buffers of each memory channel in the aggregate target. A single memory access may require multiple DRAM commands to get the desired data to the corresponding page buffers. Having the data in page buffers and reusing that data for several cycles, improves efficiency based on the principle of locality. Also, interleaving memory interleave segments from memory channels at a coarse granularity/bigger size can also take advantage of inter-thread parallelism and reduces the need to keep page buffers from multiple DRAM banks/channels servicing the need of a single request thread. Instead, a single page buffer of one DRAM bank may service that request thread for multiple cycles. Thus, setting the size of a defined memory interleave segment relative to a size of a typical data structure being stored in that region of the address map to take advantage of the principle of locality. If multiple discreet memory cores exist in the system and three requests down the line, the program in the initiator wants the same data as the first request, then that data should still be already stored in the page buffer of the first memory core eliminating some cycles of delay to repeat putting that data back into the page buffer of the first memory channel.

Note, the principle of locality in computing is a concept that deals with the process of accessing a single resource multiple times. There are three basic types of locality that may be factored in: temporal; spatial; and sequential. Temporal Locality, i.e. locality in time, suggests if data or an instruction stored in memory is referenced, that same item will tend to be referenced again soon (e.g., loops, reuse). Spatial Locality, i.e. locality in space, suggests if data or an instruction stored in memory is referenced, items whose addresses are close by tend to be referenced soon. Sequential locality suggests that a memory is typically accessed sequentially by linear programs. Generally, data from linear programs that is related are stored in consecutive locations in memory and in the case of data from multi-dimensional objects that are related that data is stored in a block pattern in memory. The principle of locality is due in part to the manner in which computer programs are created. Designers and users can anticipate the types of programs using the systems memory and set up regions to maximize these principles.

In an embodiment, some of the configurable parameters 360 for each address region a designer or user may supply are: Base_address of the region parameter; region_size parameter; address_space parameter; an association with a target parameter; an interleave_size_parameter; and an active_targets parameter. The interleave_size parameter defines in bytes the size of an interleave/defined memory segment unconstrained by the allowed system request burst length. The system address map supports interleave sizes that are binary powers between, for example, 64 Bytes and 64 Kilobytes, inclusively interleaved in the system address space at a size granularity between a minimum DRAM burst request length (64 Bytes) allowed by the DRAM memory design specification configured into the DRAM and an anticipated maximum DRAM memory page length as recognized by the memory configuration (64 Kilobytes). The region_size for regions should be 1 KB minimum and be large enough for at least 1 channel round=memory interleave segment size*number of memory channels allocating memory interleave segments in that region.

Figure 18:
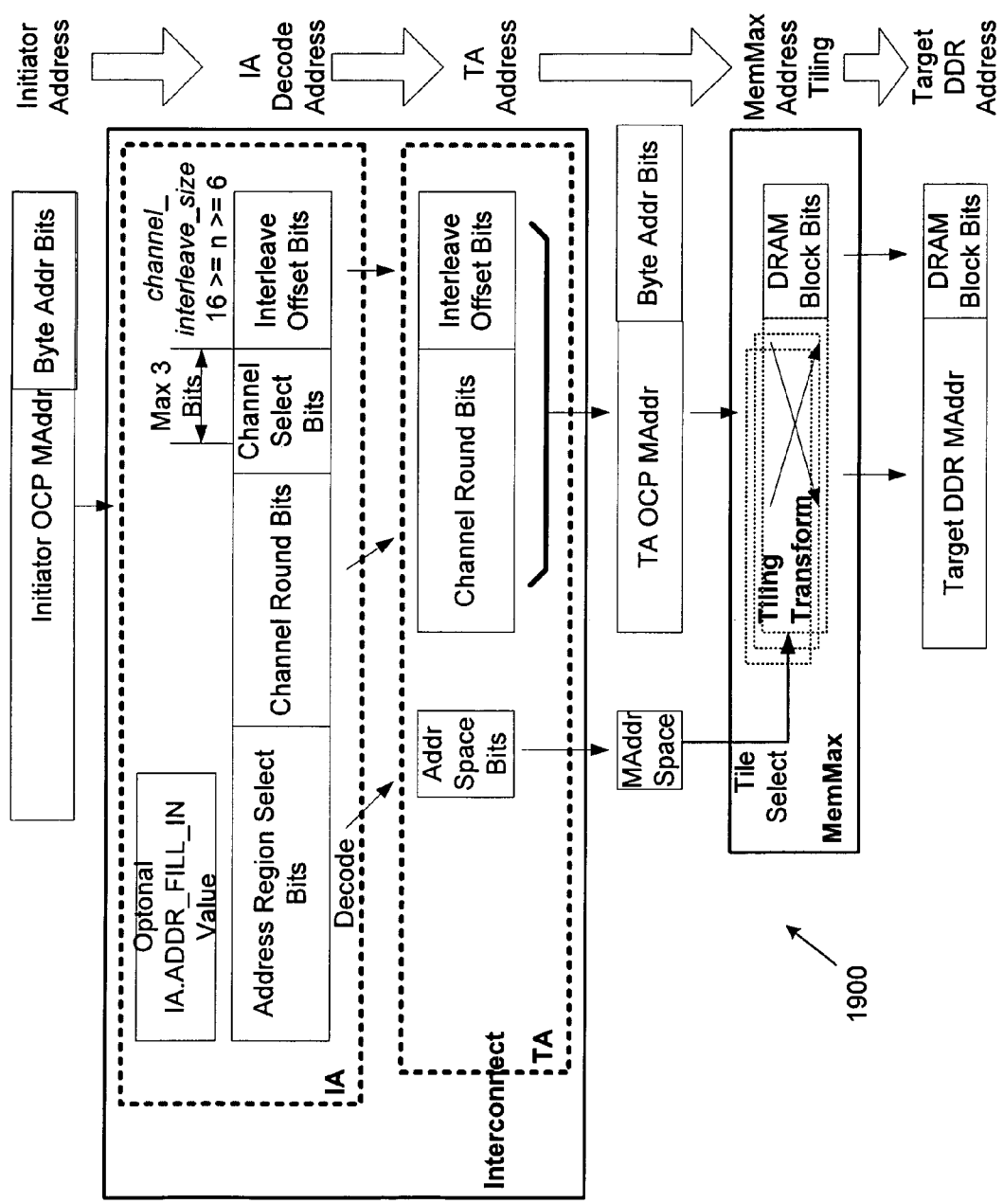
FIG. 18 illustrates an address matching of multi-channel interleaving and address tiling example.

Referring to FIG. 1, an initiator IP core itself and system software are decoupled from knowing the details of the organization and structure of the memory system when generating the addresses of requests going to memory targets. Requests from the initiator cores, such as a CPU 102, to perform memory operations can be expanded into individual memory addresses by one or more address generators (AGs). To supply adequate parallelism, an AG in the initiator agent generates a single address per request, and several AGs may operate in parallel, with each generating accesses from different threads. The address generators translate system addresses in the memory map into real addresses of memory cells within a particular IP memory core or in some cases across a channel boundary similar to as shown in FIG. 18. A generated request may have an address with additional fields for memory channel select bits, which aid in decoding where to retrieve the desired information in a system having one or more aggregated targets. The initiator agents, such as a first initiator agent 158, may have address generators with logic to add channel select bits into the address of a generated request from an IP core. At least part of the address decode of a target's address may occur at the interface of when a request first enters the interconnect such as at an initiators agent. An address decoder may decode an address of a request to route the request to the proper IP memory core based on, for example, the low bits of the memory address. The address decoder removes the channel select bits from the address and then pass the address to the address decoders/generator(s) in the memory controller. The addresses presented to a channel target may be shifted, for example, to the right to compensate for channel selection bit(s). The memory scheduler 132 may also decode/translate a system's memory target address sent in a request to determine a defined memory segments physical location on a chip i.e. (Rank, bank, row and column address information). Each access can be routed to the appropriate memory channel (MC) via a look up table. The address map 136 of details of the organization and structure of the memory system exits in each initiator agent coupled to an IP core. The memory scheduler 132 schedules pending accesses in a channel-buffer, selecting one access during each DRAM command cycle, sending the appropriate command to the DRAM, and updating the state of the pending access. Note that a single memory access may require as many as three DRAM commands to complete. The memory channel then performs the requested accesses and returns one or more responses with the read data to a buffer. The target agent collects replies from the memory channels so they can be presented to the initiator core in the expected in-order response order.

Thus, the initiator cores 102-114 and 120-126 do not need hardware and software built in to keep track of the memory address structure and organization. The initiator cores 102-114 and 120-126 do not need a priori knowledge of the memory address structure and organization. The initiator agents 116 have this information and isolate the cores from needing this knowledge. The initiator agents 116 have this information to choose the true address of the target, the route to the target from the initiator across the interconnect 118, and then the channel route within an aggregated target. The memory scheduler 132 may receive a request sent by the initiator agent and translate the target address and channel route to rank, bank, row and column address information in the various memory channels/IP cores. In an embodiment, the multiple channel nature of an aggregate target is abstracted from the IP cores in the system and puts that structural and organizational knowledge of memory channels onto either each initiator agent 116 in the system or the centralized memory scheduler 132 in the system.

The memory scheduler 132 also supports user defined address tiling (see FIG. 18). Each tiling function can be associated with a specified OCP MAddrSpace. The memory addressable through the memory scheduler 132 can then be mapped into the system address space as multiple regions (non-overlapping), with each having a unique tiling function. Tiling may be used in 2D memory page retrieval for 2-D block transaction optimization. The memory interleave segments in the address space assigned to a first region having a unique tiling function used in the 2D memory page retrieval for the 2-D block request. Those memory interleave segments are addressable through the memory scheduler.

In an embodiment, the protocol used on the interconnect supports aggregate targets containing either 2, 4, or 8 individual targets. The socket protocol and configuration may be identical for individual targets in an aggregate target. The individual targets in an aggregate target may have the same power-of-2 interleaving boundary. The member targets of an aggregate target may connect to a common exchange within the interconnect, or to different exchanges.

The flow control protocol and flow control logic ensure that the transactions are re-assembled correctly in the response path before the corresponding responses are returned to the initiator IP core.

In an embodiment, the interconnect uses a QOS unit. The QOS mode for an aggregate target may be best_efforts, priority, or controlled latency and bandwidth. The Soccomp software tool may check that all targets in an aggregate target set have the same QOS mode. If the mode is either priority or controlled latency and bandwidth, then each thread should be assigned an arbitration priority. All member targets have the same set of threads. The Soccomp software tool may check that all thread arbitration priorities are assigned identically at each member target. Each such target will have register fields for specifying allocated bandwidths. It is not required that these fields have identical parameters at each target regarding software access, exportability, or initial values.

It is desirable in interleaved multi-channel systems that each initiator distributes its accesses across the channels roughly equally. The interleave size has an impact on this. The expected method to allocate bandwidth N to a thread is to program each channel QOS allocation as (N/channels) plus a small tolerance margin. If the application is known to have a channel bias, non-symmetric allocations can be made instead. If region re-definition is used, the number of active channels may differ in different boot setups. Having separate allocations at each channel is useful to accommodate this.

For single channel DRAM targets, the service bandwidth varies between a minimum rate achieved when all accesses are page misses, and a maximum rate achieved when all accesses are page hits. It is usual that guaranteed bandwidth allocations are set higher than the minimum—making application failures possible, but not likely. The probability of these failures is related to what percentage of the service bandwidth is elastic—excess of maximum over minimum.

For multiple channel DRAM, the percentage of service bandwidth that is elastic is greater than for single DRAM. Each channel still has the page locality based elasticity. Additionally, there is elasticity related to the portion of service bandwidth from a single channel that is available to each initiator. If the address streams distribute nicely across channels, then there is a certain level of contention at each channel. If the address streams tend to concentrate at a few channels, then other channels are lightly used (less than 100% utilized), and therefore the aggregate service rate is reduced.

When traffic concentrates at a channel a target thread may get a smaller share of the total service. This will tend to cause the allocation counter accumulate credits. Meanwhile, the thread is less active at other channels. This causes the counters for those channels to accumulate credits also. There is a mechanism to cap credit accumulation. This is to avoid having the thread starve other threads when it becomes active again—introducing service jitter. But if the max caps are set too low, the thread may fail to accumulate credits rightfully allocated to it—failure to receive allocated bandwidth.

So it is likely that multi-channel QOS will exhibit greater jitter than single channel QOS.

Weighted sharing among multiple initiator threads of bandwidth allocated to the target thread is available. This is done through an epoch system that implements fairness groups with late join. The interconnect tracks each epoch for the aggregate target, rather than for each channel. In fact, epochs are tracked at the initiator. Epochs are restarted when a new target is addressed.

In an embodiment, the flow control logic internal to the interconnect may interrogate the address map and a known structural organization of an aggregated target in the integrated circuit to decode an interleaved address space of the aggregated target to determine the physical distinctions between the targets making up the first aggregated target in order to determine which targets making up the first aggregated target need to service a first request. The flow control logic applies a flow control splitting protocol to allow multiple transactions from the same thread to be outstanding to multiple channels of an aggregated target at any given time and the multiple channels in the aggregated target map to IP memory cores having physically different addresses. The flow control logic internal to the interconnect is configured to maintain request order routed to the target IP core. The flow control mechanism cooperates with the flow control logic to allow multiple transactions from the same thread to be outstanding to multiple channels of an aggregated target at any given time and the multiple channels in the aggregated target map to IP memory cores having physically different addresses.

The interconnect implements an address map with assigned addresses for target IP cores in the integrated circuit to route the requests between the target IP cores and initiator IP cores in the integrated circuit. A first aggregate target of the target IP cores includes two or more memory channels that are interleaved in an address space for the first aggregate target in the address map. Each memory channel is divided up in defined memory interleave segments and then interleaved with memory interleave segments from other memory channels. Each memory interleave segment of those memory channels being defined and interleaved in the address space at a size granularity unconstrained by a burst length request allowed by the memory design specification by a system designer. The size granularity of memory interleave segment can be a defined length between a minimum burst length request allowed by a DRAM memory design specification configured into the DRAM and an anticipated maximum DRAM memory page length as recognized by the memory configuration and the size of this granularity is configurable.

The two or more discreet memory channels may include on-chip IP memory cores and off-chip memory cores that are interleaved with each other to appear to system software and other IP cores as a single memory in the address space.

An initiator agent interfacing the interconnect for a first initiator IP core is configured to interrogate the address map based on a logical destination address associated with a first request to the aggregate target of the interleaved two or more memory channels and determines which memory channels will service the first request and how to route the first request to the physical IP addresses of each memory channel in the aggregate target servicing that request so that the first IP core need not know of the physical IP addresses of each memory channel in the aggregate target.

The two or more memory channels are interleaved in the address space of the system address map to enable automatic statistical spreading of application requests across each of the memory channels over time, to avoid locations of uneven load balancing between distinct memory channels that can arise when too much traffic targets a subset of the memory channels making up the aggregated target.

The address map can be divided up into two or more regions and each interleaved memory interleave segment is assigned to at least one of those regions and populates the address space for that region. Memory channels can have defined memory interleave segments in the address space of two or more regions. Memory interleave segments in the address space assigned to a given region having a unique tiling function used in two dimensional (2D) memory page retrieval for the 2-D block request and the memory interleave segments are addressable through a memory scheduler. The memory interleave segments are addressable through a memory scheduler.

Chopping logic internal to the interconnect to chop individual burst transactions that cross channel boundaries headed for channels in the first aggregate target into two or more requests. The chopping logic chops the individual transactions that cross channel boundaries headed for channels in the aggregate target so that the two or more or resulting requests retain their 2D burst attributes.

Configurable Parameters for Channels in an Aggregate Target

Figure 4:
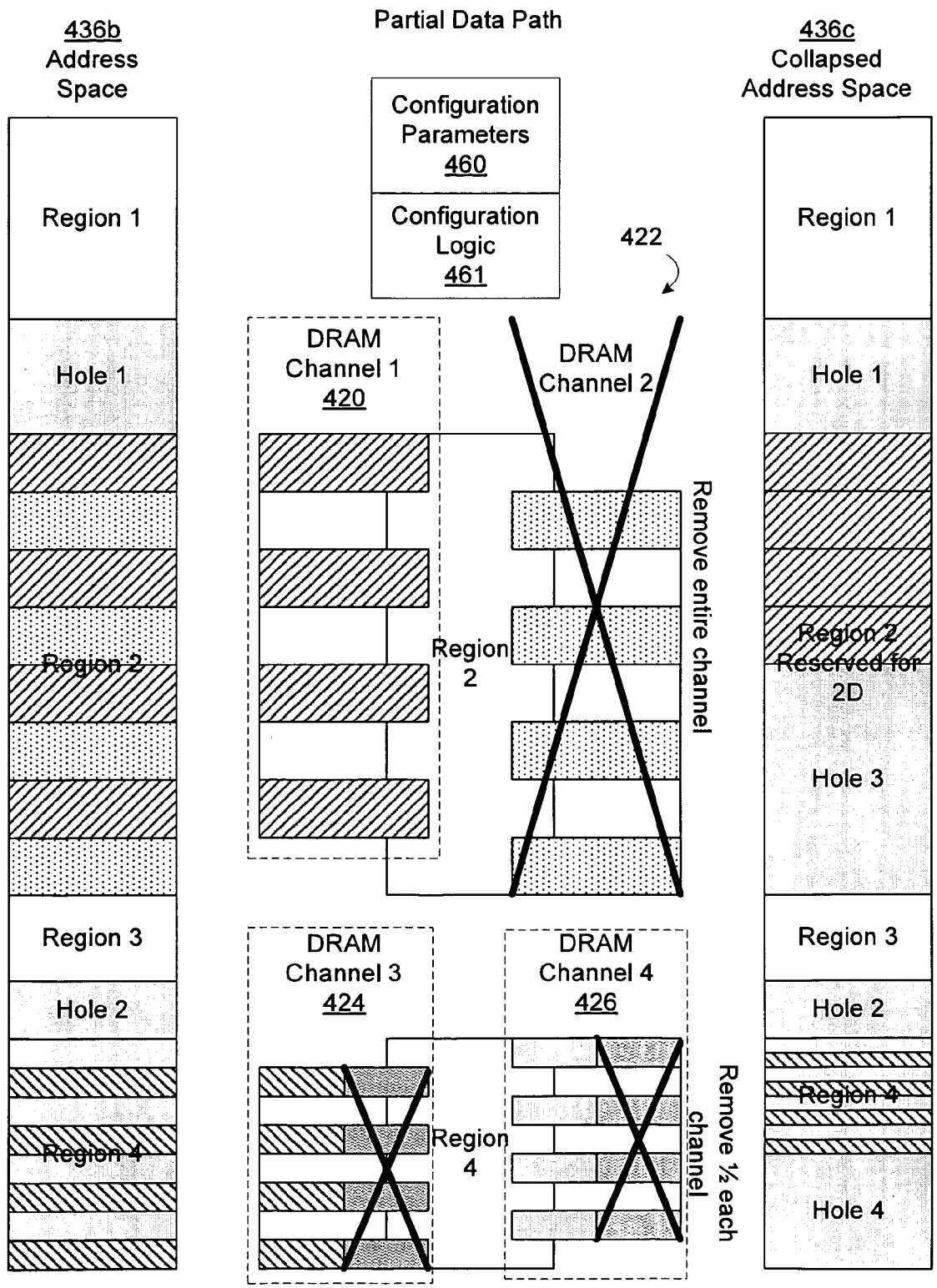
FIG. 4 illustrates a map of contiguous address space with reconfigured parameters in which example distinct DRAM IP cores are divided up in defined memory interleave segments and then interleaved with memory segments from other DRAM IP blocks.

FIG. 4 illustrates a map of contiguous address space with reconfigured parameters in which example distinct DRAM IP cores are divided up in defined memory interleave segments and then interleaved with memory segments from other DRAM IP blocks. A designer or user may supply configuration parameters 460, however, it might be determined after simulations or a design change that one or more DRAM IP blocks are not needed in this design, and the designer can re-program the address map. From a user interface perspective, the user may configure a central register with configuration parameters that allow the user to 1) list a number of discreet IP memory cores, 2) list a number of regions in an address map, 3) map discreet IP memory cores to regions in the address map 4) remove a channel from a region, which then may collapse the system address populated by a remaining channel in that region; 5) reset a channel's presence in a region; 6) alter a system usable space in one or more memory channels in an aggregate target such as even smaller in size/narrower, 7) alter a defined size granularity of memory interleave segments; 8) determine the number of channels in one region, and reassign channels from one region to another, which all will reset an interleaving boundary, have some regions with channels and other regions with no channels 9) any combination thereof, and 10) configure other similar changes to the design.

For example, memory interleave segments from the second DRAM channels 422 can be completely removed, which then may collapse the system addresses populated by the remaining first DRAM channel 420 in that region, region 2, of the address map. Likewise, 436C memory interleave segments from the third and fourth DRAM channels 424, 426 may be configured to be sized at a granularity half of the previous configured sizes for the memory interleave segments in DRAMs 3 and 4 and then interleaved back into region 4 of the address map. The register fields of the central configuration register are configured as export constants.

As discussed, the configurable system parameters flexibly support a multiple c configuration that is dynamically changeable and enable a single already-designed System-on-a-Chip design to support a wide range of packaging options that use different external memory configurations and to re-configure channel-to-region assignments and interleaving boundaries between channels to better support different modes of operation of a single package.

The configuring of configuration parameters may be supplied by a designer via number of ways such as software writing to a register, selecting on-chip pins to set a selectable pin configuration that establishes a configuration mode with logic tied to the selectable pin configuration, activating dedicated control lines carrying this configuration information so components can reference the configuration parameters on these control lines routed throughout the chip, embedding into read-only memories that are interrogatable by software, mating connections to proper package solder bonds, any combination thereof, etc. Accordingly, the parameters in each region may be configured at the following times 1) when the hardware is built, 2) programmed in by OS software at run time, 3) programmed in through electronic design software at design time, 4) physically changed when the device is fabricated by selecting different on-chip pin combinations, 5) changeable after simulations have been run via software, 6) dynamically changed by asserting/de-asserting voltage is carried on particular control lines routed throughout the chip and 7) any combination thereof.

The contents of the configuration register may be replicated and broadcast to each agent connected to the interconnect in the system. The configured parameters are replicated in a look up table maintained locally in each agent to generate an address map in each initiator agent. Thus, a table maintained locally in each agent receives the region's configuration parameter values from a central source of configuration parameters to allow flexible re-configuration of a multiple channel aggregate target.

FIG. 5 illustrates an embodiment of a look up table receiving a region's parameter values from a central configuration register to allow flexible re-configuration of a multiple channel aggregate target. The look up table 562 may contain many of the configuration parameters. The table 562 shows a few example configurable parameters as well as constraints place on what value may be supplied for the configurable parameters. The 'active_targets value' parameter 564 conveys a mode configuration to the rest of the system. The 'actual number of active channels in this region' parameter 566 defines an association between active channels and individual target members of the multiple-channel aggregate target associated with the region. The 'actual number of active channels in this region' parameter 566 will also control the number of channel select bits needed in an address included in a request. The 'targets mapped to channels' parameter 568 indicates a legal physical address assignable to a memory channel. The 'legal for targets with these member counts' parameter 570 conveys constraints from configuration logic to limit the number of supported configuration uses. Not all possible associations are supported.

The configuration logic 461 exists to limit the number of supported configurations and structural organizations rather than making the hardware and the software for general-purpose use. Although the variety of configuration parameters, values for the configuration parameters, and the times when those parameters may be changed makes an already-designed System-on-a-Chip design flexible to support a number of different uses, having configuration logic that limits the number of possible configurations allows the hardware in the interconnect, such as agents, thread merger units, and splitter units, to have less logic and components, as well as communicate less information to configure a specific supported configuration and structural organization, as well as a smaller look up table to be maintained in each initiator agent. Thus, the configuration logic cooperating with the received configuration parameters may limit the amount of legal configurations with the memory system from general purpose to several application specific purposes/configuration to limit the amount of configurable parameters that must be communicated and to limit an amount of logic and hardware physically present on chip to make the IP cores general purpose for all applications.

The table shows the possible example associations for an 8 member multiple-channel aggregate target. For 4 member and 2 member multiple-channel aggregate targets, some values of the active_targets parameter are illegal and generate an ERROR at compile time. Many of the values for the active_targets parameter are of no value for static configurations because the number of active channels is less than the member count of the associated target (e.g. value of 2 for an 8 member target). These values are available to support boot configuration. Compile errors also result if these values are configured for a region that is not boot configurable. For example, active_targets value of 15 and value of 14 are not legal values for a 4-member multi-channel target, nor for a 2-member multi-channel target and generate an ERROR at compile time.

Many of the values for the active_targets attribute 566 are also of no value for "static configurations" because the number of active channels must be equal to the member count of the associated multi-channel target. For instance, a target_actives value of 7 (i.e., 4 active channels) for an 8-member multi-channel target is not legal; but, it is okay for a 4-member multi-channel target. These values are available to support boot configuration of configuration parameters for the system.

In an embodiment, the individual targets that comprise multiple-channel aggregate target may have identical socket configurations. This means that they have identical channel_size as defined by the region parameters. If an individual target core partially populates the addressable channel_size (addr_wdth and channel_size miss-match), then the target is responsible for implementing either aliasing (use of same physical memory space as allocated memory in two or more different regions in the address map) or error detection. The actual number of active channels in this region parameter is available to permit binary sets of individual targets to be de-populated from the multi-channel target. This is usable mainly in bootable configurations. De-populating a multiple channel target this way (without changing other region parameters) reduces the total number of memory interleave segments available at the aggregate target. Assuming the region_size fully covers the multiple channel target, de-populating some of the individual member targets will cause the region to alias the multi-channel target.

The interleave_size parameter may be made boot configurable/runtime programmable by the designer so that it may be changed as external DRAM component density is changed. The actual number of active channels in this region parameter may be made boot configurable by designer so that it may be changed as external DRAM targets are populated or de-populated. The boot configurable active_targets parameter is also usable to select from multiple channel/region assignments. The region_size parameter may be made boot configurable by designer to adjust to variations in external DRAM densities; external DRAM populations; and/or channel/region assignments.

The address map register block contains the following two types of registers: the base register and the control register. Each pair of the base and control registers is corresponding to a multi-channel address region. A base register contains the base address of the multi-channel address region. The fields control register contains the other configuration parameters.

In an embodiment, each address map register pair is corresponding to one multi-channel address region specified in the rtl.conf file for a design. The address map register block and register pairs differ from other register blocks and registers in the way that they are specified. Other register blocks and registers in the design are specified explicitly inside the agents that they belong to using the rtl.conf regblock and register construct.

The ADDR_MAP register block and register pairs are specified in rtl.conf using the address_map and region construct and contain all fields described in those multi-channel address regions. The export capabilities and list of registers that are readable are also specified as part of the address_map and region construct. Software visible registers are created by these registers. Since the ADDR_MAP register block and register pairs cannot be defined explicitly in the rtl.conf file, they are not written out in the rtl.conf file using the regblock and register construct.

Individual register fields in individual registers in the ADDR_MAP register block may be configured as exported constants. This permits region parameters to be boot configurable. Specifically, then the region parameters than may be boot configurable include at least the region_base, region_size, address_space, interleave_size, and active_targets. Each field designated as exported will cause a single central register to be instantiated inside the interconnect, with as many bits as defined for that field. In this way the gate cost impact is directly proportional to the amount of boot configurability defined for the design. The parameters will be broadcast from that single central register to the rest of the interconnect.

The active_targets attribute 560 is available to permit binary sets of individual targets to be de-populated from the multi-channel target. This is usable mainly in bootable configurations. De-populating a multi-channel aggregate target this way (without changing other region attributes) reduces the total number of memory interleave segments available at the aggregate target. Assuming the region size fully covered the multi-channel aggregate target for the fully-populated configuration, de-populating some of the individual member targets will cause the region to alias the multi-channel aggregate target. For instance, when the fully-populated address region as shown in FIG. 3 for a 4-member multi-channel target is de-populated by using an active_targets value of 3, not only the total number of interleaves available for the de-populated address region reduces to 8 (from 16) but these available interleaves are packed toward the region base and the high addressable space (half of the region size) of the address region becomes aliased address space.

After a system designer programs in all of the configuration parameters load simulations can be run. If statistical load balancing over time is not occurring to within the desired characteristics, then the designer can program into the central register different configuration parameters to see if load balancing is now occurring to within the desired characteristics with the new configuration parameters. A similar re-configuration process may be also implemented later in the design cycle such as after a prototype of a chip has been fabricated.

In an embodiment, the interconnect implements an address map with assigned address for target IP cores in the integrated circuit to route the requests between the target IP cores and initiator IP cores in the integrated circuit. A first aggregate target of the target IP cores includes two or more memory channels that are interleaved in an address space for the first aggregate target in the address map. Each memory channel is divided up in defined memory interleave segments and then interleaved with memory interleave segments from other memory channels. The address map is divided up into two or more regions, each interleaved memory interleave segment is assigned to at least one of those regions and populates the address space for that region, and parameters associated with the regions and memory interleave segments are configurable.

A first memory channel has a first memory interleave segment of a first size controlled by a configurable parameter of a first region in the address map and a second interleave segment of a second size controlled by a configurable parameter of a second region in the address map. Each memory interleave segment of those memory channels being defined and interleaved in the address space at a size granularity that is unconstrained by a burst length request allowed by the DRAM memory design specification by a system designer or by the starting address of that burst.

The configurable parameter to control a size granularity of the memory interleave segments in the address space assigned to a given region is based on an anticipated type of application expected to have transactions with the memory interleave segments in that region. The configuration parameters in each region may be configured at the time selected from the group consisting of when the hardware is built, programmed in by OS software at run time, programmed in through electronic design software at design time, physically changed when the device is fabricated by selecting different on-chip pin combinations, changeable after simulations have been run via software, dynamically changed by asserting/de-asserting voltage is carried on particular control lines routed throughout the chip and any combination thereof. The configurable configuration parameters flexibly support a multiple channel configuration that is dynamically changeable and enable a single already-designed System-on-a-Chip design to support a wide range of packaging options that use different external memory configurations and to re-configure channel-to-region assignments and interleaving boundaries between channels to better support different modes of operation of a single package.

The configurable mapping of address regions onto one or more aggregate targets supports different interleave sizes per region, supports different physical channels per aggregate target, and supports run-time assignment of interleave sizes and/or channel assignment into aggregate target or address region.

The configuring of the configuration parameters may be supplied by a designer via number of ways selected from the group consisting of software writing to a register, selecting on-chip pins to set a selectable pin configuration that establishes a configuration mode with logic tied to the selectable pin configuration, activating dedicated control lines carrying this configuration information so components can reference the configuration parameters on these control lines routed throughout the chip, embedding into read-only memories that are interrogatable by software, mating connections to proper package solder bonds, and any combination thereof.

An address region in the address map has defined memory interleave segments allocated to that region from a first memory channel that have a configured granularity at a first amount of bytes and a second region in the address map has defined memory interleave segments allocated to that region from the first memory channel that have a configured granularity at a second amount of bytes.

Each region in the address map may set its own configurable parameter to control the size granularity of the memory interleave segments in the address space assigned to that region based on 1) anticipated programs using memory in that region and 2) to take advantage of a principle of locality of a type of anticipated program using the memory in that region. A user may supply configuration parameters for variables selected from the group consisting of 1) list a number of discreet IP memory cores, 2) list a number of regions in an address map, 3) mapping discreet IP memory cores to regions in the address map 4) remove a channel from a region, which then may collapse the system address populated by a remaining channel in that region; 5) reset a channel's presence in a region; 6) alter a system usable space in one or more memory channels in an aggregate target such as even smaller in size/narrower, 7) alter a defined size granularity of memory interleave segments; 8) determine the number of channels in one region, and reassign channels from one region to another, which all will reset an interleaving boundary, have some regions with channels and other regions with no channels and 9) any combination thereof. A single central configuration register from a user interface perspective exists for a designer to program configuration parameters into this register and the register fields of the central configuration register are configured as export constants.

Configuration logic cooperating with the received configuration parameters limits an amount of legal configurations with the memory system from general purpose to several application specific purposes to limit an amount of configurable parameters that must be communicated and to limit an amount of logic and hardware physically present on chip to make the memory general purpose for all applications. A table maintained locally in each agent receives the region's configuration parameter values from a central source of configuration parameters to allow flexible re-configuration of a multiple channel aggregate target.

The system may also support enhanced concurrency management. The system has support for Open Core Protocol (OCP) threads and OCP tags, and connectivity to AXI with its master IDs it is important that the interconnect have flexible mappings between the external and internal units of concurrency. This will likely take the form of flexible thread/tag mappings. The interconnect has an efficient mechanism for managing concurrency cost verses performance trade-offs. Thread mapping and thread collapsing address may be used to manage concurrency cost verses performance trade-off needs along with a fine granularity of control. Providing combined OCP thread and OCP tag support is one way to address these needs. Also, additional control may be supplied by specifying tag handling where initiator thread merging to target threads occurs. Support for partial thread collapsing is another feature that can address these trade-off needs.

In an embodiment, if an initiator agent connects to one individual target agent in a multi-channel target, this initiator agent should connect to all individual target agents in the multi-channel target.

Maintaining Request Path Order

Figure 6A:
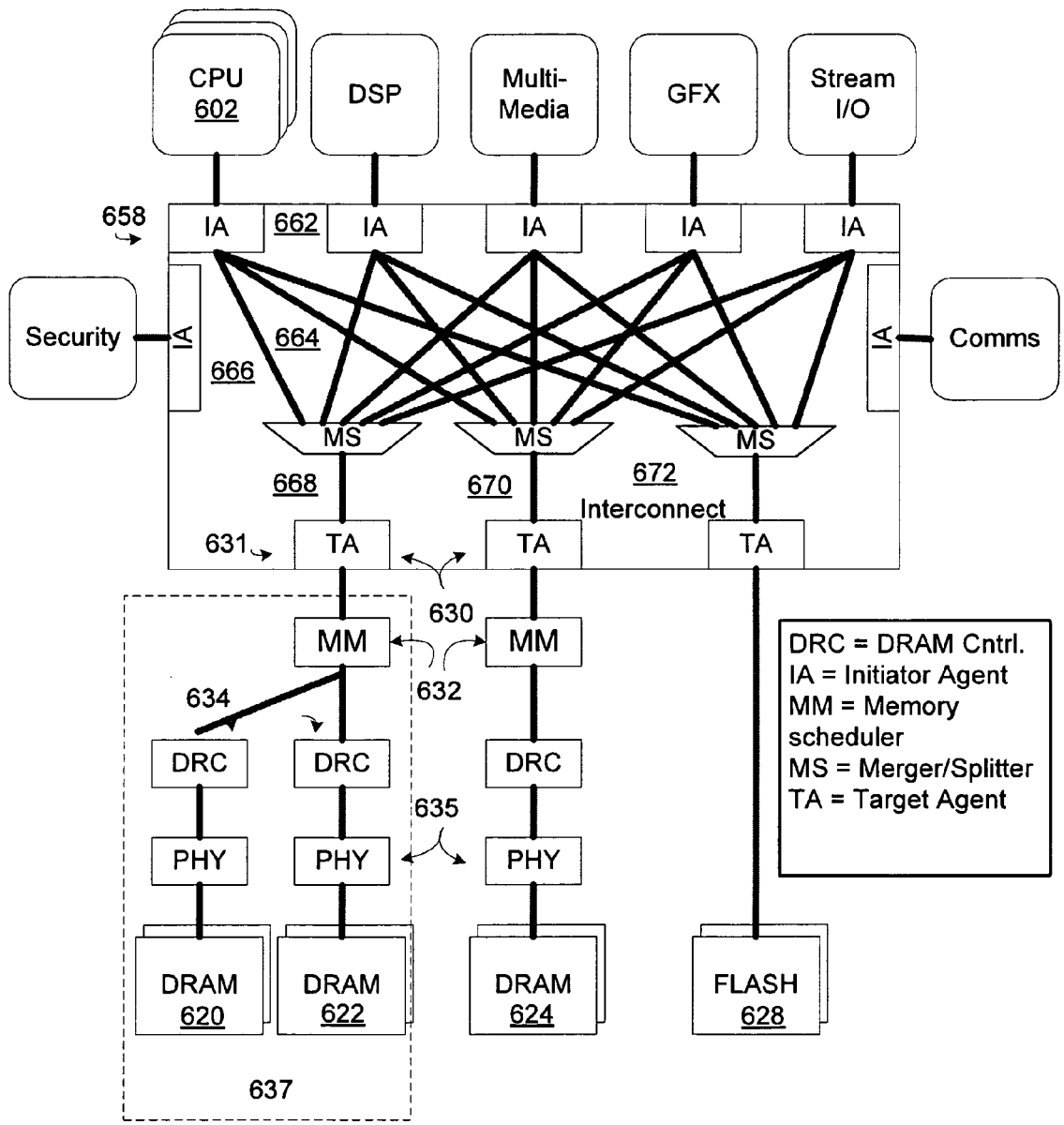
FIG. 6A illustrates a block diagram of an embodiment of a integrated circuit having multiple initiator IP cores and multiple target IP cores that maintains request order for read and write requests over an interconnect that has multiple thread merger and thread splitter units.

FIG. 6A illustrates a block diagram of an embodiment of a integrated circuit, such as a SoC, having multiple initiator IP cores and multiple target IP cores that maintains request order for read and write requests over an interconnect that has multiple thread merger and thread splitter units. Each initiator IP core such as a Central Processor Unit IP core 602 may have its own initiator agent 658 to interface with the interconnect 672. Each target IP core such as a first DRAM IP core may have its own initiator agent to interface with the interconnect 672. Each DRAM IP core 620-624 may have an associated memory scheduler 632, DRAM controller 634, and PHY unit 635. The interconnect 672 implements flow control logic internal to the interconnect 672 itself to manage an order of when each issued request in a given thread arrives at its destination address for each thread on a per thread basis. The interconnect 672 also implements flow control protocol internal to the interconnect in the response network to enforce ordering restrictions of when to return responses within a same thread in an order in which the corresponding requests where transmitted. The interconnect 672 implements flow control logic and flow control protocol internal to the interconnect itself to manage expected execution ordering a set of issued requests within the same thread that are serviced and responses returned in order with respect to each other but independent of an ordering of another thread. The flow control logic at a thread splitter unit permits transactions from one initiator thread to be outstanding to multiple channels at once and therefore to multiple individual targets within a multi-channel target at once. This includes a transaction targeted at two different channels, as well as, two transactions (from the same initiator thread) each targeted at a single but different channel, where these two different channels are mapped to two individual targets within a multi-channel target.

Thread splitter units near or in an initiator agent sends parts of the thread, such as requests, to multiple separate physical pathways on the chip. For example, a thread splitter unit in the first initiator agent 658 associated with the CPU core 602 can route transactions in a given thread down a first physical pathway 662 to a first combined thread merger-splitter unit 668, down a second physical pathway 664 to a second combined thread merger-splitter unit 670, or down a third physical pathway 666 to a third combined thread merger-splitter unit 672. The flow control logic applies the flow control splitting protocol to splitting the traffic early where it makes sense due to the physical routing of parts of that set of transactions being routed on separate physical pathways in the system as well as being routed to targets physically located in different areas in the system/on the chip.

Thread merger units near or in a target agent ensures that responses to the requests from that thread segment come back from the target core to the initiator core in the expected in-order response order. For example, the first thread merger unit 668 near the first target agent 631 ensures that responses to the requests from a given thread come back from the first target DRAM IP core 620 and the second target DRAM IP core 622 to the first initiator core 662 in the expected in-order response order.

Threads from two different initiators may be combined into a single third thread in a thread merger unit. Parts of a single thread may be split into two different threads in a thread splitter unit. The merger and splitter units may use thread id mapping to combine or split threads having different thread identifiers. Each thread merger unit and thread splitter unit may maintain a local order of transactions at that splitting-merger point and couple that system with a simple flow control mechanism for responses.

As discusses, a thread splitter unit in an initiator agent such as a first initiator agent 658 may split a set of transactions in a given thread from a connected initiator IP core where the split up parts of the set of transactions are being routed on separate physical pathways to their intended target (i.e. two different channels and two different target IP cores). The flow control logic associated with that splitter unit implements flow control stopping an issuance of a next request from the same thread headed to a physical pathway other than the physical pathway being used by outstanding requests in that thread same to allow a switch to the other physical pathway and the switch to route requests from the same thread with destination addresses down the other physical pathway to occur when all acknowledge notifications from outstanding requests in that same thread going to a current physical pathway are returned to the splitter unit. The flow control logic may be part of a thread splitter unit or a separate block of logic coordinating with a thread splitter unit target. Thus, the thread splitter unit implements flow control to prevent an issuance of a next request from the same thread headed to a first physical pathway 662, such as a link, other than a current physical pathway being used by outstanding requests in that same thread until all acknowledge notifications from outstanding requests in that same thread going to the current physical pathway are communicated back to the thread splitter unit.

The flow control logic tracks acknowledge notifications from requests within the same thread, indicating safe arrival of those requests, to ensure all previous requests headed toward an intended target have reached a last thread merger unit prior to the intended target IP core before requests from the same thread are routed along a separate physical path to second intended target. The flow control logic applies a flow control protocol to stop issuance of requests from the same thread merely when requests from that thread are being routed to separate physical pathways in the system. The thread splitter unit and associated flow control logic allow much more flexibility about where in the interconnect topology each target or channel is attached and minimizes the traffic and routing congestion issues associated with a centralized target/channel splitter.

In an embodiment, address decoding the intended address of the request from a thread happens as soon as the request enters the interconnect interface such as at the initiator agent. The flow control logic interrogates the address map and a known structural organization of each aggregated target in the system to decode an interleaved address space of the aggregated targets to determine the physical distinctions between the targets making up a particular aggregated target in order to determine which targets making up the first aggregated target need to service a current request. The multiple channels in the aggregated target 637 map to IP memory cores 620 and 622 having physically different addresses. The flow logic may cooperate with the chopping logic which understands the known structural organization of the aggregated targets including how the memory interleave segments wrap across channel boundaries of different channels in a channel round back to the original channel and then repeats this wrapping nature. Thus, the flow logic of an initiator agent may route requests to both a proper channel, such as 620 and 622, in an aggregated target 637, and a specific target 628 amongst all the other targets on the chip. Overall, the flow control logic such as applies the flow control splitting protocol to allow multiple transactions from the same thread to be outstanding to multiple channels at any given time.

Figure 6B:
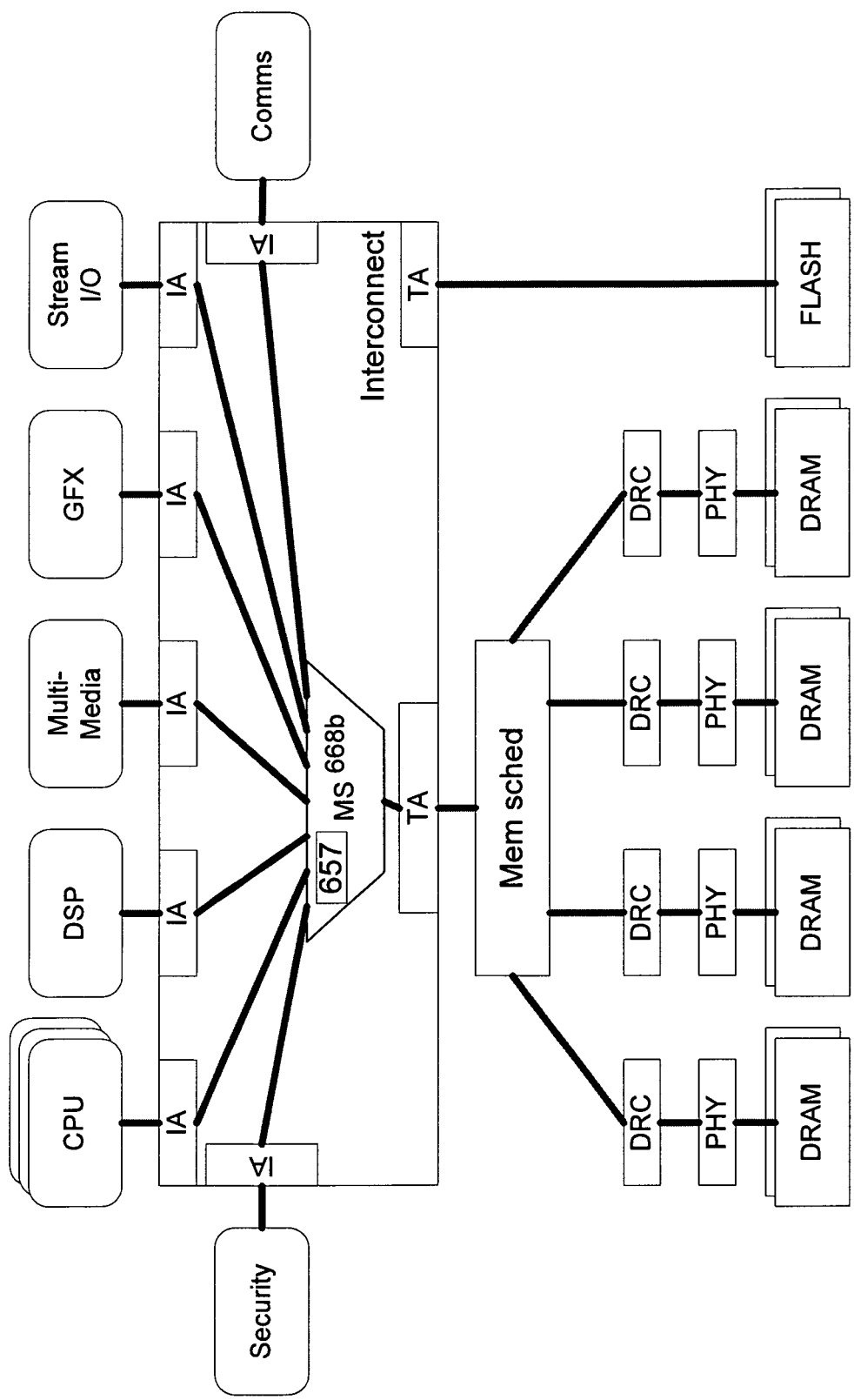
FIG. 6b illustrates a block diagram of an embodiment of flow control logic implemented in a centralized merger splitter unit to maintain request path order.

Requests being routed through separate physical pathways can be split at an initiator agent as well as other splitter units in a cascaded splitter unit highly pipelined system. FIG. 6b illustrates a block diagram of an embodiment of flow control logic 657 implemented in a centralized merger splitter unit 668b to maintain request path order.

Figure 7A:
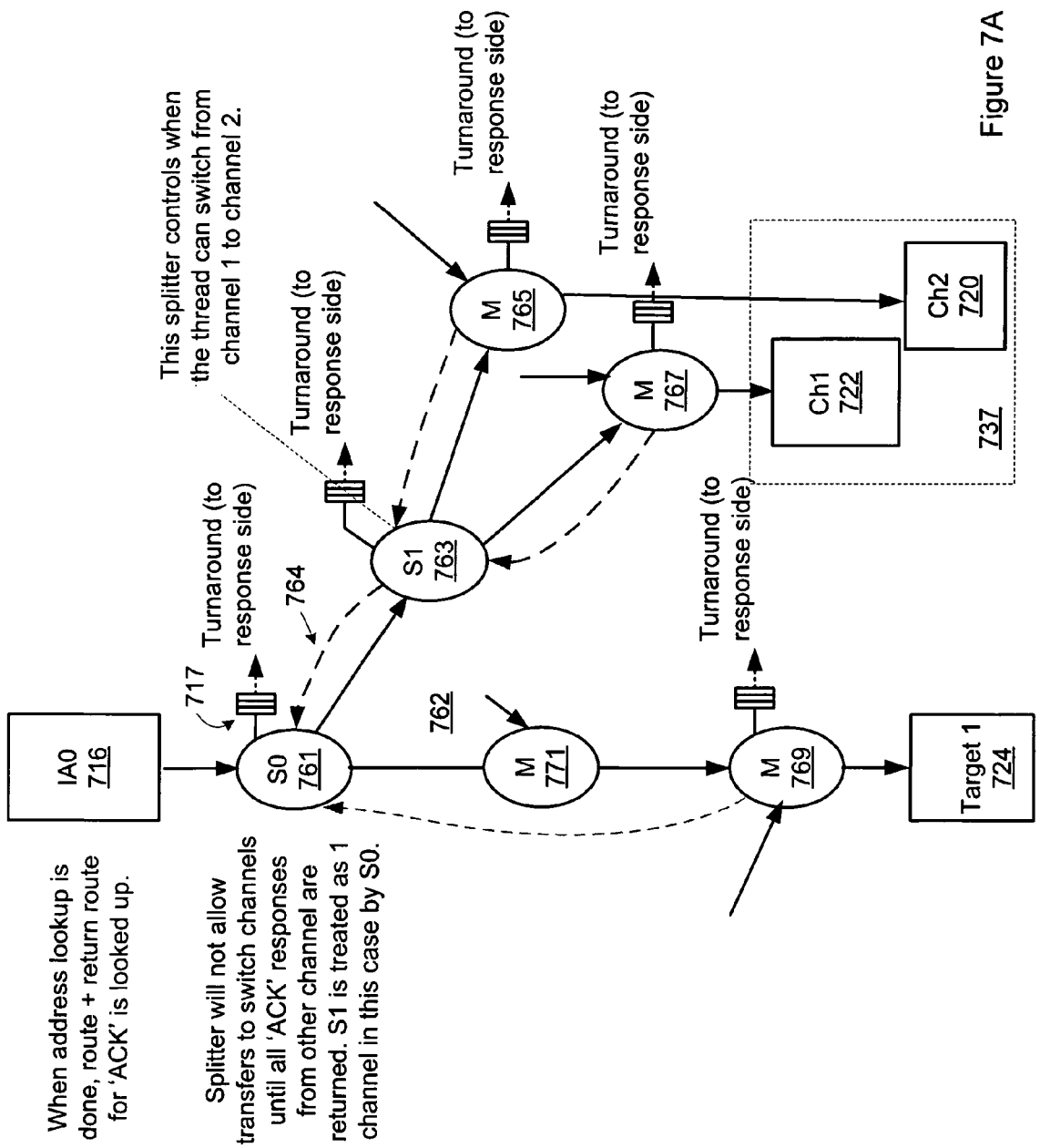
FIG. 7a illustrates a block diagram of an embodiment of one or more thread splitter units to route requests from an initiator IP core generating a set of transactions in a thread down two or more different physical paths.

FIG. 7a illustrates a block diagram of an embodiment of one or more thread splitter units to route requests from an initiator IP core 716 generating a set of transactions in a thread down two or more different physical paths by routing a first request with a destination address headed to a first physical location on the chip, such as a first target 724, and other requests within that thread having a destination address headed to different physical locations on the chip from the first physical location such as a first channel 722 and a second channel 720 making up an aggregate second target 737. The first and second channels 720 and 722 share an address region to appear as single logical aggregated target 737. The initiator agent 716 may route requests from the thread to a first thread splitter unit. The first thread splitter unit 761 may route the request depending on its destination address down one or more different physical pathways such as a first link 762 and a second link 764.

In the IA 716, when the address lookup is done, then a request destination physical route determination and a return route for acknowledge notification determination are looked up. The IA 716 looks up the acknowledge notification return route statically at the time when the sending address/route lookup takes place. An ordered flow queue such as a first order flow queue 717, exists per received thread in each thread splitter unit 761 and 763, and thread merger unit 765, 767, 769 and 771. The ordered flow queue may have a First-In-First-Out ordering structure. One turnaround First-In-First-Out ordered flow queue may be maintained per received thread in that first splitter unit. Logic circuitry and one or more tables locally maintain a history of requests in each ordered flow queue of transactions entering/being stored in that ordered flow queue. As discussed, the flow logic tracks acknowledge notifications/signals from requests from within the same thread to ensure all previous requests headed toward an intended target have reached the last merger unit prior to the intended target before requests from the same thread are routed along a separate physical path to second intended target.

The first-in-first-out inherent ordering of the queue may be used to establish a local order of received requests in a thread and this maintained local order of requests in a particular thread may be used to compare requests to other requests in that same thread to ensure a subsequent request to a different link is not released from the splitter unit until all earlier requests from that same thread going to the same target have communicated acknowledge signals back to the splitter unit that is splitting parts of that thread.

The thread splitter units are typically located where a single transaction in a given thread may be split into two or more transactions, and the split up parts of the single transaction are being routed on separate physical pathways to their intended targets. In an embodiment, when a transaction transfer/part of the original request reaches a last serialization point (such as the last thread merger unit) prior to the intended target of that transfer, then an acknowledge notification is routed back to the initial thread splitter unit. Note, pending transactions are serialized until an acknowledge signal is received from all previous requests from a different physical path but not serialized with respect to receiving a response to any of those requests in that thread. The flow control protocol for requests is also has non-blocking nature with respect to other threads as well as non-blocking with respect to requiring a response to a first request before issuing a second request from the same thread.

A first thread splitting unit 761 may be cascaded in the request path with a second thread splitting unit 763. Subsequent thread splitter units in the physical path between an initial thread splitter unit and the intended aggregated target channel may be treated as a target channel by the flow control logic associated with the initial thread splitter unit. Request path thread merger units can be cascaded too, but the acknowledge notification for each thread should come from the last thread merger on the path to the intended target channel. As discussed, thread splitter units can be cascaded, but acknowledge notification needs to go back to all splitters in the path. The flow logic in each splitter unit in the physical path blocks changes to a different 'branch/physical pathway' until all acknowledge notifications from the open branch are received. Note, the response return network may be an exact parallel of the forward request network illustrated in FIG. 7a and could even use the same interconnect links 762 and 764 with reverse flow control added.

In an embodiment, an upstream splitter unit will continue to send multiple requests from a given thread to another splitter until the subsequent request needs to be split down the separate physical pathway at the downstream thread splitter unit. The downstream splitter unit causing the pathway splitting then implements flow control buffering of the subsequent request from the same thread heading down the separate physical pathway than all of the outstanding requests from that thread until all of the outstanding requests from that thread headed down the initial physical pathway have communicated an acknowledge notification of receipt of those outstanding requests to the downstream thread splitter unit causing the pathway splitting.

The acknowledge notification may be implied and thereby negates a return of an actual acknowledge notification for a request in both situations 1) if no thread splitter units exist between an initial thread splitter unit and a last thread merger unit prior to the final destination address of the request and 2) if no other thread affecting components exist between the initial thread splitter unit and the downstream thread splitter unit.

In an embodiment, the interconnect for the integrated circuit communicates transactions between the one or more initiator Intellectual Property (IP) cores and multiple target IP cores coupled to the interconnect. The interconnect may implement a flow control mechanism having logic configured to support multiple transactions issued from a first initiator in parallel with respect to each other and issued to, at least one of, 1) multiple discreet target IP cores and 2) an aggregate target IP core that includes two or more memory channels that are interleaved in an address space for the aggregate target in an address map, while maintaining an expected execution order within the transactions. The flow control mechanism has logic that supports a second transaction to be issued from the first initiator IP core to a second target IP core before a first transaction issued from the same first initiator IP core to a first target IP core has completed while ensuring that the first transaction completes before the second transaction and while ensuring an expected execution order within the first transaction is maintained. The first and second transactions are part of a same thread from the same initiator IP core. The first and second transactions are each composed of one or more requests and one or more optional responses. An initiator sending a request and a target sending a response to the request would be a transaction. Thus, a write from the initiator and a write from the target in response to the original write would still be a transaction.

The interconnect may implement flow control logic internal to the interconnect itself to manage expected execution ordering a set of issued requests within the same thread from the same initiator that are serviced in order with respect to each other but independent of an ordering of another thread. The flow control logic is associated with a thread splitter unit in a request path to a destination address of a target IP core and the thread splitter unit implements flow control to prevent an issuance of a next request from the same thread headed to a first physical pathway, other than a current physical pathway being used by outstanding requests in that same thread until all acknowledge notifications from outstanding requests in that same thread going to the current physical pathway are communicated back to the thread splitter unit.

The flow control logic is configured to track acknowledge notifications from requests within the same thread, indicating safe arrival of those requests, to ensure all previous requests headed toward an intended target have reached a last thread merger unit prior to the intended target before requests from the same thread are routed along a separate physical path to second intended target. An ordered flow queue exists per received thread in the thread splitter unit as well as a table to locally maintain a history of requests in each ordered flow queue. Thus, a local order of received requests at the thread splitter unit is established. The local order of requests in the thread is maintained to compare requests to other requests in that same thread to ensure the subsequent request to the separate physical pathway is not released from the thread splitter unit until all earlier requests from that same thread going to an initial physical pathway have communicated acknowledge signals back to the thread splitter unit.

The flow control logic associated with the thread splitter unit that split the set of transactions in that given thread issues the next request being routed down the separate first physical pathway from other outstanding requests in that thread 1) no earlier than one cycle after an amount of words in an immediate previous request if the previous request was a burst request or 2) no earlier than a sum of a total time of an amount of time the immediate previous request will arrive at a last thread merger unit prior to that previous request's target address plus an amount of time to communicate the acknowledgement notification back to the thread splitter. The acknowledge notification is implied and thereby negates a return of an actual acknowledge notification for a request in both situations 1) if no thread splitter units exist between an initial thread splitter unit and a last thread merger unit prior to the final destination address of the request and 2) if no other thread affecting components exist between the initial thread splitter unit and the downstream thread splitter unit.

A thread splitting unit may be cascaded in the request path with another thread splitting unit. An upstream thread splitter may continuously send requests from a given thread from the upstream thread splitter unit to a downstream thread splitter unit until the subsequent request needs to be split down the separate physical pathway at the downstream thread splitter unit. The downstream thread splitter unit implements flow control buffering of the subsequent request from the same thread heading down the separate physical pathway than all of the outstanding requests from that thread until all of the outstanding requests from that thread headed down the initial physical pathway have communicated an acknowledge notification of receipt of those outstanding requests to the downstream thread splitter unit causing the pathway splitting.

The system can be pipelined with buffers in the interconnect component to store and move requests and responses in stages through the system. The system also uses a pipeline storage system so multiple requests may be sent from the same initiator, each request sent out on a different cycle, without the initiator having to wait to receive a response to the initial request before generating the next request. The thread splitter units in the interconnect must simply wait for an acknowledge notification of an issued request before sending a next request down the same request as the previous request.

The flow logic prevents a request path deadlock by using acknowledge notifications, which are propagated back up the request network from the last thread merge unit. The flow logic uses the above flow control protocol as an interlock that virtually assures no initiator thread will have transactions outstanding to more than one target at a time. Yet, the flow control protocol does permit transactions from one initiator thread to be outstanding to multiple channels in a single aggregate target at once, and therefore to multiple individual targets within an aggregate target at once. Since the rate of progress at these individual targets may be different, it is possible that responses will be offered to an initiator core out of order with respect to how the requests were issued out by the initiator core. A simple response flow control protocol may be used to ensure responses to these requests will be offered to the initiator core in the expected order with respect to how the requests were issued by the initiator core. The combined request flow control logic and simple response flow control protocol allows the interconnect to manage simultaneous requests to multiple channels in an aggregate target from same thread at the same time.

The combined request flow control logic and simple response flow control protocol implemented at each thread splitter unit and thread merger unit allows this control to be distributed over the interconnect. The distributed implementation in each thread splitter unit and thread merger unit allow them to interrogate a local system address map to determine both thread routing and thread buffering until a switch of physical paths can occur. This causes a lower average latency for requests. Also, software transparency because software and, in fact, the IP cores themselves need not be aware of the actual aggregated target structure. The thread splitter units and thread merger units cooperate end-to-end to ensure ordering without a need to install full transaction reorder buffers within the interconnect.

Figure 15:
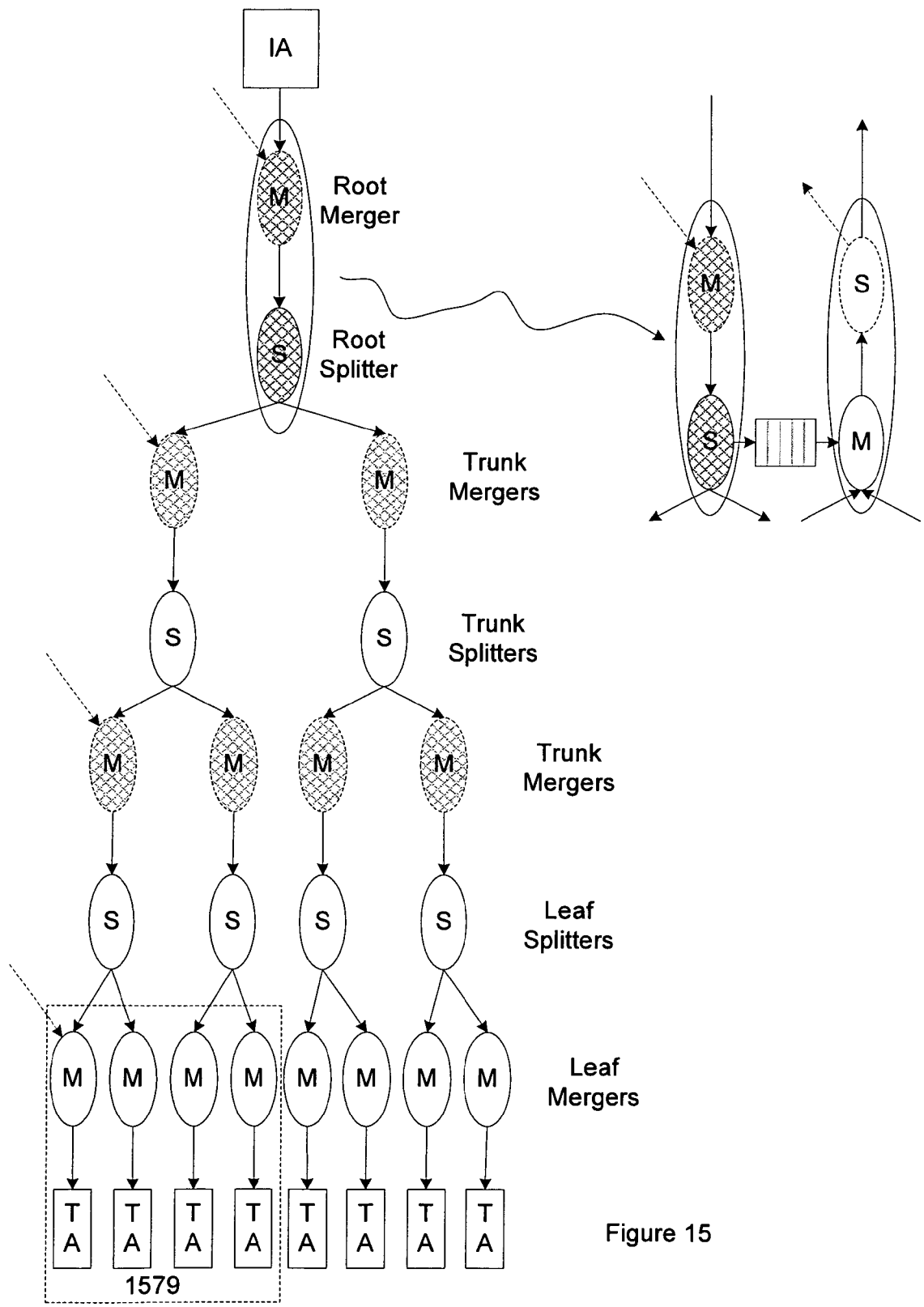
FIG. 15 illustrates a diagram of an embodiment of a path across an interconnect from an initiator agent to multiple target agents including a multiple channel aggregate target.

Similarly, FIG. 15 illustrates a diagram of an embodiment of a path across an interconnect from an initiator agent to multiple target agents including a multiple channel aggregate target 1579.

Figure 8:
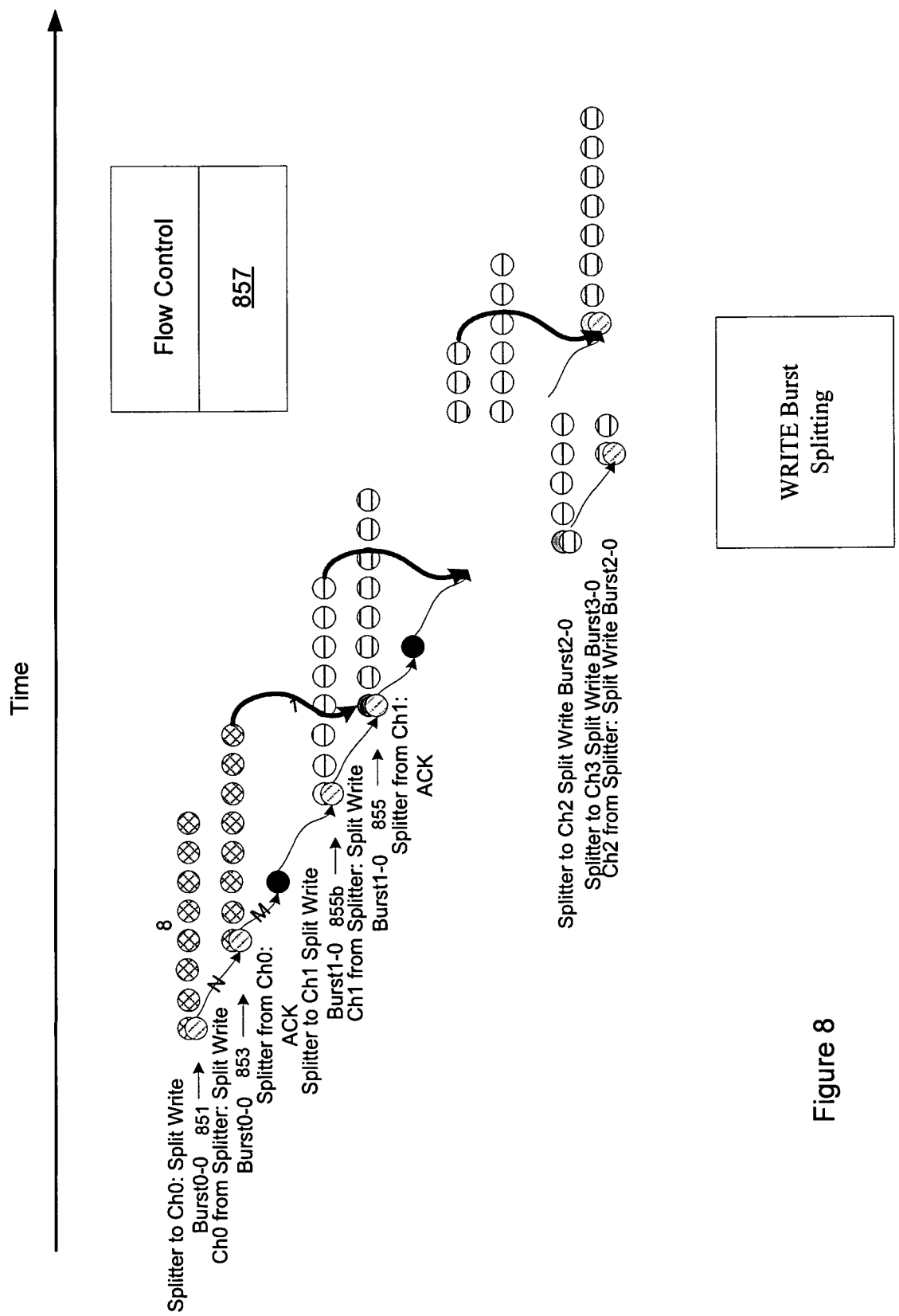
FIG. 8 illustrates an example timeline of the thread splitter unit in an initiator agent's use of flow control protocol logic that allows multiple write requests from a given thread to be outstanding at any given time but restricts an issuance of a subsequent write request from that thread.

FIG. 8 illustrates an example timeline of the thread splitter unit in an initiator agent's use of flow control protocol logic that allows multiple write requests from a given thread to be outstanding at any given time, such as a first write burst request 851 and a second write burst request 853 but restricts an issuance of a subsequent write request from that thread, such as a third write burst request 855 having a destination address down a separate physical pathway from all of the outstanding requests in that thread. All initiator agents may have a thread splitter unit that splits requests from a given thread based on requests in that set of requests being routed down separate physical pathway from other requests in that thread. A burst request may be a set of word requests that are linked together into a transaction having a defined address sequence, defined pattern, and number of word requests. The first write burst request 851 and the second write burst request 853 have eight words in their request and a destination address of channel 0. The third burst request 855 also has eight words in its request but a destination address of channel 1 which is down a separate physical pathway from channel 0.

The flow control logic 857 associated with the thread splitter unit that split the set of transactions in that given thread issues the next third burst request 855 being routed down the separate first physical pathway from other outstanding requests, such as the first and second 851 and 853 in that thread 1) no earlier than one cycle after an amount of words in an immediate previous request if the previous request was a burst request or 2) no earlier than a sum of a total time of an amount of anticipated time the immediate previous request will arrive at a last thread merger unit prior to that previous request's target address plus an amount of time to communicate the acknowledgement notification back to the thread splitter. If the flow logic was only based on sum of the total time of an amount of anticipated time the immediate previous request will arrive at a last thread merger unit plus an amount of time/cycles to communicate an acknowledgement notification of the previous request to a thread splitter unit, then the third request 855 could have issued 3 cycles earlier. Note, neither the response to the first burst request 851 nor the response to the second burst request 853 needs to be even generated let alone arrive in its entirety back at the initiating core prior to the issuing of the third request 855.

Thus, the interconnect uses a flow control logic that allows multiple write requests from a given thread to be outstanding at any given time but restricts an issuance of a subsequent request from that thread having a destination address down a separate physical pathway from all of the outstanding requests in that thread to issue the subsequent thread 1) no earlier than one cycle after an amount of words in an immediate previous request if the previous request was a burst request or 2) no earlier than a sum of the total time of an amount of anticipated time the immediate previous request will arrive at a last thread merger point prior to that previous request's final destination target address plus an amount of time to communicate an acknowledgement notification indicating safe arrival of the previous request back to the splitter unit that splits the set of transactions in that given thread into being routed down two or more different physical pathways.

In an embodiment, the flow logic may implement a formula when deciding when to issue a subsequent write request destined to a different physical pathway from the current physical pathway. The formula is BL+1<>N+M. N+M is compared to BL plus one and the larger value is chosen as the delay time before a switch to new physical pathway occurs. BL is the number of words in a burst request. N is number of cycles for a request to reach a last thread merger point prior to that previous request's final destination target address. M is number of cycles to communicate an acknowledgement notification indicating safe arrival of the previous request back to the splitter unit that splits the set of transactions in that given thread.

The aggregate depth of a pipeline pathway (down to the last thread Merger unit) affects the maximum frequency at which a splitter can switch between branches. Example: Let's say the depth of the pipeline points between the thread Splitter unit and a last thread merger unit is N, and the depth of the acknowledge (ACK) pipeline in the reverse direction is M (N=M). Then, the max frequency at which the leaf splitter can switch between branches (channels) is once every N+M cycles. Note that every time the splitter switches to a new channel for a particular thread, both of the above mentioned pipelines are guaranteed to be filled with bubbles. Similarly for WRITE requests, when the size of the number of words in WRITE data burst switched between physical pathways is greater than the latency of the acknowledge loop, then the latency is hidden.

Figure 9:
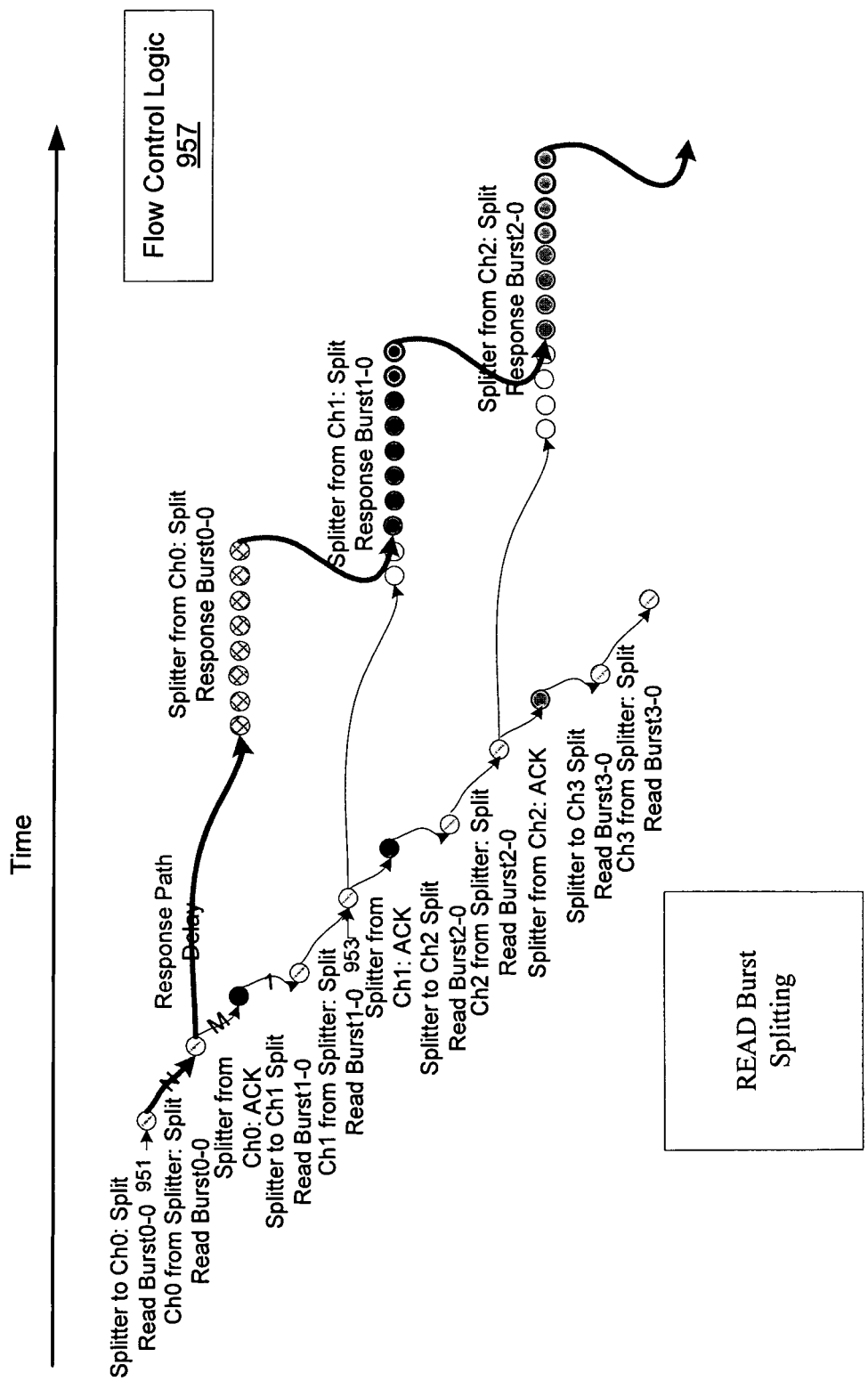
FIG. 9 illustrates an example timeline of the thread splitter unit in an initiator agent's use of flow control protocol logic that allows multiple read requests from a given thread to be outstanding at any given time but restricts an issuance of a subsequent read request from that thread.

FIG. 9 illustrates an example timeline of the thread splitter unit in an initiator agent's use of flow control protocol logic that allows multiple read requests from a given thread to be outstanding at any given time such as a first burst read request 951 and a second burst read request 953 but restricts an issuance of the subsequent read request 953 from that thread having a destination address down a separate physical pathway from all of the outstanding requests in that thread. The first read burst request 951 has eight words in the expected response and a destination address of channel 0. The second read burst request 953 also has 8 words in its expected response but a destination address of channel 1 which is down a separate physical pathway from channel 0. The flow control logic 957 associated with the splitter unit that splits the set of transactions in that given thread issues the subsequent second thread 1) no earlier than one cycle after an amount of words in an immediate previous request if the previous request was a burst request or 2) no earlier than a sum of the total time of an amount of anticipated time the immediate previous request will arrive at a last thread merger point prior to that previous request's final destination target address plus an amount of time to communicate an acknowledgement notification indicating safe arrival of the previous request back to the splitter unit that splits the set of transactions in that given thread into being routed down two or more different physical pathways. Thus, the latency of the ACK loop in the first read burst request is N=3, M=2, and the ChannelBurstLength of words=8 making BL+1>N+M. The splitter unit splits the first and second read burst requests without being affected by the latency of the ACK loop. Channel Responses may arrive early and then have to wait for being ordered. They will in return back-pressure the associated thread in the request path.

While READ requests takes up a single cycle on the request path, READ requests on the same thread cannot be split among multiple channels in back to back cycles. However, the response path determines the efficiency of READ requests, as the initiator has to assemble split responses. So, for READ requests, if the size of channel responses that have to be stitched together on the response path is greater than the latency of the ACK loop, the latter will be hidden.

Figure 10A:
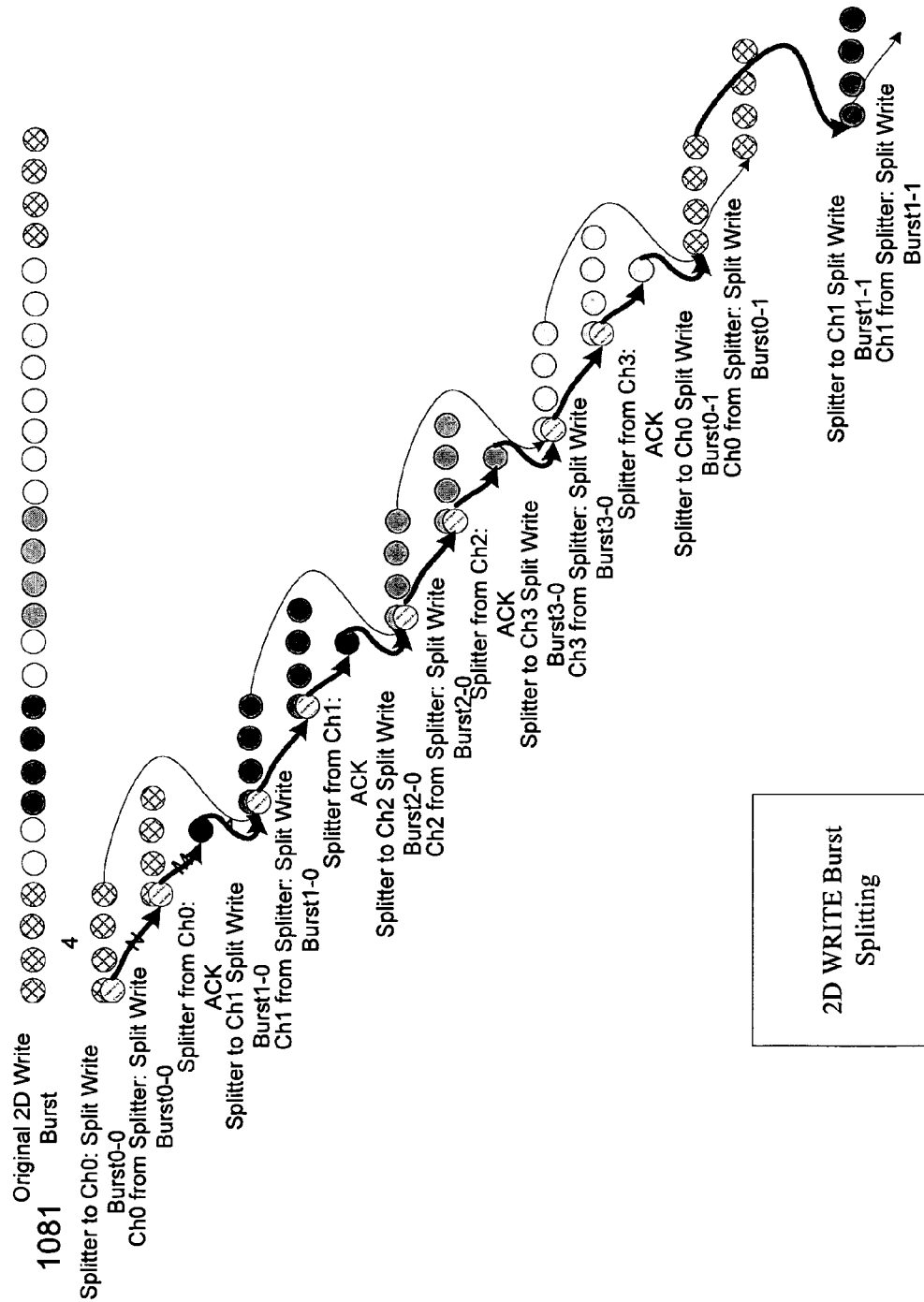
FIG. 10a illustrates an example timeline of embodiment of flow control logic to split a 2D WRITE Burst request.
Figure 10B:
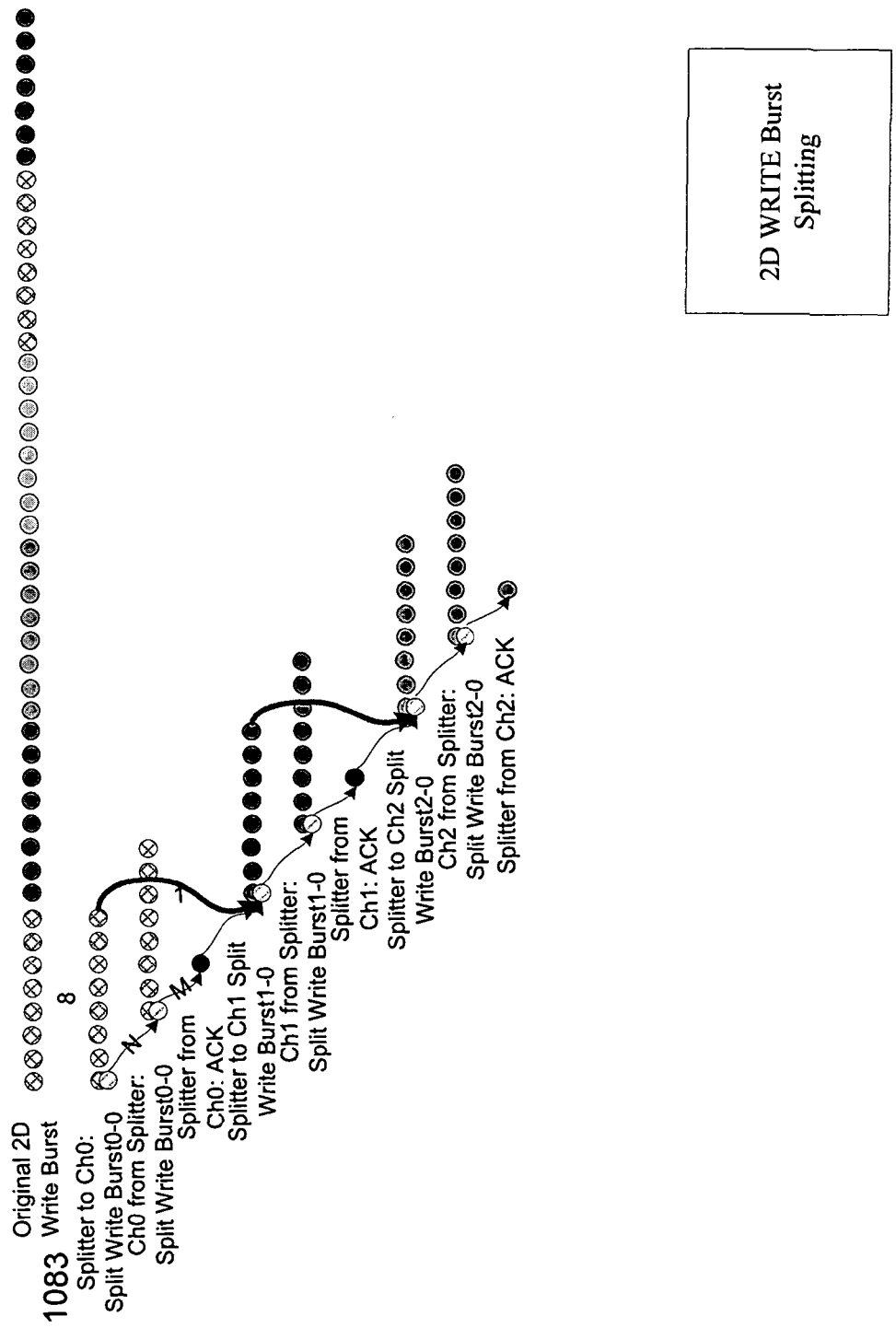
FIGS. 10b and 10c illustrate additional example timelines of embodiments of the flow control logic to split target request traffic.
Figure 10C:
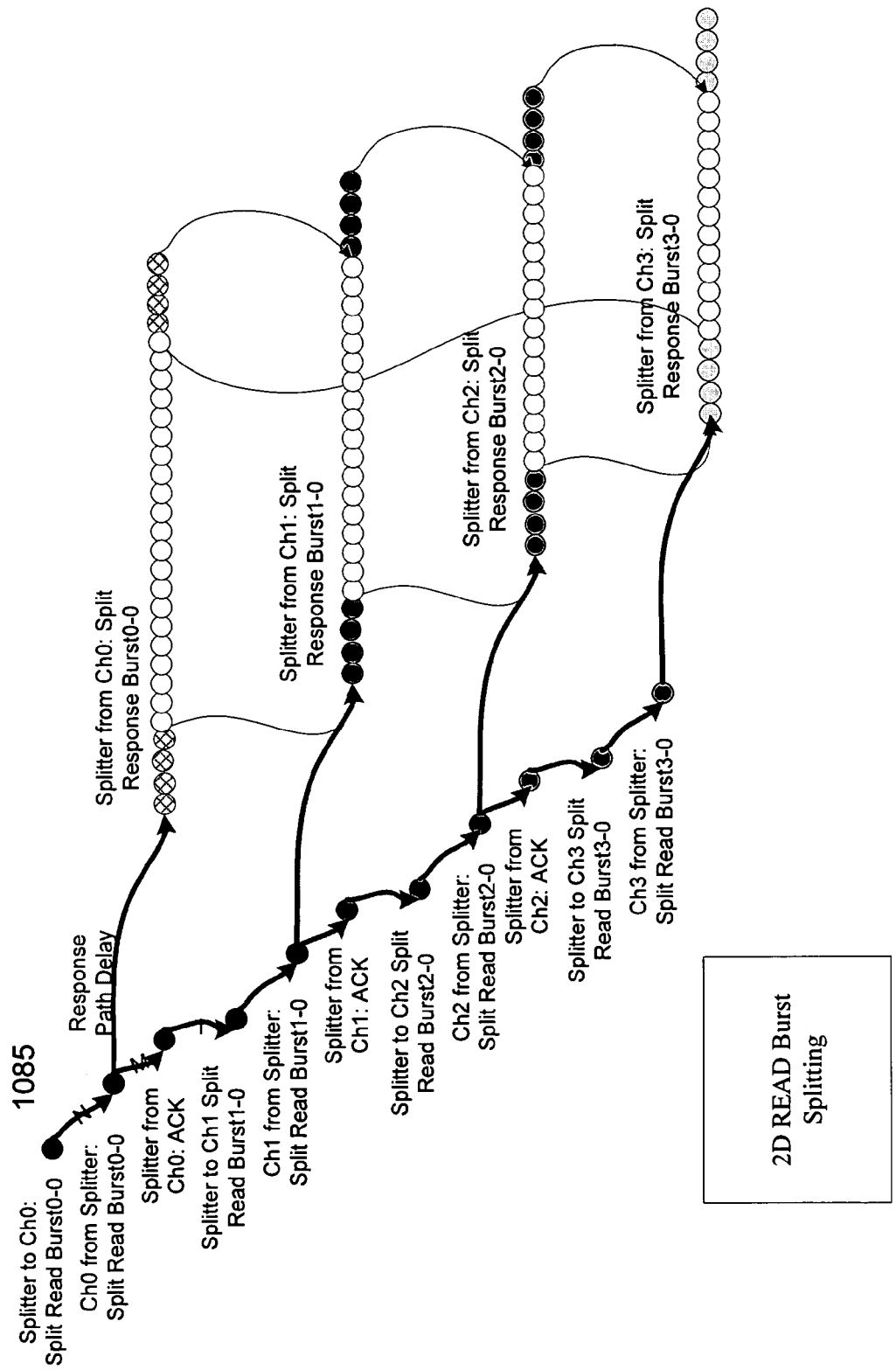

FIGS. 10b and 10c illustrate additional example timelines of embodiments of the flow control logic to split target request traffic such as a 2D WRITE Burst and 2D READ Burst. Referring to FIG. 7a, in an embodiment, the acknowledgement mechanism generates confirmation information from the last channel merge point at which two links merge threads. This information confirms that the channel requests from different links have been serialized. The acknowledgement information is propagated back up the request network to all the channel thread splitter units. If the channel splitter and the last serialization point exist within the same cycle boundary (i.e., there are no registers between them) then no explicit acknowledgement signals are needed—the acceptance of a transfer on the link between the channel splitter and channel merger can also be used to indicate acknowledgement.

In an embodiment, the merger unit is configured structurally to store the incoming branch/thread for a successful request that has ack_req set. When an ack_req_return signal is set high, the turnaround queue is 'popped' and causes the corresponding ack_req_return signal to be driven high on the correct branch/thread. Serialization merger (for this thread)—thread merging happens here. The merger unit is configured structurally to reflect the incoming ack_req signal back on the ack_req_return signal on the incoming branch/thread that sent the current request.

The initiator agent generates m_ack_req signals. The signal is driven low by default. The m_ack_req signal is driven high on the first transfer of any split burst that leaves the initiator agent that is going to a multi-channel target. Channel splitting happens at a thread splitter in an embedded register point or in a pipeline point, and is needed in the request path. Inside the splitter, an acknowledge control unit (ACU) is added. The ACU prevents requests from proceeding on a thread if the outgoing splitter branch and/or thread changes from that of the previous transfer and there are outstanding acknowledge signals. There is at most one ACU for each (input) thread at the RS.

The m_ack_req signals travel in-band with a request transfer. At some point the request transfer with the m_ack_req will reach the serialization merger—this is the last point where the connection merges with another connection on the same merger (outgoing) thread. If the transfer wins arbitration at the merger, the merger will extract the m_ack_req signal and return it back upstream on the same, request DL link path via the s_ack_req_return signal. The s_ack_req_return signals are propagated upstream on the request DL links.

These signals do not encounter any backpressure or have any flow control. Wherever there is a PP RS, the s_ack_req_return signals will be registered. The s_ack_req_return signals are used at each channel splitter ACU along the path. The ACU keeps a count of outstanding acknowledgements. When s_ack_req_return is set to one, the ACU will decrement its count of outstanding acknowledgements. The s_ack_req_return propagates back to the first channel split point in the request network. For the example shown in FIG. 7a, this first channel split point is at the embedded register point RS just downstream to the initiator agent component. However, the first channel split point in a request acknowledgement network could also be at a PP RS component.

If the path leading into an RS that performs channel splitting is thread collapsed, then the DL link is treated as single threaded for the purposes of the acknowledgement mechanism.

In an embodiment, from any thread merger unit, there shall be a single path to any channel. Also, from any initiator to any channel, there shall be a single path consisting of splitter units and perhaps merger units. Thus, in contrast to where there could be multiple paths between two points in the network. There may be buffers/register-points between any two components. Acknowledge signals are passed up-stream in a point-to-point fashion. There can be slightly different types of acknowledge protocols, depending on the types of components between which acknowledges are communicated.

With the ACK scheme, while different initiator threads can be talking to different channels/branches simultaneously, the frequency at which they can switch channels/branches is controlled. However, if the size of channel/branch bursts are larger than the latency of ACK loops, the ACK mechanism will not impair the performance.

In an embodiment, the acknowledgment mechanism is not needed beyond the last merger on any path to a channel. From that point on, response turn-around queues may be used in the thread splitters, but no acknowledge-related states/wires are needed. The acknowledge mechanism is not needed whenever an initiator thread has its own dedicated target thread. The acknowledge mechanism prevents deadlocks between initiators sharing a target thread. Acknowledge signals are implicitly accepted when there is no buffering on any of the paths from a Leaf Splitter to its Leaf Mergers.

The architecture intentionally splits multi-channel paths in the IA, or as early as possible along the path to the multiple channel target agents. This approach avoids creating a centralized point that could act as a bandwidth choke point, a routing congestion point, and a cause of longer propagation path lengths that would lower achievable frequency and increase switching power consumption.

In an embodiment, each thread splitter unit may have an acknowledge mechanism with a per branch register that receives an input bit vector when set, that indicates that the link is sending an acknowledge for a particular thread ID. The acknowledge mechanism may also include per thread an ack_counter, a current_branch_id, a per branch locked flag. The ack_counter counts the number of requests sent by threads waiting for acknowledge signals. The current_branch_id indicates the physical link to which all pending requests waiting for acknowledge signals are sent. The locked flag indicates if a particular thread ID holds a lock to this physical link (e.g., has an open transaction on that physical link. The flag is set with the first word of a request of a burst, and reset with the last word of a request of a burst).

The splitter unit can send a request on a particular thread ID to a physical link only when the ack_counter for that thread ID==0, OR when current_branch_id[TRD]==that physical link. Also, if the thread splitter unit is switching to a physical link for that thread ID to send a new request, there shall be no open burst on a physical link for thread ID (e.g., locked[TRD] [BR] has to be false). When the thread splitter unit sends a request on thread ID to a physical link (under the above conditions), the splitter unit then increments the ack_counter, and sets current_branch_id flag=that physical branch. Each cycle that the thread splitter unit receives a acknowledge signal for that thread=1, the thread splitter unit decrements the ack_counter by 1. Once this counter reaches 0, then the splitter can switch sending requests to a different branch for that thread ID. Once set, the locked flag remains set until the thread ID has no open burst on a physical link, AND the ack_counter for that thread ID==0. Then a switch to a different physical pathway may occur. In the case of 2D WRITE bursts, or 2D MRMD Read bursts) for a thread ID to simultaneously hold the lock to multiple physical pathways; e.g., locked flag pathway 0=locked flag pathway 1=true.

The acknowledge mechanism may have Register Points to simply relay upstream the acknowledge signals that they receive, without adding/subtracting any information from the acknowledge signal. If there is no buffering (or register points) between the output of a Leaf Thread Splitter unit and the input of its Leaf Merger unit, then an acknowledge signal is implicitly communicated when a request is accepted.

In other words, as soon as the Leaf thread Splitter unit sends a request to one Leaf Merger unit, it can switch sending to another Leaf thread Merger unit. However, deadlocks still have to be avoided: 2D bursts with a channel crossing from a channel with a higher numbered address to a channel with a lower numbered address, have to be split differently, where that function may be implemented in the initiator agent.

If the distance between two components is long, it has to be pipelined. This effectively pipelines the acknowledge path as well. Each cycle, a 0/1 per thread ID (or a>=0 ACK count per thread ID) enters this ACK pipeline at the bottom, and one exits this ACK pipeline at the top. 0's (or count=0) in this pipeline are equivalent to bubbles.

FIG. 10a illustrates an example timeline of embodiment of flow logic to split a 2D WRITE Burst request. In this example, the number of words in the 2D WRITE Burst request is 4, N=3, M=2, ChannelInterleaveSize=4<N+M. The WRITE Burst request 1081 is shown over time. FIG. 10b also illustrates an example timeline of embodiment of flow logic to split a 2D WRITE Burst request 1083. FIG. 10c illustrates an example timeline of embodiment of flow logic to split a 2D READ Burst 1085. The flow control logic in conjunction with the other above features allowing high throughput/deep pipelining of transactions. As shown in FIG. 10a, multiple transactions are being issued and serviced in parallel, which increases the efficiency of each initiator in being able to start having more transactions serviced in the same period of time. Also, the utilization of the memory is greater because as seen in the bubbles on FIG. 10a there are very few periods of idle time in the system. The first four bubbles shown the initial write burst is being issued. Next two bubbles of inactivity occur. However, after that the next four bubbles of the next write burst are issued and being serviced by the system. The initiator and memory are working on multiple transactions at the same time.

The latency of the ACK loop may limit the effective data bandwidth of the initiator. The initiator has to wait for first-row responses to order them. No need to wait for the next rows. Channel responses may become available too early for the initiator to consume them. This will create a back-pressure on this thread at the channels, forcing them to service other threads. Initiators that send 2D bursts may have dedicated threads, because of the way they can occupy their thread on multiple channels for the duration of the 2D burst. Note: for 2D WRITE bursts, because of the channel switching, the split WRITE bursts will remain open until the original 2D burst is closed; that is, while a splitter is sweeping all other branches before switching back to a given branch, all the resources for that thread of the branch remain idle (maybe minus N cycles). A similar situation exists for 2D READ requests, on the response path.

Figure 7B:
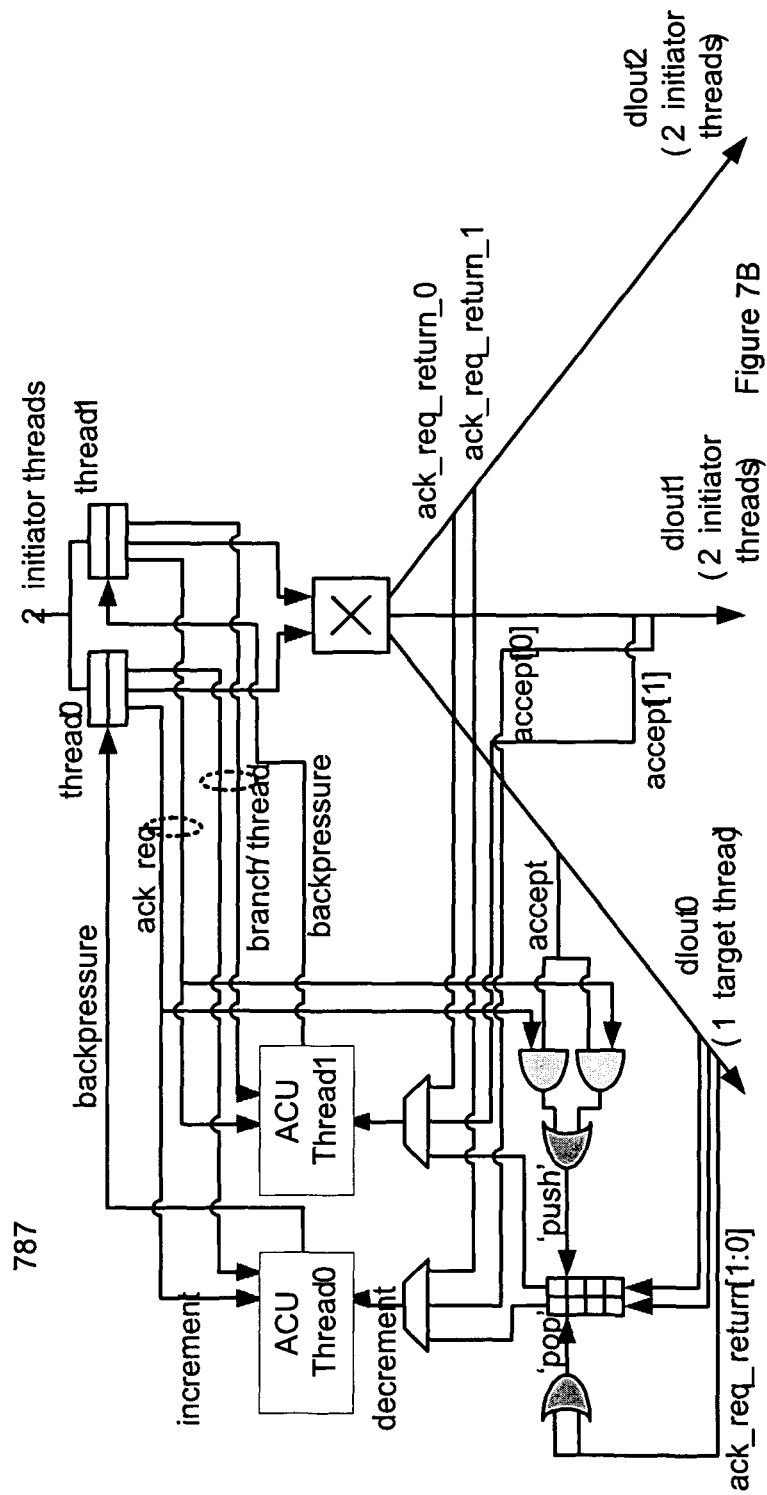
FIG. 7b illustrates a schematic diagram of an embodiment of an acknowledgement mechanism at the thread splitter unit.

FIG. 7b illustrates a schematic diagram of an embodiment of an acknowledgement mechanism at the thread splitter unit. The acknowledgement mechanism 787 includes logic gates and acknowledge control unit counters. Any initiator agent that communicates with multi-channel targets may have an embedded register point in the thread splitter or merger units in the request path with two mechanisms, an acknowledgement mechanism 787 and a request-path to response path turnaround queue.

The acknowledgement mechanism 787 is per input thread. Threads may count maintained. The count increments when an acknowledgement signal (a m_ack_req assertion) is received on the din input and is decremented when an acknowledgement signal (a s_ack_req_return assertion) comes in on a dlout branch. The splitter unit tracks the current branch and thread of the last transfer(s) and prevents the thread from switching to a new branch and/or thread until the count is zero.

The request-path to response path turnaround queue. Whenever a transfer leaving a channel splitter unit has the acknowledgement signal m_ack_req set, the information about which branch and thread the request will return on in the corresponding response path merger is pushed into the queue. The derivation algorithm passes a data structure into the thread splitter unit configuration code to determine which request path splitter outgoing branch and thread corresponds to which response path merger incoming branch and thread.

An acknowledge control unit (ACU) will be instantiated to manage the acknowledgement mechanism for an input thread at the thread splitter. The ACU holds a counter. The counter is incremented whenever the corresponding thread buffer sends out a request that has m_ack_req set to 1. The m_ack_req signal is stored in the RS buffers, even if it is not needed on an dlout links. The ACU counter is decremented whenever an s_ack_req_return input is set to 1. The s_ack_req_return signal may come from a dlout link or be internally generated, as described below. The ACU prevents a thread buffer from sending further requests if the destination branch and/or thread of the request is different from the previous one and the ACUs counter is non-zero.

The s_ack_req_return signals (used to decrement) are one-hot at each ACU. There are three example ways in which the s_ack_req_return signals are generated. FIG. 7b illustrates these. The thread splitter unit in the example has 2 incoming initiator threads.

Case 1: An outgoing branch carries target threads (i.e., the initiator threads to target threads mapping happens at this thread splitter module). In this case, each target thread needs its own turnaround queue. Whenever an m_ack_req signal is set to 1 on the dlout for the corresponding thread, the turnaround queue stores which (incoming) thread the acknowledge signal belongs to. When an s_ack_req_return signal is set high on the dlout, the turnaround queue is popped and routes the s_ack_req_return signal back to the correct ACU.

Case 2: An outgoing branch carries initiator threads (i.e., no dynamic thread mapping) and the serialization thread merger unit is within the same cycle boundary. In this case, if the outgoing request has m_ack_req set (from the RS buffer, the signal won't be on the dlout) and the request is successfully sent, an s_ack_req_return is generated and sent to the corresponding ACU for that initiator thread. Thus, the serialization merger is within the same cycle boundary, so accept signal can be used as ack_return.

Case 3: In this case the outgoing branch carries initiator threads and the serialization thread merger unit is in another cycle boundary. In other words, there is a PP between this RS branch and the serialization merger. In this case, the s_ack_req_return signal will be present for some or all of the initiator threads. If the signal is not present, there will not be an ACU for that thread. The s_ack_req_return[thread] signal bit needs to be sent directly to the ACU. Thus, the serialization merger is in another cycle boundary, so ack_return_<thread> signals are present and can be used directly.

Some thread splitter threads may have m_ack_req signals on outgoing initiator threads without a corresponding ACU or a corresponding s_ack_req_return signal. In this case, the initiator thread is not doing channel splitting, but some downstream thread splitter unit is performing channel splitting.

If the RS din link has s_ack_req_return, then dlout link's s_ack_req_return value needs to be passed upstream, except for din threads that have it tied-off.

If a block burst is being split across channels at a thread splitter, the burst will enter the thread splitter as one atomic sequence and leave it as two or more separate atomic sequences. The thread splitter needs special logic to handle this. Each channel splitting unit compares its own channel_splitter_id with the incoming p_split_info on the first transfer in any atomic sequence. If the values match, the thread splitter needs to de-assert m_lockarb for any transfer in the burst that has burstlast set to 1.

The thread splitter unit dlin_blck_atomic_split (incoming thread) parameter will be set to 1 for each incoming thread that needs to support this capability. The logic needs detect if the outgoing branch/thread changes within an atomic sequence. If it does so, then whenever burstlast is set to 0, m_lockarb must be forced to 0 on the outgoing link.

Maintaining Response Path Order

Figure 11:
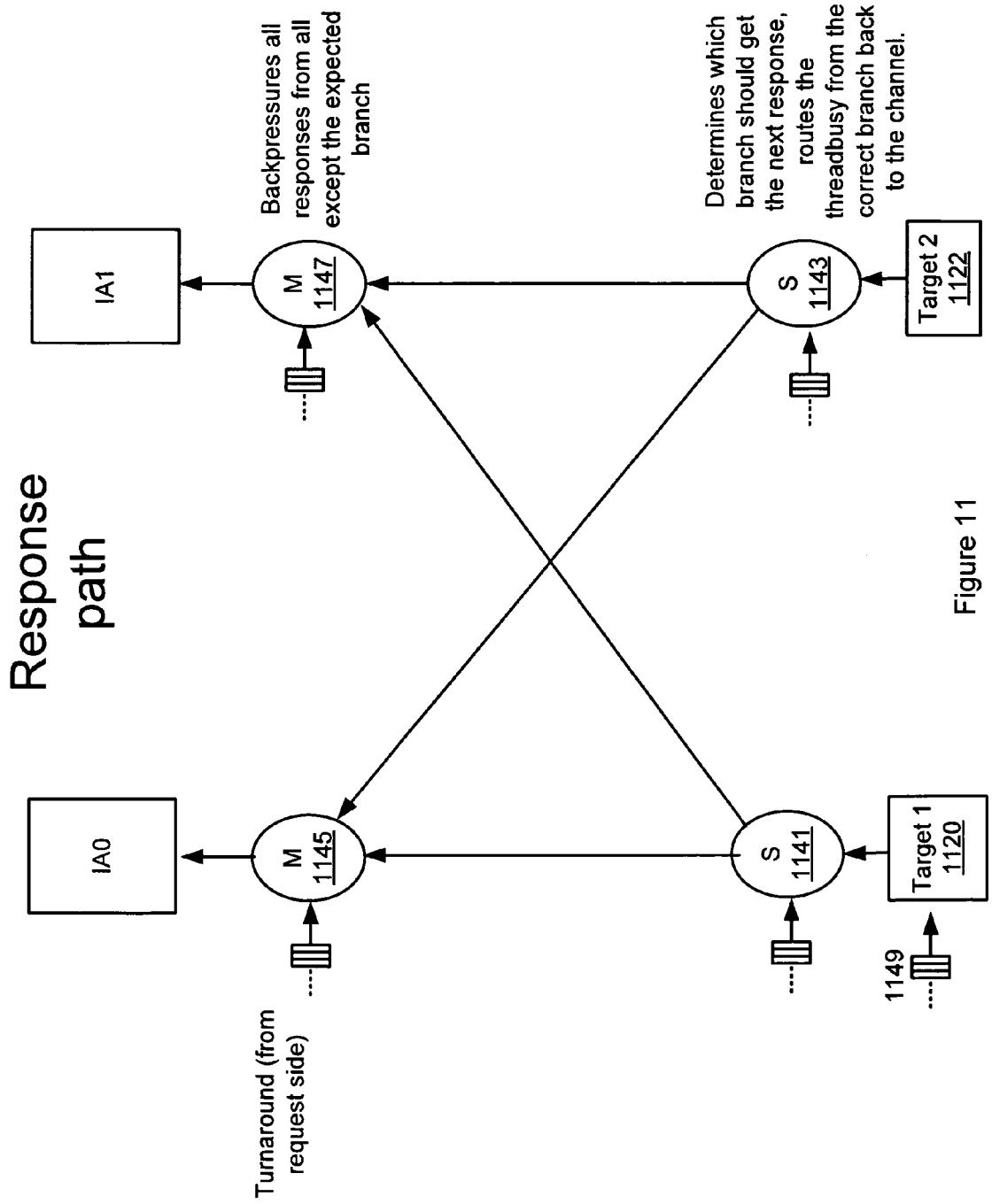
FIG. 11 illustrates a block diagram of an embodiment of a response path from two target agents back to two initiator agents through two thread splitting units and two thread merger units.

FIG. 11 illustrates a block diagram of an embodiment of a response path from two target agents back to two initiator agents through two thread splitting units and two thread merger units. The two target agents 1120, 1122 may each have one or more associated thread splitting unit such as a first thread splitting unit 1141 for the first target agent 1120 and a second thread splitting unit 1143 for the second target agent 1122. The two target agents 1120, 1122 may each have one or more associated thread merging unit such as a first thread merging unit 1145 for the first target agent 1120 and a second thread merging unit 1147 for the first target agent 1120. A target agent or memory scheduler may have FIFO response flow buffers, such as a first response flow buffer 1149, which cooperate with the merger units 1145, 1147 implementing a flow control protocol to return responses within a same thread in the order in which the corresponding requests were transmitted rather than using re-order buffers.

The flow logic in the target agent and merger unit uses first-in first-out inherent ordering to compare responses to other responses in that same thread to ensure the next response is not released from the target agent until all earlier responses from that same thread have been transmitted back toward a thread merger unit in the response path toward the initiator IP core issuing that thread. The FIFO response flow buffers are filled on a per thread basis. Alternatively, the turnaround state of the response buffers may be distributed to other channels making up the aggregated target or even just other targets on the chip to implement a response flow order protocol.

The merger unit closest to the target/channel may determine which physical branch pathway should be delivering the next response, and routes a threadbusy from the correct branch back to the target. The merger unit closest to the target agent or the merger unit closest to the initiator IP core generating the thread may assert this flow control protocol to backpressure all responses from a particular thread from all physical pathways connected to that thread merger unit except responses from the physical pathway expected to send a next in order response for that thread. For example, the first thread merger unit controls when responses come from the first target agent 1120 and the second target agent 1122. Logic, counters, and tables associated with the merger unit keep track of which physical pathway, such as a link, should be supplying the next response in sequential order for that thread and stops responses from that thread from all other physical branches until that next response in sequential order for that thread is received on the active/current physical pathway.

The flow control logic maintains expected execution order of the responses from within a given thread by referencing the ordered history of which physical path requests where routed to from the maintained order history of the request queue, the expected execution order of the responses corresponding to those requests, and allows only the target agent from the physical branch where the next expected in order response to send responses for that thread to the merger unit and blocks responses from that thread from the other physical branches. The flow logic in a merger unit establishes a local order with respect to issued requests and thus expected response order sent down those separate physical pathways.

Each merger unit 1145, 1147 has thread buffers for responses maintained on a per thread basis. The thread depth may be the deepest expected burst length plus the expected maximum pipeline delays in generating all of the responses to burst request. The flow control logic asserts response flow control on a per thread basis. Note, the flow control logic does not block responses from other threads while waiting. The flow control logic merely blocks with respect to each other out of order responses within a given thread and is non-blocking with respect to responses from any other thread. Thus, responses for a given thread can only come to that merger unit from a single physical branch at any given time. For responses to 2-D requests, the response may alternate between targets. The flow logic is non-blocking with respect to responses from other threads multi-threaded flow control to ensure execution ordering of responses returned to the initiator core that generated their corresponding request. Using the flow control mechanism near the target agent to manage transaction ordering including responses within the same thread allows this solution to provide the expected in-order response order to transactions that the requests are routed to different physical pathways on the chip without increasing the buffering requirements of the already pipelined system versus a single-channel approach.

Thus, the flow control logic and associated circuitry maintain the expected execution order of the responses from within a given thread by 1) referencing the ordered history of which physical path requests in a given thread where routed to, 2) the expected execution order of the responses corresponding to those requests, and 3) allowing the target agent to send responses for that given thread to the thread merger unit only from the physical pathway where a next expected in-order response is to come from and block responses from that given thread from the other physical pathways.

In an embodiment, the interconnect implements internal mechanisms to manage the request order for each thread, and to use internal flow control in the response network to enforce ordering restrictions. Because internal flow control is used to control response order, response thread collapsing in target agents for multi-channel members is prohibited, as it would expose potential deadlocks. Deadlocks are when threads are merged with each other and split off, then an initial request of a thread may be pipelined behind a subsequent request of that same thread. The system stalls/deadlocks waiting for the initial request to be serviced which cannot happen because it became pipeline behind subsequent requests in that same thread.

Target sockets/agents for multi-channel members have response flow control logic to cooperate with their corresponding merger units, or the associated target agents may have response buffers. The interconnect can be optimized for multi-channel targets with non-blocking (i.e. OCP mthreadbusy_exact) response flow control. If the target socket uses blocking flow control or no flow control, then the target agent will interlock requests on each thread with available response buffers for that thread, so that the response path never blocks. This creates a direct gate count vs. performance trade-off for the interconnect, even though it does permit response buffering in the target core to be minimized.

The internal interconnect mechanisms implement request interlocking to assure deadlock avoidance. This assures that requests are delivered to multi-channel target threads strictly in order. Commonly, these interlock delays will be invisible. The interlock mechanism's delays should merely impact performance for bursts that meet all criteria here simultaneously:
The burst is on the same initiator thread as the previous burst
The burst is to a different channel as the previous burst
The burst is short (measured in interconnect clock cycles) compared to the depth of the interconnect
The burst encounters little or no contention on the way to the target.

The interconnect's mechanism for ensuring thread ordering using response network flow control impacts performance only to the extent that latency in the flow control loop can slow switching the response stream from one target to another. Placing elasticity buffers to assist in maintaining the order of responses either in the target agent, or in the target core minimize gate count costs. Internal mechanisms are designed to minimize switching delays between response sources and not limit the target response bandwidth. They may only limit initiator response bandwidth on a single thread so that it is somewhat less than 100%. However, where multiple initiators generally share a single target, it is already true that initiator bandwidth demands are less than 100%.

In an embodiment, the interconnect also implements flow control protocol internal to the interconnect in the response network to enforce ordering restrictions of when to return responses within a same thread to correspond to the order the requests triggering the responses were transmitted, and the flow control protocol is non-blocking with respect to requests from another thread.

A target IP core, as well as an agent to interface with the interconnect may have response flow buffers to store responses. These response flow buffers may also be in a memory controller. The response flow buffers cooperate with one or more thread merger units implementing a flow control mechanism to return responses within a same thread in the order in which the corresponding requests were transmitted from that thread merger unit. The response flow buffers may be filled on a per thread basis.

The flow control mechanism supplies a next response in sequential order for that thread and stops other responses from that thread until the next response in sequential order for that thread is received by a first thread merger unit expecting the next response in sequential order for that thread.

The one or more thread merger units keep track of which physical link in the interconnect should be supplying the next response in sequential order for that thread and stops responses from that thread from all other physical links until that next response in sequential order for that thread is received on the current physical link. The thread merger unit closest to the target agent asserts a flow control protocol to backpressure all responses from a particular thread from all physical pathways connected to that thread merger unit except responses from the physical pathway expected to send the next response in order for that thread.

Also, the thread merger unit closest to the target IP core may determine which physical branch pathway should be delivering the next response, and routes a threadbusy on all of the physical pathways except the current physical pathway back to the first target IP core.

The flow control mechanism uses first-in first-out (FIFO) inherent ordering to compare responses to other responses in that same thread to ensure the next response is not released from the first target agent until all earlier responses from that same thread have been transmitted back toward a thread merger unit in a response path toward the initiator IP core issuing that thread. A local order in the flow control mechanism with respect to issued requests is established and then correlated and communicated over to the expected response order sent down those separate physical links. The expected response re-ordering information is passed between a request-side thread splitter unit and a response-side thread merger unit to correlate the expected response order.

The flow control mechanism asserts response flow control on a per thread basis and the flow control mechanism blocks with respect to other out-of-order responses within a given thread and is non-blocking with respect to responses from any other thread. The flow control mechanism and associated circuitry maintain the expected execution order of the responses from within a given thread by 1) referencing an ordered history of which physical path requests in that thread where routed to, 2) an expected execution order of the responses corresponding to those requests, and 3) allowing the target agent to send responses for that given thread to the thread merger unit only from the physical pathway where a next expected in-order response is to come from and block responses from that given thread from the other physical pathways.

The thread splitter and merger units in combination with buffers in the memory controller eliminate the need for dedicated reorder buffers and allow a non-blocking flow control so that multiple transactions may be being serviced in parallel vice merely in series.

Figure 12:
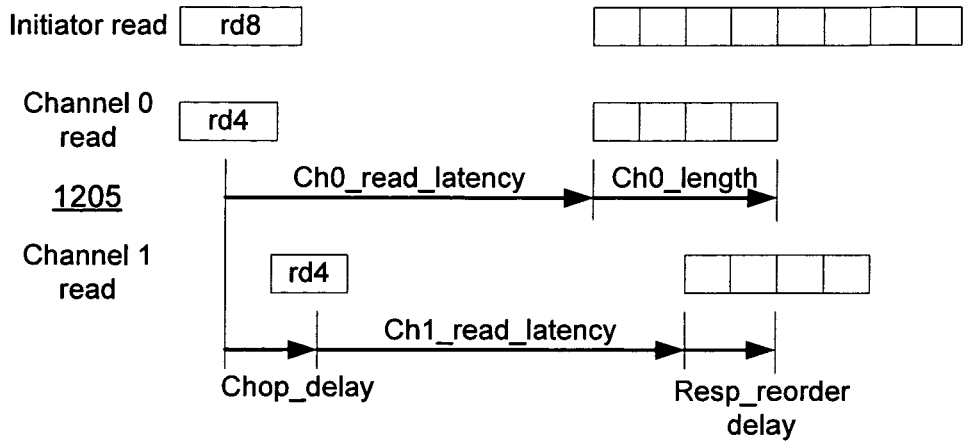
FIG. 12 illustrates a diagram of an embodiment of the Response Buffer Usage in a multiple channel aggregate target to ensure the returned order responses.
Figure 12:
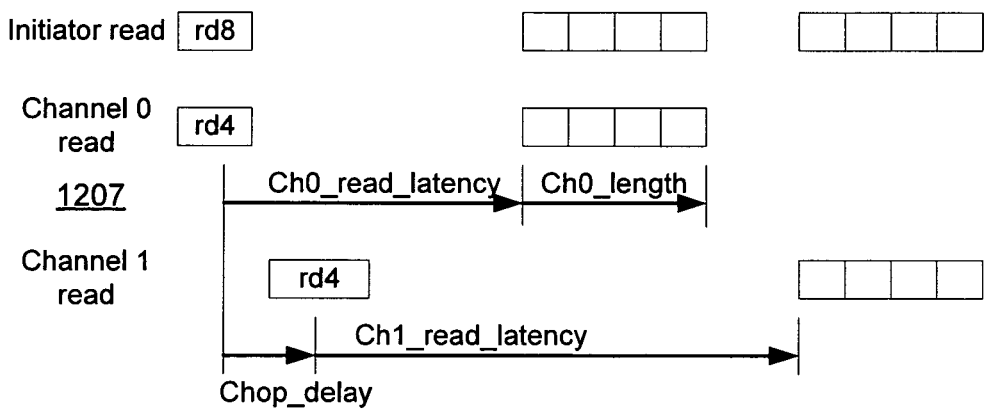
Figure 12:
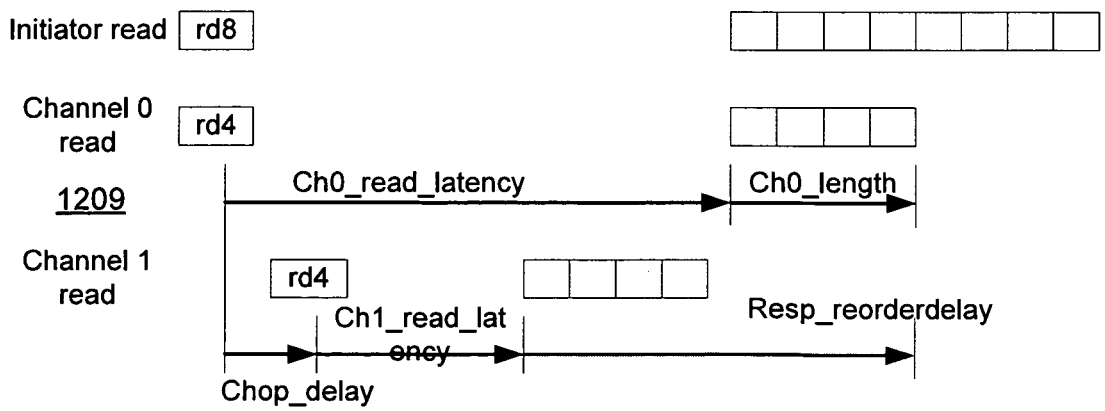

FIG. 12 illustrates a diagram of an embodiment of the Response Buffer Usage in a multiple channel aggregate target to ensure the returned order responses. Response buffers in the target agent are also used to ensure the returned order responses across multiple channels—to cover variations in response latency at multi-channel aggregate targets. Write requests are bandwidth limited by the initiator. So there is little need/benefit for buffering. The interesting case for buffering is read performance of the response path.

FIG. 12 shows a simple case of an initiator burst that spans a channel boundary in an aggregate target. There is some Chop_delay introduced by the crossing. The interconnect implements the chopping logic in the initiator agent. Since the initiator agent issues 1 request per cycle, in the best case Chop_delay=1. But there may also be structural (minimum) latency differences in the paths from initiator agent to the channels (1 cycle for each pipeline point or register point in the request path). Additionally, the interconnect enforces a global order at the split point. This may delay the second chopped request a few cycles (0-2), which will add to the Chop_delay. So it may be reasonable to see Chop_delay in the 1-2 cycle range, for good configurations and the 2-4 cycle range for harder ones.

In the typical case 1205, the latency at the 2 channels, channel 0 and channel 1, is nearly the same. In this case, the channel 1 response path will likely see some back-pressure (partially due to the Resp_reorder_delay). During this time buffering in the target agent is needed in order to avoid stalling the target itself. The amount of buffering needed is:
  i.  =(Ch0_rd_latency+Ch0_rd_length)−(Chop_delay+Ch1_rd_latency )
  ii. =(Ch0_rd_latency−Ch1_rd_latency)+(Ch0_rd_length−Chop_delay)

In other words, enough buffering is needed to cover the difference in latency plus the excess burst length over chop delay.

In some cases, the channel 1 latency will be greater than the channel 0 latency. The equation above shows that as the latency difference grows, the first term becomes negative and reduces the buffering needed. At some point, difference in latency can be large enough to swamp the second term, so no buffering is needed. This point is when:
  i.  Ch1_rd_latency=Ch0_rd_latency+(Ch0_rd_length−Chop_delay)

If the channel 1 latency grows beyond this point, then the initiator will see a bubble in the response stream. This is shown in the figure as the "Delay Case" 1207.

In some cases, the channel 0 latency will be greater than channel 1 latency. This difference can become extreme. The figure above shows this as the "Skew Case" 1209. In this case, a channel 1 response buffer with Ch1_rd_length entries is sufficient to maintain the response rate for the initiator. However, a subsequent burst could encounter back-pressure as a result of the full response buffer. The equation above still holds if back-to-back read bursts are needed without back-pressure.

There is little advantage to response re-order buffers in the initiator agent. The interconnect supports response smoothing buffers in the target agent. The number of response buffers per thread at the target agent is user configurable in the interconnect. The maximum number of buffers per thread may be 32. Response buffers for high utilization of multi-channel targets may be the dominant source of gate count increase in the interconnect relative to similarly configured but lower performing SMX designs.

Figure 13:
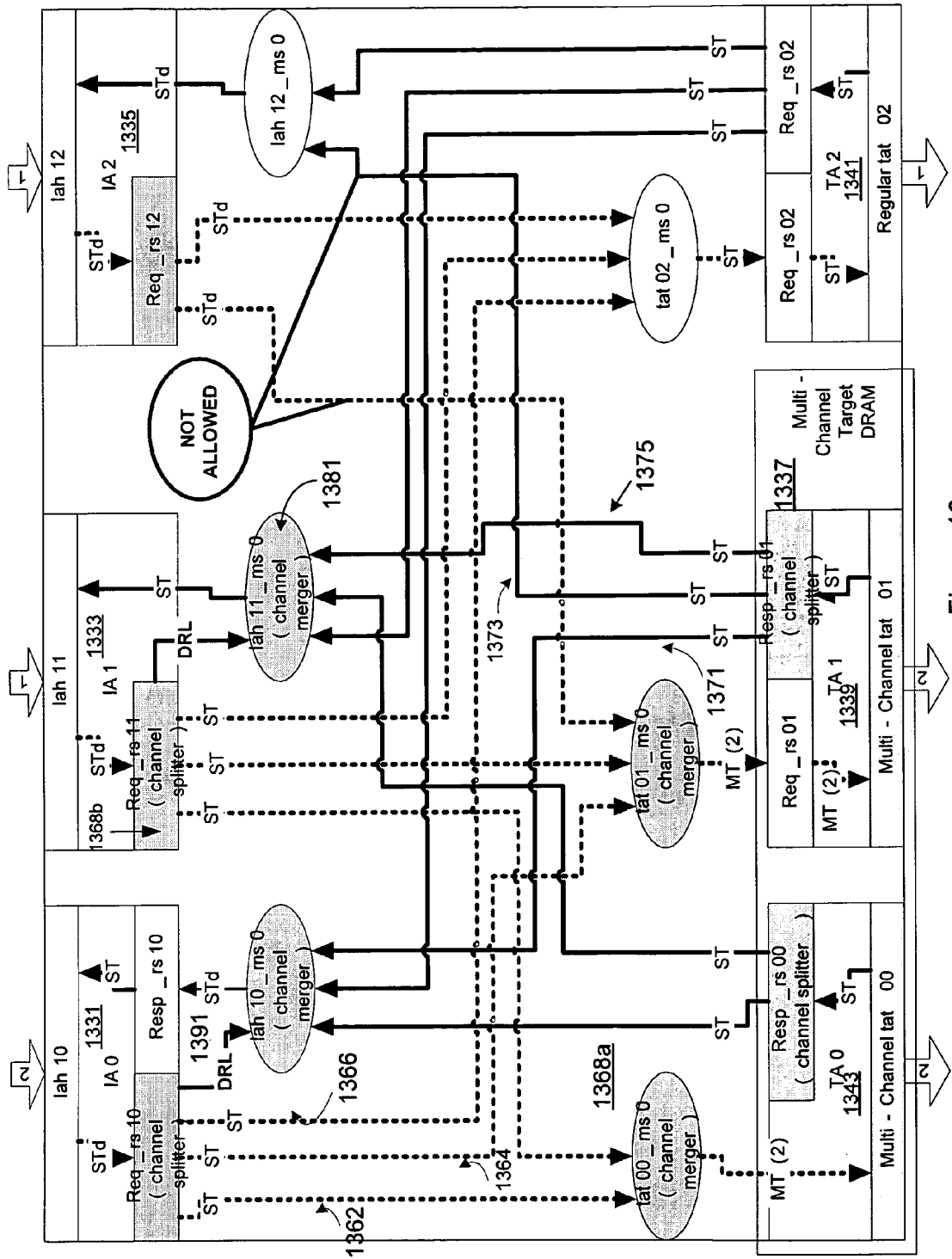
FIG. 13 shows the internal structure of an example interconnect maintaining the request order within a thread and the expected response order to those requests.

FIG. 13 shows the internal structure of an example interconnect maintaining the request order within a thread and the expected response order to those requests. The interconnect include three initiator agents 1331, 1333, and 1335 and three target agents, where target agent0 1341 and target agent1 1339 are target agents that belong to a multi-channel target, DRAM. Only one multi-channel aggregate target 1337 exists in this example.

On the request network, for initiator agent 1331, the multi-channel path going to the multi-channel target DRAM splits at the initiator agent0's 1331 embedded, request-side thread splitter units, Req_rs10. Since there are two channels, the two outgoing single-threaded (ST) DL links 1362, 1364 each goes to a different channel target. The third outgoing ST DL link 1366 is a normal path leading to a normal individual target agent TA2 1341. A request-side channel splitter 1368*b* is embedded in the initiator agent 1331. For the channel target agent0 1343, the merger splitter unit component, tat00_ms0 1368*a*, upstream to target agent0 1343 acts as a channel merger and regulates channel traffics coming from two different initiator agents, initiator agent0 1331 and initiator agent1 1333.

On the response network, for target agent1 1339, the embedded RS component, Resp_rs01, acts as a response channel splitter—it has three outgoing links 1371, 1373, 1375 for delivering channel responses back to initiator agent0 1331, normal responses back to the normal initiator agent2 1333, and channel responses back to initiator agent1 1335, respectively. A response-side channel splitter is color-coded in blue. For initiator agent1 1333, its upstream merger splitter unit component, lah11_ms0, is a channel merger, which not only regulates responses coming back from channel 0 (i.e., target agent0) and channel 1 (i.e., target agent1) in the aggregate target 1337, but also handles responses returned by the normal target agent2 1341. The response-side channel merger 1381 receives responses from target agent0 1343, target agent1 1339, and target agent2 1341.

Since a response-side channel merger unit needs to regulate channel responses but it may not have enough information to act upon, additional re-ordering information can be passed to the merger unit from the request-side channel splitter of the initiator agent. For instance, the DRL link 1391 is used to pass response re-ordering information between the request-side channel thread splitter unit, Req_rs11, and the response-side channel thread merger unit, lah11_ms0, for initiator agent1 1333.

Target agent TA0 1343 is assigned to channel 0 and target agent TA1 1339 is assigned to channel 1 for the multi-channel target DRAM. Connectivity between initiators and individual targets of the multi-channel target DRAM is done via connectivity statements that specify the initiator agent (connected to an initiator) and the specific target agent (connected to an individual target of the multi-channel target DRAM) as shown in the example.

Also disclosed are two multi-channel address regions: SMS_reg and USB_mem. The specification of the SMS_reg region can be explained as follows:
The size of this region is 0x1000 bytes. Having a channel_interleave_size of 8, means that each interleave is of size 0x100 (28). This results in 16 non-overlapping memory interleave segments (region size 0x1000/interleave size 0x100=16). As discussed, each interleave is assigned to a channel using the "channel round" idea. In this case there are 2 channels so interleaves 0, 2, 4, 6, 8, 10, 12, 14 are assigned to channel 0 (target agent TA0) and interleaves 1, 3, 5, 7, 9, 11, 13, 15 are assigned to channel 1 (target agent TA1). Note that if an initiator agent connects to one individual target agent in a multi-channel target, this initiator agent should connect to all individual target agents in the multi-channel target. That is, as indicated in FIG. 13, the connection between IA2 and TA1 is NOT ALLOWED unless IA2 is also connected to TA0 in the same time.

In an embodiment, in the response path ordering, the interconnect maintains OCP thread order, and has a mechanism to re-order responses in the response path. This is achieved by passing information for a request path channel splitter RS component to the corresponding response path channel merger MS component. The information is passed via a turnaround queue, which maintains FIFO order. The information passed over tells the thread merger splitter unit component which incoming branch/thread the next response burst should come from. The thread merger splitter unit component applies backpressure to all branches/threads that map to the same outgoing thread, except for the one indicated by the turnaround queue. When the burst completes, then the turnaround queue entry is popped. This mechanism ensures that all responses are returned in the correct order.

Figure 14:
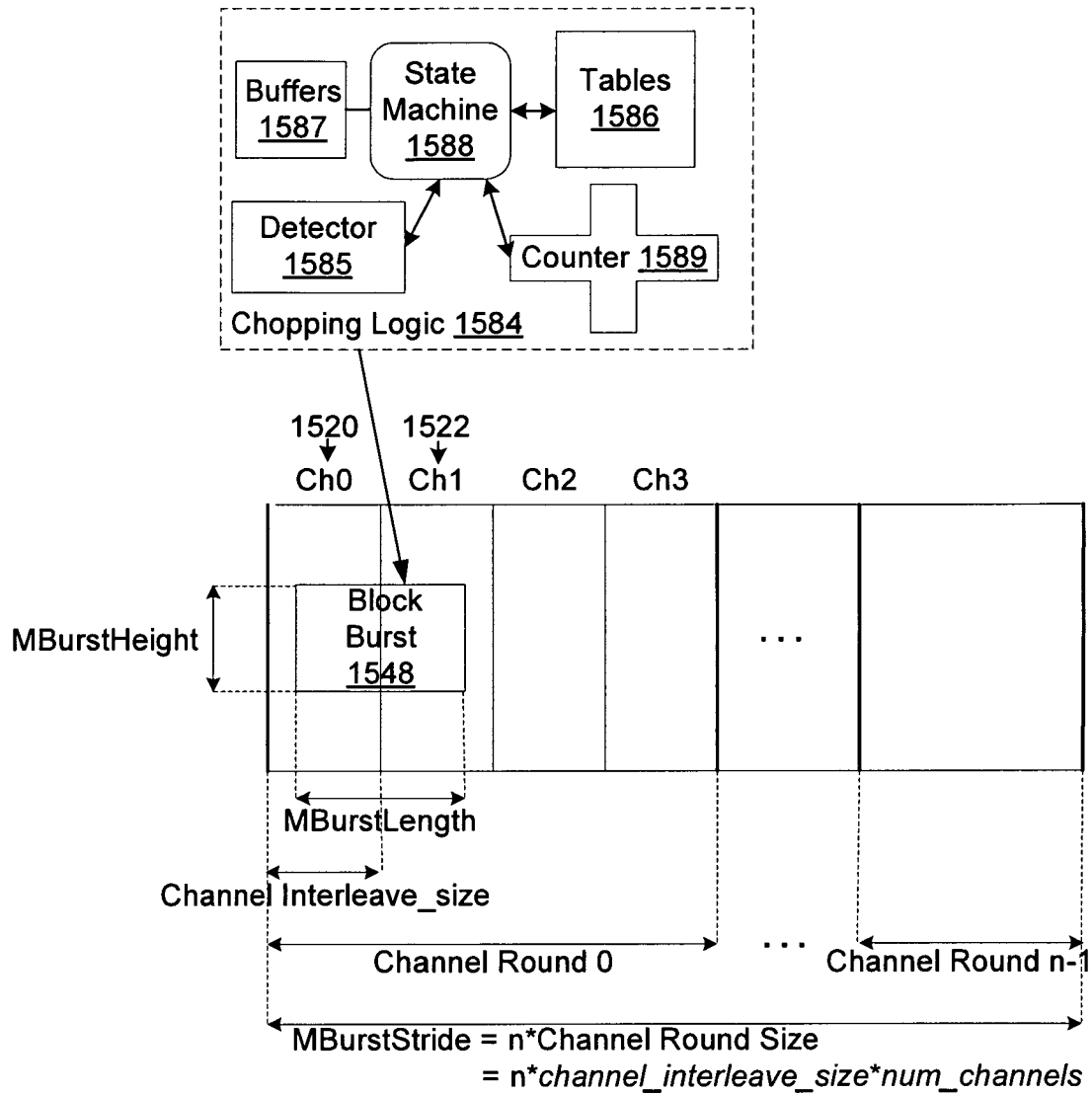
FIG. 14 illustrates a diagram of an embodiment of chopping logic to directly support chopping individual transactions that cross the channel address boundaries into two or more transactions/requests from the same thread.

Chopping Individual Transactions that Cross Channel Boundaries Headed for Channels in an Aggregate Target FIG. 14 illustrates a diagram of an embodiment of chopping logic to directly support chopping individual transactions that cross the channel address boundaries into two or more transactions/requests from the same thread, which makes the software and hardware that generates such traffic less dependent on the specific multiple channel configuration of a given SoC.

The interconnect implements chopping logic 1584 to chop individual burst requests that cross the memory channel address boundaries from a first memory channel 1520 to a second memory channel 1522 within the first aggregate target into two or more burst requests from the same thread. The chopping logic 1584 cooperates with a detector 1585 to detect when the starting address of an initial word of requested bytes in the burst request 1548 and ending address of the last word of requested bytes in the burst request 1548 causes the requested bytes in that burst request 1548 to span across one or more channel address boundaries to fulfill all of the word requests in the burst request 1548. The chopping logic 1585 includes a channel chopping algorithm and one or more tables 1586 to track thread ordering in each burst request 1548 issued by an IP initiator core to maintain a global target ordering among chopped up portions of the burst request 1548 that are spread over the individual memory channels 1520 and 1522. Either in a distributed implementation with each initiator agent in the system or in a centralized memory scheduler 1587 the system may have a detector 1585, chopping logic 1584, some buffers 1587, state machine 1588, and counters 1587 to facilitate the chopping process as well as ensuring the sequential order within the original chopped transaction is maintained.

Figure 16:
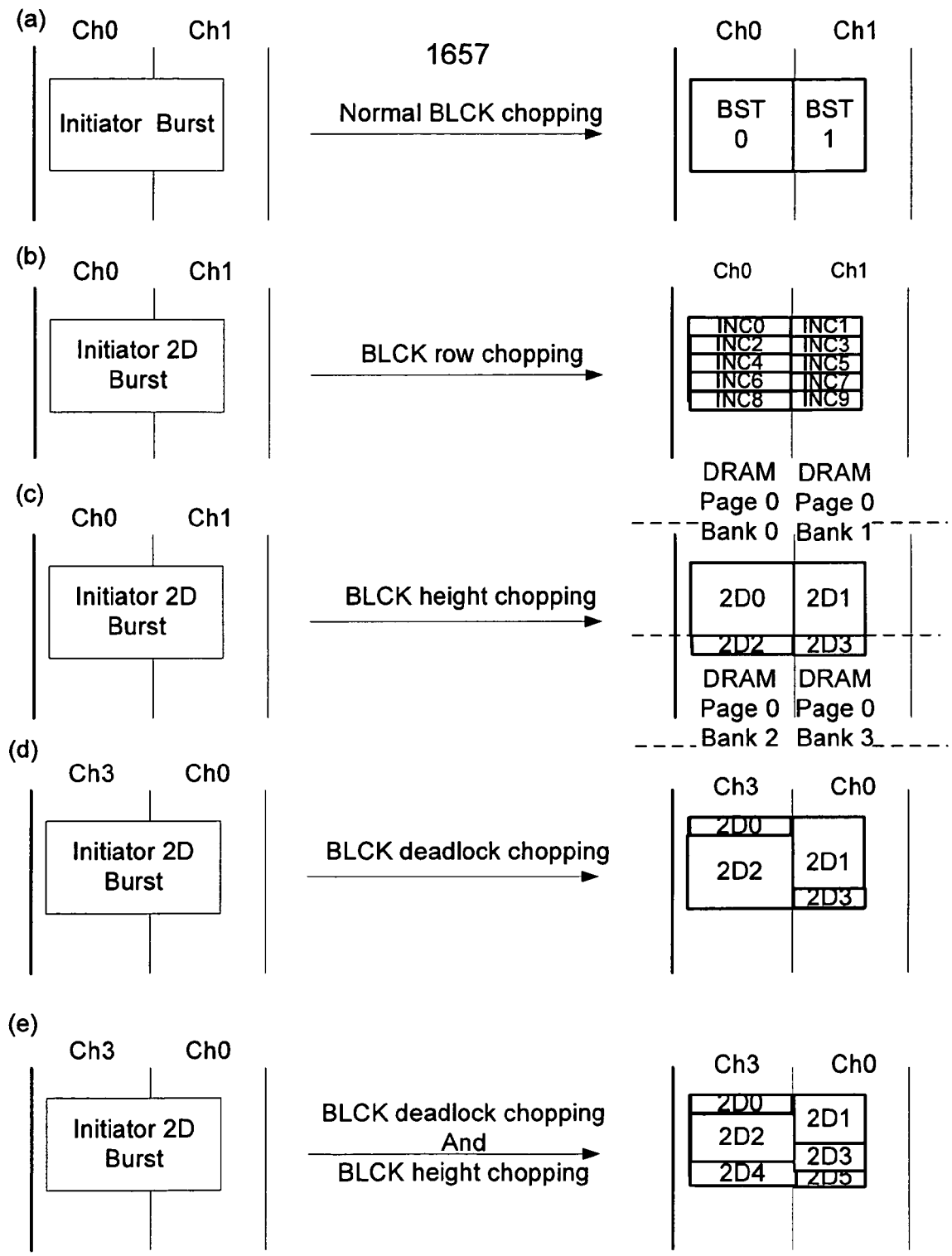
FIGS. 16a-16e illustrate five types of channel based chopping for block burst requests: normal block chopping, block row chopping, block height chopping, block deadlock chopping, and block deadlock chopping and then block height chopping.

The chopping logic supports transaction splitting across channels in an aggregate target. The chopping logic 1584 chops a burst when an initiator burst stays within a single region but spans a channel boundary. The chopping logic may be embedded in an initiator agent at the interface between the interconnect and a first initiator core. The chopping logic chops, an initial burst request spanning across one or more memory channel address boundaries to fulfill all of the word requests in the burst request, into two or more burst requests of a same height dimension for each memory channel. As shown in FIG. 16a the chopping algorithm in the flow control logic 1657 chops a series of requests in the burst request so that a starting address of an initial request in the series has a same offset from a channel boundary in a first memory channel as a starting address of the next request starting in the series of requests in the burst request in a neighboring row in the first memory channel as shown in FIG. 16b. Also, if the burst request vertically crosses into another memory channel, then the chopping algorithm chops a transaction series of requests in the burst request so that a starting address of an initial request has a same offset from a channel boundary in a first DRAM page of a first memory channel as a starting address of the next request starting the sequence of series of requests in the burst request of a second DRAM page of the first memory channel as shown in FIG. 16c.

The detector 1585 in detecting 2D block type burst requests also detects whether the initial word of the 2D burst request starts in a higher address numbered memory channel than memory channels servicing subsequent requests in that 2D burst request from the chopped transaction. If the detector detects that the initial words in a first row of the 2D block burst that crosses a memory channel boundary starts in a higher address numbered memory channel than subsequent requests to be serviced in a lower address numbered memory channel, then the state machine chops this first row into multiple bursts capable of being serviced independent of each other. The request, containing the initial words in a first row of the 2D block burst request, which is headed to the higher address numbered memory channel must be acknowledged as being received at a last thread merger unit prior to the intended higher address numbered memory channel before the chopping logic allows the second burst, containing the remainder of the first row, to be routed to the lower address numbered memory channel.

A state machine 1588 in the chopping logic chops a transaction based upon the type of burst request crossing the memory channel address boundary. The detector 1585 detects the type of burst. The detector detects for a request containing burst information that communicates one or more read requests in a burst from an initiator Intellectual Property (IP) core that are going to related addresses in a single target IP core. A burst type communicates the address sequence of the requested data within the target IP core. The state machine 1588 may perform the actual chopping of the individual transactions that cross the initial channel address boundary into two or more transactions/requests from the same thread and put chopped portions into the buffers 1587. The detector 1588 may then check whether the remaining words in the burst request cross another channel address boundary. The state machine will chop the transaction until the resulting transaction fits within a single channel's address boundary. The state machine 1585 may factor into the chop of a transaction 1) the type of burst request, 2) the starting address of initial word in the series of requests in the burst request, 3) the burst length indicating the number of words in the series of requests in the burst request, and 4) word length involved in crossing the channel address boundary. The word length and number of words in the burst request may be used to calculate the ending address of the last word in the original burst request. The design allows the traffic generating elements to allow both their request and response traffic to cross such channel address boundaries.

In an embodiment, the state machine 1585 in the chopping logic may include OCP socket support for 2-D block burst sequences. Support exists at both initiator and target sockets. MBlockHeight widths of 2 through 6 bits, inclusively, are supported. MBlockStride widths of 6 through 21 bits, inclusively, are supported. When block initiator bursts are addressed to a multi-channel target with more than 1 active target, then the MBlockStride value should be a natural number multiple of the channel round size, which ensures that each row in the block transaction begins in the same channel and at the same offset within the interleave. This enables chopping block bursts that cross channel boundaries into block bursts of the same MBlockHeight for each channel. This requirement can be checked by an RTL assertion.

In an embodiment, chopping logic at the initiator agent for initiator burst chopping at multi-channel boundaries permits non-block bursts to cross at most 1 channel boundary, and block bursts to cross at most 1 channel boundary for each row of the block burst. Burst_aligned incrementing burst requests may either completely fall into a single channel, or have a burst byte length of 2 times $2^{channel\_intereave\_size}$ bytes and a starting address that is aligned to an even-numbered channel's starting boundary. A 2D block burst may have a MBurstStride byte length equal to n times the Channel Round Size of the multi-channel address region, where n is the number of channel rounds for the region. Note, for a 2D block burst that does not target at a multi-channel region, the above constraint does not apply.

In an embodiment, a burst length may communicate that multiple read requests in this burst are coming from this same initiator IP core and are going to related addresses in a single target IP core. A burst type may indicate that the request is for a series of incrementing addresses or non-incrementing addresses but a related pattern of addresses such as a block transaction. The burst sequence may be for non-trivial 2-dimensional block, wrap, xor or similar burst sequences. If the block transaction is for two-dimensional data then the request also contains annotations indicating 1) a width of the two-dimensional object that the two-dimensional object will occupy measured in the length of the row (such as a width of a raster line), 2) a height of the two-dimensional object measured in the number of rows the two-dimensional object will occupy, and 3) a stride of the two-dimensional object that the two-dimensional object will occupy that is measured in the address spacing between two consecutive rows. Address spacing between two consecutive rows can be 1) a length difference between the starting addresses of two consecutive row occupied by the target data, 2) a difference between an end of a previous rows to the beginning of next row or 3) similar spacing. The single 2D block burst request may fully describe attributes of a two-dimensional data block across the Interconnect to a target to decode the single request.

A request generated for a block transaction may include annotations indicating that an N number of read requests in this burst are going to related addresses in a single target, a length of a row occupied by a target data, a number of rows occupied by the target data, and a length difference between starting addresses of two consecutive row occupied by the target data.

Chopping Individual Transactions that Cross Channel Boundaries Headed for Channels in an Aggregate Target so that Two or More or the Chopped Portions Retain Their 2D Burst Attributes FIGS. 16*a*-16*e* illustrate five types of channel based chopping for block burst requests: normal block chopping, block row chopping, block height chopping, block deadlock chopping, and block deadlock chopping and then block height chopping. The state machine may be configured to implement channel based chopping rules as follows:

For unknown pattern types of burst requests, the chopping logic breaks the single initiator burst into a sequence of single initiator word transfers with the same sequence code (chop to initiator singles).

For detected types of bursts such as streaming, incrementing address, XOR and wrap burst, the chop fits them within a single channel. Streaming bursts, by definition, are always within a single channel. An incrementing burst request is for a series of incrementing addresses and XOR bursts non-incrementing addresses but a related pattern of addresses that are cross a channel boundary. The state machine breaks the single initiator burst into a sequence of two or more separate burst requests—each with a burst length reduced to fit within each individual channel of an aggregate target (chop to channels). Moreover, for any XOR bursts crossing a channel boundary, the resulting channel bursts have a burst byte length that is equal to 2 times $2^{channel\_interleave\_size}$ bytes; and the second burst starts at MAddr+/-$2^{channel\_interleave\_size}$. For WRAP bursts that cross a channel boundary, the state machine breaks the single initiator burst into a sequence of single initiator word transfers (chop to initiator singles). Normally interleave_size is selected to be larger than the cache lines whose movement is the dominant source of WRAP bursts. So channel crossing WRAPs will usually not occur; and the chopping logic chops up a WRAP burst to two INCR bursts when the WRAP burst crosses a channel boundary.

A target is said to be capable of supporting an initiator's block burst if any of the following apply:
  The target OCP supports the block burst sequence.
  The target has sufficient width on MBurstLength, MBurstHeight, and MBurstStride to transfer the initiator's block burst, after any necessary width conversion adjustments. Note that for this, target's MBurstStride width has to be large enough to support initiator's burst MBurstStride/num_active_channels (of the decoded region of the target).
  If user controlled chopping is used at the target, then its chop_length parameter is large enough to transfer the initiator's block burst MBurstLength (after any necessary width conversion adjustments).

For any initiator 2-Dimensional block burst sent to a target that is not capable of supporting the block burst, and the target does not support INCR, the state machine breaks the initiator burst into a sequence of single initiator word transfers using the lowest numbered burst sequence that the target supports, each directed at the appropriate target (chop to initiator singles).

For any initiator 2-Dimensional block burst to a target that is not capable of supporting the block burst, but the target does support INCR bursts, the state machine performs block row chopping. Block row chopping breaks the initiator burst into a sequence of INCR bursts, one for each row in the block burst. If the row(s) crosses a channel boundary, each row is broken into a sequence of 2 INCR bursts, one to each channel. Each such INCR burst may further be chopped into smaller INCR bursts if the target has user-controlled burst chopping and does not have sufficiently large chop_length or the target supports a shorter OCP MBurstLength.

For block bursts to a target that does support block but has insufficient width on MBurstLength, MBurstHeight, or MBurstStride to transfer the initiator's request, then block row chopping is performed.

For block bursts to a target that does support block and has sufficient width on MBurstLength, MBurstHeight, and MBurstStride to support the initiator's request, the chopping logic sends the 2D request to the addressed target to service the entire request. If the row(s) crosses a channel boundary and the burst starts in the higher numbered memory channel in an aggregate target before a second subsequent request is serviced by a lower address numbered memory channel, then block deadlock chopping is performed. If the initiator block row(s) crosses a channel boundary and the burst starts in any channel other than the higher address numbered) memory channel than memory channels servicing subsequent requests in that burst, then normal block chopping is performed. Normal block chopping creates two smaller target block bursts, each with the initiator-supplied MBurstHeight and MburstStride as shown in FIG. 16*a*. The first of the two chopped block bursts has chopped length as its new width attribute to fit within a channel and is sent to the addressed channel. The second of the two chopped block bursts uses the remaining row length as its new width attribute and is sent to the addressed memory channel plus one.

The chopping logic prevents a deadlock situation when each smaller burst/portion of the transaction has requests that need to be serviced by their own channel and these requests should be serviced from each channel in a ping-pong fashion by making sure that the a burst request headed to a lower address numbered memory channel is serviced initially and then a burst request in the second portion may be serviced by a higher address numbered memory channel. If the initiator block row(s) crosses a channel boundary and the burst starts in a higher address numbered memory channel than memory channels servicing subsequent requests in that burst, then block deadlock chopping creates 4 target bursts as shown in FIG. 16d. The first of the 4 chopped burst (resulting from the deadlock block chopping) is a single row block with chopped length for the highest-number channel. It corresponds to the leading part of the first row of the initiator block burst that falls into the highest-numbered channel. The last of the 4 chopped burst (resulting from the deadlock block chopping) is a single row block with chopped length for the first channel (channel 0). It corresponds to the trailing part of the last row of the initiator block burst that falls into channel 0. The first and last single row block bursts are separated by an even number of block bursts each containing a series of rows that alternatively fall into channel 0 and then the highest-numbered channel, ch 3. Each pair of such channel block bursts has a new and the largest possible/affordable MBurstHeight that is a power of two. The 4 target bursts may have a new MBurstStride equal to the initiator-supplied MBurstStride divided by num_active_channels. The first chopped burst is a single row block with a chopped length spanning to the end of row for the higher address numbered memory channel. The second chopped burst is having the burst Height and stride 2D characteristics block yet with the remaining row length reduced to stay within the lower address numbered memory channel. The second chopped burst starts at the address where the first row crosses the channel boundary. The third chopped burst portion having the burst Height and stride 2D characteristics block yet with the remaining row length reduced to stay within the higher address numbered memory channel. Thus, the third chopped burst portion may have an initiator-supplied MBurstHeight−1, and block burst starting at the original MAddr+the initiator-supplied MBurstStride, with a chopped length to fit within the highest-numbered channel. The last forth block burst is a single row one with the remaining row length as its new width attribute to the lower address numbered memory channel. The block chopping mechanisms permit multiple initiating threads to have outstanding block transactions that cross channel boundaries without risk of deadlock.

In an embodiment, if the first row of a 2D block burst crosses a channel boundary and the row starts in the last (highest address numbered) active channel, then, this first row is chopped into two bursts. For instance, in the example explained above, the two-row 2D block burst "Rows_2D0_ch3 and the initial row of 2D1_ch0" will be chopped and split into the following four bursts and delivered to channel TA0 and TA1 respectively:

A single one-row block burst of Row_2Do_serviced by channel 3, a "smaller 2D block burst consisting of many rows 2D1_serviced by channel 0, a smaller 2D block burst consisting of many rows 2D2_serviced by channel 3, and another single one-row block burst of Row_2D3_serviced by channel 0.

Since the Channel Merger 0's 2D block burst locking condition for "Rows_2D0_ch3 and the initial row of 2D1_ch0" does not exist (they belong to two different bursts now, instead of one burst originally), the cyclic dependency stated before is broken and therefore there will be no deadlock.

Chopping the first initiator block burst into 4 target bursts instead of only 3 can allow hardware implementation optimization.

Whenever normal block chopping or block deadlock chopping is applied to a block Write burst or a block Multiple Request Multiple response Data Read (MRMD burst that is not translated to Single Request Multiple response Data (SRMD) (MRMD Read to SRMD Read translation is disabled for the given target), initiator agent sends the two resulting channel block bursts as a single atomic sequence, called an interleaved block burst. The reason is to prevent downstream mergers from interleaving in other traffic from other initiators while an upstream splitter switches among alternative rows of the two-channel block bursts. i.e., the splitter has to lock arbitration (using m_lockarb) on both of its outgoing branches/threads until all rows are processed and then release the lock on both branches/threads. In the alternative, the m_lockarb action at the splitter may be the following: (a) the initiator agent should set the m_lockarb properly among alternative rows to prevent downstream mergers from interleaving in other traffic before these alternative rows reaching the first channel splitter RS (only 1 channel crossing). At the channel splitter, the m_lockarb needs to be set for the first block burst's last row.

In the interconnect, 2D block bursts are sent as Single Request Multiple response Data bursts whenever possible (i.e., MRMD to SRMD conversion of RD bursts is not disabled). Burst length conversion for block channel bursts (post channel burst chopping) is performed similar to INCR bursts. For example, for wide-to-narrow conversion, burst length is multiplied by the ratio of target to initiator data widths; for narrow-to-wide conversions, initiator agent pads each row at start and end to align it to the target data width, and the resulting initiator burst (row) length is divided to get the target burst length. Block channel bursts of length 1 (post chopping) receive precise trimming, per row, to avoid excessive null requests. The exact number of target words in this case is calculated taking into account the incoming byte enables, then p_packwords, p_mburstlength, and p_maddr are all adjusted consistently with one another. Moreover, the initiator transfer may be trimmed to the smallest burst_aligned pattern to avoid unaligned bursts at the target.

As shown in FIG. 16c, the block chopping logic chops a request's height to vertically fit within a first address and a last address of a DRAM page boundary. If a multi-channel target has the protection mechanism enabled (with more than one protection region), then the resulting channel block bursts needs to have an MBurstHeight that is a power of two. This requirement is to simplify the logic that checks whether the start and end address of a block burst belong to the same protection region.

Under such circumstances, SSX uses block height chopping as described below.

In the presence of a protection mechanism, block bursts that would otherwise have normal block chopping are treated as follows: The initiator burst is translated into a sequence of block bursts with the same MBurstLength and MBurstStride but each with the largest possible MBurstHeight that is a power of 2. Each block burst of this sequence is then chopped into two channel bursts using normal block chopping, and sent as an atomic sequence. For example, an initiator block burst that starts at MAddr, crosses the channel boundary at MAddr2, and has MBurstHeight=15 is chopped into as a sequence of 8 block bursts with the following new (MAddr, MBurstHeight) tuple sequence:

1. (MAddr, 8), (MAddr2, 8);
   [(MAddr+8*MBurstStride, 4), (MAddr2+8*MBurstStride, 4)];
   [(MAddr+(8+4)*MBurstStride, 2), (MAddr2+(8+4)*MBurstStride, 2)];
   [(MAddr+(8+4+2)*MBurstStride, 1), (MAddr2+(8+4+2)*MBurstStride, 1)];
   i. Pairs that are sent as an atomic sequence are shown in square brackets. The new MBurstLength of the channel block bursts are not shown for clarity. The new MBurstStride is the same as the original one.

As shown in FIG. 16e, a round of block height chopping to the second and third of the 4 chopped bursts resulting from the original block deadlock chopping.

In an embodiment, when the chopping logic chops a request into two, the chopping logic maintains the width of the word request being chopped by figuring out the number of bits in the first portion of the chopped word request being serviced by a first channel and subtracting that number of bits from the width of a word to determine the width of the second portion of the chopped word request being serviced by a next channel. See FIG. 3 and chopped request d. The second portion of the chopped word request being serviced by a second channel has a starting address of a first row of the next channel. Also, each portion of a chopped burst request may be chopped so that a start address for requested bytes of an initial request in the series of requests in each portion has the same relative position within a channel (same relative offset in column from channel boundary) as other words in column. See FIG. 16a and the aligned portions in Channel 0.

In an embodiment, individual burst transactions resulting from a chop may not cross channel boundaries more than once in the linear/horizontal direction per row of the chopped transaction. The 2D transaction MBlockStride should map all rows consistently among channels to avoid channel crossing in vertical direction and vertically fit within a DRAM page boundary. The MBlockStride should be a multiple of (# channels x interleaving boundary). Transactions may be outstanding to multiple channels from same initiating thread. The interconnect internally provides initiator and target 2D transaction support for traffic from tpplications including graphics, image processing, and video MPEG coding/decoding.

The initiator agent chops initiator bursts into channel bursts. Pairs of such channel bursts may constitute an interleaved burst. An interleaved burst is one that has transfers for two different channels interleaved together. When normal block chopping or block deadlock chopping is performed on an initiator block Write burst (or RD burst that is transferred as MRMD), the two resulting component block bursts constitute an interleaved burst: the rows of the resulting component block bursts are transferred in an interleaved fashion, one row from one channel block burst is followed by one row from the other channel block burst until all rows are transferred. Initiator agent appends different routing information (m_cur-route/p_route) for transfers sent to the two channels.

The initiator agent sends any interleaved burst (always composed of at least two component block bursts) as an atomic sequence. That is, it sets the m_lockarb signal to 1 for all transfers in the interleaved bursts, except for the last one. This is to prevent other traffic (on the same threads) from being interleaved with the two constituent component block bursts at any downstream mergers. However, at some downstream channel splitter where the interleaved burst is split to two different branches and/or threads (based on the value of p_route), each constituent component block burst shall have its own m_lockarb=0 at the end of the burst. Since the received interleaved burst had only one transfer with m_lockarb=0, the splitter has to generate the second one. So, the final splitter of an interleaved burst shall set m_lockarb=0 when p_burstlast=1. The splitter compares its own channel_splitter_id to p_split_info to determine if the current burst is split across different branches at the current RS. The system cannot release channels servicing a 2D transaction until all of the parts making up the initial 2D transaction has been fully serviced and merged back together by a thread merger unit associated with the aggregate target. A response queue exists in the thread merger unit to collect the responses in order as they come back from the respective memory channels and when a last response from the chopped original burst request is collected by the response queue, then all of the responses may be sent back to the initiator IP core that issued the original burst request.

Each portion of an interleaved burst request may still be a compilation of two or more word requests and if so then those portions interleave sending requests to be serviced by the different channel with respect to requests from the other portions. Thus, responses from a burst request split in two and then sent down two different physical pathways are sent back to a thread merger unit in an alternating pattern from the two different memory channels so that responses back to the initiator are generated in the expected return order from the original chopped burst request.

In an embodiment, interleaved block bursts are generated at initiator agent as the result of either normal block chopping or block deadlock chopping. Such bursts carry two block bursts that are interleaved together; when they reach the right splitter down-stream, they split into two separate block bursts on two different outgoing branches/threads.

When the interleaved block bursts (INT_block bursts) are generated at initiator agent the following may occur.

A new payload signal is added to request path Dolphin links to carry block bursts that connect to multi-channel targets. Such DL links potentially carry interleaved block bursts. This signal is called p_interleaved_blck. It is required by splitters to store two entries in the cross-over queues for INT_block bursts.

An interleaved block burst is sent (originally by initiator agent) with p_interleaved_blck=1 for all transfers belonging to the first "component block burst" and p_interleaved_blck=0 for all transfers of the second "component block burst". All other commands (non-block or regular block bursts) are sent with p_interleaved_blck=0 on all transfers.

An interleaved block burst is sent as an atomic sequence; i.e., all of its transfers except the very last one has m_lockarb=1; the last transfer has m_lockarb=0.

The first transfer of the atomic sequence identifies the start of the first component block burst, and has route associated with that burst. The first transfer in the subsequence of the atomic sequence that has a different route identifies the start of the second component block burst. The remaining transfers sequentially belong to either the first or the second component block burst according to their route. The last transfer of each of the bursts is marked with m_burstlast=1.

The first transfer of each of the two component block bursts carries all the necessary control information for that block burst. Particularly: The first transfer of each of the two component block bursts is always sent with m_ack_req=1. All other transfers have m_ack_req=0. Only the first transfer of the first block burst may be sent with m_epoch=1.

The first transfer of each of the two component block bursts carries all the necessary payload information for that block burst. Generally, the two component block bursts have different values on p_maddr, p_maddrspace, p_mburstlength, and p_mburstheight. The two component block bursts will have the same values on the following payload signals: p_mburstprecise=1, p_mburstseq=block, p_mcmd, p_mburststride, p_mburstsinglereq, and p_mlittleendian.

Each row of each component block burst is ended with p_mrowlast=1.

For each interleaved block burst, one (or two, depending on the cross-over queue implementation) entry is pushed into the initiator agent cross-over queue. The entry shall contain information regarding p_mburstlength and p_mburstheight of the component block burst so that the responses can be sent out with the correct SRowLast and SBurstLast values.

The chopping logic chops a 2D burst request that spans across channel boundaries into two or more burst requests that each still retain attributes of a 2D transaction including the requested data's stride, height and width dimensions, but fits those 2D dimensions of each of the two or more burst requests to within the boundaries of a memory channel making up the aggregate target. The chopped transactions still retain attributes of a 2D transaction including the data's stride, height, and width, dimensions in the target memory, which are chopped to fit within memory page boundaries and memory channel boundaries. The 2D chopped transaction retains its 2D attributes including height and stride as long as vertically fits within the first address and last address of a DRAM page boundary as shown in FIG. 16c. As discussed, the chopping logic chops 2D transactions crossing a channel boundary to have equal height dimensions except when the interleaved memory segment make a complete wrap loop across channel boundaries of different channels back to the original channel that started supplying data for this request. Thus, the interconnect internally supports 2D transaction chopping across channel boundaries into two or more transactions from the same thread while maintaining the performance benefits of 2D transactions in a multi-channel system. Transporting 2D transactions with their retained attributes explicitly reduces request jitter & improves scheduler ability to group tiled transfers.

In an embodiment, to support block bursts and width conversion of block bursts, three new signals, p_mburststride, p_mburstheight and p_mrowlast are added to the DL link bundle. These signals are generated by initiator agent and transparently passed by the interconnect fabric to the target agent. The p_mburststride signal is in units of bytes and, while coming out of an initiator agent, it can be equal to the MBurstStride value carried by the original OCP block burst or this MBurstStride value divided by the number of active channels, if the channel splitting is performed at the initiator agent for the block burst. Also, the p_mburstheight signal is equal to the MBurstHeight value carried by the original block burst. The p_mburststride and p_mburstheight signals are signals for the request network only. The MBurstStride value is due to the discarding of address bits labeled as "Channel Select Bits" as shown in the initiator block of FIG. 18. The number of active channels can be derived from the active_targets setting in FIG. 5.

In addition to use the p_packwords signal and the p_burstlast signal, the p_mrowlast signal is also used to control the stop packing at the end of each row of a block burst. For a block burst crossing a channel interleave boundary, the p_mrowlast signal can also be used to allow the channel merger to re-assemble block burst responses on the response network properly. For a SRMD block read burst, the p_packwords is used to convey the target word enable information for the last transfer in each row of the block burst from initiator agent to target agent.

In an embodiment, block bursts can be transferred by the interconnect as a sequence of rows each having the address sequence of an incrementing burst. So, any rule that applies to transfer of incrementing bursts from initiator agent to target agent, applies to transfer block burst rows. The target agent is responsible to generate other OCP signals associated with block bursts, such as MReqRowLast, MDataRowLast, and MRespRowLast when they are configured.

In the request path, the acknowledgement mechanism prevents deadlock in normal flow control. The 2D request detector in the chopping logic in the request path is installed to do 2D block deadlock chopping. In the response path, channel response re-ordering is accomplished by passing information from request path thread splitter units over to the response path thread merger units. The response path thread merger units use this information to selectively back-pressure some response threads from physical pathways, which ensures that responses are correctly re-ordered before returning to their initiator cores.

In an embodiment, two or more discrete IP cores such as memory channels may make up a first aggregate target in the integrated circuit. The two or more memory channels populate an address space assigned to the first aggregate target and appear as a single target to the initiator IP cores. The interconnect implements chopping logic to chop individual burst requests that cross the memory channel address boundaries from a first memory channel to a second memory channel within the first aggregate target into two or more burst requests from the same thread. The chopping logic may be embedded in an initiator agent at the interface between the interconnect and a first initiator IP core. The chopping logic chops, an initial burst request whose starting address of an initial word in the burst request and ending address of the last word in the burst request causes that burst request to span across one or more memory channel address boundaries to fulfill all of the word requests in the burst request, into two or more burst requests of a same height dimension for each memory channel. The chopping logic may chop individual burst transactions that cross the channel boundaries headed for the two or more memory channels in an aggregate target to allow burst sizes and starting addresses of each burst transaction to be independent from the channel boundaries.

The chopping logic includes a channel chopping algorithm and a table to track thread ordering in a first burst request issued by a first IP initiator core to maintain a global target ordering among portions of the first burst request that are spread over the individual memory channels. The chopping algorithm chops a transaction series of requests in the burst request so that a starting address of an initial request in the series has a same offset from a channel boundary in a first memory channel as a starting address of the next request starting in the series of requests in the burst request in a neighboring row in the first memory channel. The chopping algorithm chops the burst request, when the burst request vertically crosses into another memory channel, into a series of requests in the burst request so that a starting address of an initial request has a same offset from a channel boundary in a first DRAM page of a first memory channel as a starting address of the next request starting the sequence of series of requests in the burst request of a second DRAM page of the first memory channel.

A detector detects when a starting address of an initial word of requested bytes in a burst request and ending address of the last word of requested bytes in the burst request causes the requested bytes in that burst request to span across one or more channel address boundaries to fulfill all of the word requests in the burst request. A state machine in the chopping logic chops a transaction based upon the type of burst request crossing the memory channel address boundary. The state machine factors into the chop of the transaction 1) the type of burst request, 2) a starting address of initial word in a series of requests in the burst request, 3) a burst length indicating a number of words in the series of requests in the burst request, and 4) word length involved in crossing the channel address boundary, where the word length and the number of words in the burst request may be used to calculate an ending address of a last word in the original burst request.

The responses from a burst request may be split in two and then sent down two different physical pathways, which are sent back to a thread merger unit in an alternating pattern from the two different memory channels so that responses back to the initiator are generated in the expected return order from the original chopped burst request. A response queue exists in the thread merger unit to collect the responses in order as they come back from the respective memory channels and when a last response from the chopped original burst request is collected by the response queue, then all of the responses may be sent back to the initiator IP core that issued the original burst request.

The chopping logic may be configured to chop individual burst requests that cross the memory channel address boundaries from a first memory channel to a second memory channel within the first aggregate target into two or more burst requests from the same thread that still retain attributes of a 2D transaction including the 2D data's stride, height, and width, dimensions in the first aggregate target, which are chopped to fit within memory page boundaries and memory channel boundaries of the first aggregate target. The chopping logic chops a 2D burst request that spans across channel boundaries into two or more burst requests that each still retain attributes of a 2D transaction including the requested data's stride, height and width dimensions, but fits those 2D dimensions of each of the two or more burst requests to within the boundaries of a memory channel making up the aggregate target. The 2D block burst request fully describes attributes of a two-dimensional data block containing annotations indicating a width length of a row occupied by target bytes, a number of rows occupied by the target bytes, and an address stride spacing between two consecutive rows occupied by the target bytes A first region of the address map is allocated for a two-dimensional (2D) tiled burst request that has rules adhering and maximizing performance for block memory page requests so that pixels all around a given pixel are kept available to fulfill the two dimensional tiled request.

The detector detects when a starting address of an initial word of requested bytes in a burst request and ending address of the last word of requested bytes in the burst request causes the requested bytes in that burst request to span across one or more channel address boundaries to fulfill all of the word requests in the burst request. The detector in detecting 2D block type burst requests also detects whether the initial word of the 2D burst request starts in a higher address numbered memory channel than memory channels servicing subsequent requests in that 2D burst request from the chopped transaction. If the detector detects that the initial words in a first row of the 2D block burst that crosses a memory channel boundary and the first row starts in a higher address numbered memory channel than subsequent requests to be serviced in a lower address numbered memory channel, then, the state machine chops this first row into two bursts capable of being serviced independent of each other.

The request, containing the initial words in a first row of the 2D block burst request, which is headed to the higher address numbered memory channel must be acknowledged as being received at a last thread merger unit prior to the intended higher address numbered memory channel before the chopping logic allows the second burst, containing the remainder of the first row, to be routed to the lower address numbered memory channel.

The chopping logic chop a first 2D block burst to have a number of rows occupied by the target bytes equal to n times a channel round size of the multi-channel address region, where n is the number of channel rounds for the region. The chopping logic also chops burst requests other than 2D burst requests. The chopping logic chops the resulting two or more burst requests, each with the initiator-supplied Height and Stride, a first of the chopped burst requests has a chopped length to fit within a channel and is sent to a first channel and the second of chopped burst requests uses a remaining row length as its new width attribute and is sent to a second channel.

Figure 17:
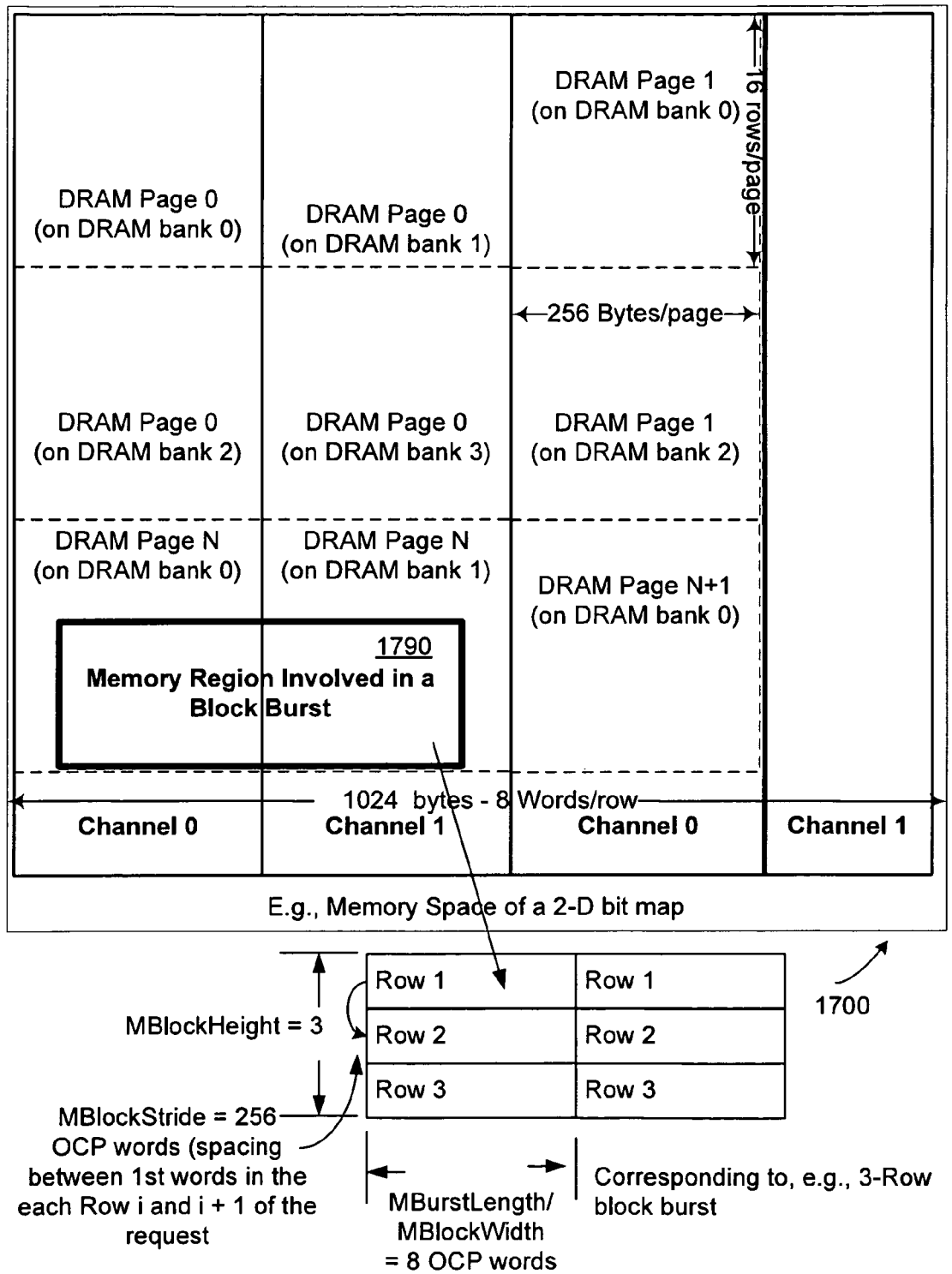
FIG. 17 illustrates an embodiment of a Memory Space of a 2-D bit map with one or more address regions of the address map allocated for a two-dimensional (2D) tiled burst request.

FIG. 17 illustrates an embodiment of a Memory Space of a 2-D bit map with one or more address regions of the address map allocated for a two-dimensional (2D) tiled burst request. One or more regions of the address map 1700 are allocated for a two-dimensional (2D) tiled burst request that have rules adhering and maximizing performance for block memory page requests so that pixels all around a given pixel, left right up and down from the target pixel, are kept available to fulfill the two dimensional tiled request. A tiling function may be a specified arbitrary swap of address bits available to the target.

The memory region 1790 involved in a block burst may fulfill an example, e.g., 3-Row 2-Dimensional OCP burst. The burst has a MBlockStride attribute=256 OCP words indicating the spacing between 1st words in Row i and Row i+1. The burst has a MBurstLength/MBlockWidth=8 OCP words. The burst has MBlockHeight attribute=3 rows. The tiling example has a 4-bank configuration, 4 KB pages (1024×32b), and 1024B/row, such as DRAM Page 0 on DRAM bank 0, DRAM Page 0 on DRAM bank 1, DRAM Page 0 on DRAM bank 2, DRAM Page 0 on DRAM bank 3, and wrapping again. 1 page buffer may be open in each discreet DRAM bank to store the block memory page request.

In the diagram, the memory channels divide the bit map into columns. The memory channels set at the size granularity of a memory page and are interleaved from 4 discrete DRAM banks/IP cores. The interleaved memory channels are configured for optimized 2D performance and are allocated to a region in the address map all by themselves.

This allocated region of the address map for 2D tiled request has rules adhering and maximizing performance for block memory page requests so that pixels all around a given pixel left right up and down from a target pixel are available in the same retrieved memory page. The tiling function changes the mapping structure of assigned addresses in a request to real memory address of the region to optimize a 2D block memory request. Further, page buffers may be open in each discreet DRAM bank to store the previous block memory page request, the current block memory page request, and the predicted future block memory page request. Traditional linear layout of bank, row, and column address bits for DRAM good for incrementing/wrapping bursts, i.e. cache line refills. Assigned tiled address regions for 2D data structures storage and retrieval (e.g. MPEG macro blocks) is good for 2D block requests. The assigned tiled address regions for 2D data tends to eliminate page miss for each row in macro block. Many consumer digital products improve situation by translating (transposing) address bits in path to DRAM, making rectangular pages from application. Such devices often support multiple organizations based on address aliasing to do address tiling translation.

The interconnect and memory scheduler provide a solution for address tiling and supports 2D transactions as defined by Open Core Protocol.

The DRAM address organization is changed from a linear approach in the 2D tiled space in this allocated region. The assigned address is translated to actual system address structure may be for example: <row[r:2]><bank[1]><col[9:6]><row[1:0]><bank[0]><col[5:0]>. Thus, in the address bits of a 2D burst request the fields corresponding to the above coordinates may be bits in fields 0-5 of the address correspond to width of the columns col[5:0] in DRAM banks 0 or 1, bit in fields 6 of the address correspond to DRAM bank 0 or 1, bits in fields 7-8 of the address correspond to the stride of the rows in DRAM banks 0 or 1, etc.

The memory addressable through the memory scheduler can then be mapped into the system address space as multiple regions (non-overlapping), with each having a unique tiling function. Tiling may be used in 2D memory page retrieval. A request retrieves a block of memory addresses forming the 2D memory page retrieval. Up to 2 tiling equations may exist per target agent connected to the memory scheduler. The address regions are associated with a target MAddrSpace by use of the address_space parameter for each region. Target cores may associate a unique tiling function to each address space. The target addressable range can then be mapped into the system address space as multiple regions (non-overlapping), with each having a unique tiling function. Boot configurability of region addr_space parameters may be useful. In the tiling equation an arbitrary permutation of bits Maddr may occur. The low-order 64 Bytes in an address regain are not tiled. The tiling does not impact memory channel selection. The tiling occurs after channel decoding. The chopping logic ensures each chopped portion of 2D request does not have a MBurst-Stride that crosses a vertical channel DRAM page boundary. The tiling equations may be re-programmed. The ability to perform multiple user specified address tiling functions in the target agent or memory scheduler exists. A tile_func parameter in the address regions so an internal tiling function can be specified independently of socket MAddrSpace. Address tiling makes 2D-type transactions far more efficient by reducing page miss rate.

In an embodiment, 1 page buffer may be open in each discreet Dynamic Random Access Memory (DRAM) bank to store the previous block memory page request, the current block memory page request, and the predicted future block memory page request. In memory systems, a memory page is a fixed number of bytes recognized by the DRAM organization such as a entire row of memory cells across a DRAM bank, which is subsequently accessed in a page buffer for that DRAM bank.

FIG. 18 illustrates an address matching of multi-channel interleaving and address tiling example. A possible address translation flow 1900 occurs starting from the initiator side, going through an optional address-filling-in operation at the initiator agent, going through the address decoding and channel splitting at the initiator agent, delivering to a channel target, coming out of the interconnect with a proper MAddrSpace, going through a target side memory scheduler module using one of the user defined tiling transform functions, and, at the end, reaching the IP memory core target. The memory scheduler supports user defined address tiling. Each tiling transform function will be associated with a specified OCP MAddrSpace. The memory addressable through the memory scheduler can then be mapped into the system address space as multiple regions non-overlapping, with each having a unique tiling function.

Figure 19:
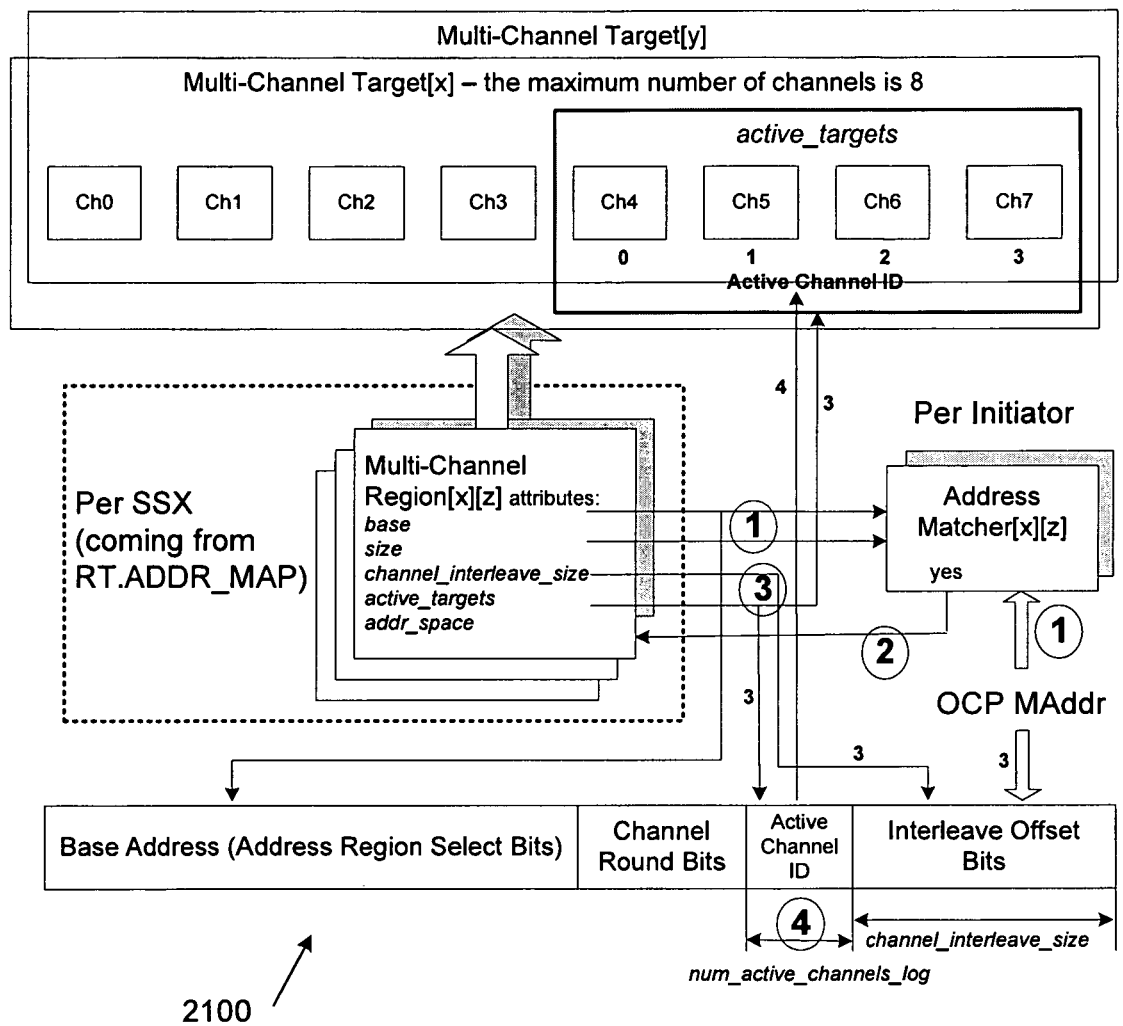
FIG. 19 depicts a block diagram of an embodiment to address match for multi-channel regions.

FIG. 19 depicts a block diagram of an embodiment to address match for multi-channel regions. An initiator agent 2100 decodes an incoming Open Core Protocol (OCP) address in a burst request. The OCP address received by an initiator agent is checked against base and size of all Multi-Channel Region[x][any] that are mapped to Multi-Channel Target[x] which has connectivity to this initiator thread (e.g., Address Matcher[x][any]). The address matchers use the base address, the region size, and perhaps alias_size attributes of a region to match an address against the request. Once a multi-channel region is matched against an initiator address, the initiator needs to identify the channel of the multi-channel target that contains the address. This would in turn depend on the active_targets attribute of the decoded multi-channel region. The OCP MAddr is matched against Multi-Channel Region[x][z] and Address Matcher[x][z]. The active_targets attribute encodes the ordered subset of channels, active_channel_set, of the multi-channel target that are active in the given multi-channel region. Let us say the size of the active_channel_set ordered subset is num_active_channels. This number is always a power of two. The region attributes are then used to identify the active_targets, num_active_channels, and the bit field of the OCP MAddr that encodes the active channel ID to which the OCP address maps. Active channel ID of the OCP address is then mapped to one of the physical active channel.

An ADDR_MAP register block may contain all of the attributes associated with any multi-channel address regions. A multi-channel region is associated with a multi-channel target at design time. A multi-channel target is an ordered set of individual targets with similar OCP parameters. The attributes of a multi-channel region include base, size, channel_interleave_size, active_targets, addr_space, and num_channels. Definitions and usages for these region attributes are described in the external chapter.

Each initiator agent that has a connection to a multi-channel target is instantiated with one address matcher per each multi-channel region of that target. This enables the initiator agent to decode any OCP address that falls into any of such regions.

Please note that the number of active channels (num_active_channels) equals the number of active targets for a multi-channel region since each active channel is mapped to exactly one individual target. Also, the num_channels attribute of the multi-channel region indicates the maximum number of channels (i.e., individual targets) structurally available for the address region.

If num_active_channels==1, then any address belonging to this region falls into the single channel identified by the active_targets attribute of this address region, with no further processing needed. In the following discussion, it is assumed that num_active_channels>1.

If the ith element of the ordered channel set active_channel_set associated with active_targets is (physical) channel j, then we have:

i. active_channel_set[i]=j, for 0<=i<=num_active_channels, and 0<=j<=num_channels.

Using the region's channel_interleave_size attribute, the $2^{channel\_interleave\_size}$ byte size number identifies the interleave size and the boundaries at which a channel crossing occurs. Let's also define i. num_active_channels_log=log2(num_active_channels).

ii. Then the following MAddr bit field of an OCP request phase encodes the active channel ID to which an address belongs:

i. MAddr[num_active_channels_log+channel_interleave_size−1: channel_interleave_size]

If the value of this bit field is i, then this OCP request shall be routed to channel "active_channel_set[i]". Moreover, the above bit field of MAddr is stripped off by initiator agent when being passed to the downstream RS channel splitter.

a. The initiator agent chops each initiator bursts into a number of smaller bursts according to regular and channel-based chopping rules. The initiator agent has to assemble the corresponding read response words and forward them with the correct delineations (e.g., SRespLast and SRespRowLast) to its OCP interface. If write responses are needed, the initiator agent would need to collect one response per transmitted burst chop (Write requests are sent as SRMD bursts to interconnect core), and either generate a single OCP response for SRMD Write bursts, or MBurstLength number of OCP responses for MRMD Write bursts.

b. In an embodiment, when write posting is enabled, proper write-response drop counts need to be maintained in order to discard interconnect write responses returned from the din port when their posted OCP write response counterparts have been sent back to initiator already.

c. Per initiator thread response words that are received by the initiator agent from the dlin port are guaranteed to be in order, even for accesses to multi-channel targets. It is the cross-over queues of the downstream channel splitters on the request network that are used to help the corresponding channel mergers upstream to the initiator agent on the response network to collect such channel responses into the correct order before passing them in-order to the initiator agent on the response path.

d. The initiator agent has a per initiator thread cross-over queue for response assembly. However, additional information is stored, per entry, in the cross-over queues to support the kinds of bursts supported by the interconnect such as block and INT_block. The following fields are not needed if the initiator OCP interface does not support block bursts.

For initiator block requests, responses may need to have SRespRowLast=1 at the end of each row. A new single bit field called chop_blck is stored in the cross-over queue to indicate that SRespLast may need to be generated at the appropriate points in the response stream (further explained below). It is also used for correctly counting responses associated with block or INT_block burst chops. Note that this bit could be set to 1 for any of the burst chops associated with an initiator block burst (INCR, block, INT_block). It is never set to 1 for any of the burst chops of non-block initiator bursts.

A new field chop_deadlock_blck is stored in the cross-over queue. chop_deadlock_blck=1 only for INT_block burst chops that are the result of block deadlock chopping. Such INT_block burst chops miss the first portion of the first row and the last portion of the last row at the channel crossing boundary. Any other burst chop (particularly when chop_blck=0) shall have chop_deadlock_blck=0.

Three counts are stored in the cross-over queue to handle block and INT_block bursts: chop_burst_length, chop_burst_height, chop_partial_burst_length.

a. The chop_burst_length count is used to count the number of responses in a non-block burst chop, or the length of rows in a block or INT_block burst chop (see the description of chop_partial_burst_length below for more details). If field chop_blck=1 and partial_burst_length=0, then at the end of each chop_burst_length responses associated with this burst chop, the initiator agent may set SRespRowLast=1 if the signal is present. Note that if an initiator block burst is chopped to non-block bursts (e.g., INCR), not all of them will have their cross-over entry with a chop_blck=1; only the ones that coincide with the end of a row will have chop_blck=1.

b. The chop_burst_height field is used for block and INT_block burst chops. It has to be 1 for all non-block burst chops, and equal to the number of full rows in block or INT_block bursts. When block deadlock chopping is used, the resultant INT_block burst has 2 less full rows than the original channel-crossing burst.

c. The chop_partial_burst_length field is non-zero only for INT_block burst chops that are the result of block deadlock chopping. Such INT_block burst chops miss the first portion of the first row and the last portion of the last row at the channel crossing boundary. For such bursts, this count is set to the p_mburstlength of the second component block burst of the INT_block burst; i.e., the block that starts in the highest-numbered active channel. For any other kind of burst chop (particularly when chop_blck=0) this field has to be 0. As an example, consider an initiator block burst that has MBurstLength=10, starting at channel 7 and crossing into channel 0 after the $7^{th}$ word of its row(s). Since block deadlock chopping is to be performed, the resulting INT_block burst chop shall have chop_partial_burst_length=7. A non-zero value for partial_burst_length shall always be accompanied by field chop_blck=1; moreover, the chop_burst_length in that case shall be set to the p_mburstlength of the first component block burst of the INT_block burst; i.e., the block that starts in the lowest-numbered active channel (e.g., chop_burst_length=3 in the above example).

When processing the cross-over entries on the response side, if chop_blck=1 and chop_deadlock_blck=1 (thus partial_burst_legnth!=0); that is for an INT_block burst chop that is result of block deadlock chopping, then the initiator agent sends the first SRespRowLast=1 with the last of chop_burst_length responses, the initiator agent then sends as many as chop_burst_height SRespRowLast=1 which are separated by chop_burst_length+chop_partial_burst_length responses the initiator agent then sends a final chop_partial_burst_length of responses. The last of such responses is NOT sent with SRespRowLast=1.

When processing the cross-over entries on the response side if chop_deadlock_blck=0 (thus partial_burst_legnth=0) then a. the initiator agent retrieves and sends chop_burst_length*MBurstHeight responses, and if chop_blck=1 then each sequence of chop_burst_length responses is ended with a SRespRowLast=1.

i. The request-side MBurstHeight value may be stored in the cross-over queue.

An entry of a cross-over queue is popped out when it is completely processed.

a. There needs to be a field in the cross-over entry indicating which burst-chop shall end with a SBurstLast=1. Only the very last burst chop of an initiator burst shall have a cross-over entry with this field set to 1.

The initiator agent has necessary mechanisms, using the cross-over queues for correct generation of OCP Write responses. For SRMD Writes, a single response shall be generated with the completion of the last burst chop. For MRMD bursts, the new additional fields mentioned above can be used to generate the correct number of responses associated with each burst chop, with the correct assertion of SRespRowLast=1 when necessary. Each burst chop of a SRMD/MRMD OCP Write burst always returns a single response (because they are all sent as SRMD Writes) that is discarded by the initiator agent.

The depth of each per initiator thread cross-over queues is determined by max_burst. The initiator agent will suspend its burst chopping when the cross-over queue fills up, and resume it when entries becomes available.

The initiator agent detects when an initiator thread accesses a different aggregate target than the last target that was accessed. In such instances, the initiator agent suspends the whole burst chopping process and sending of burst chops to target channels until all the currently pending bursts to the current open aggregate target are completed; i.e., until the cross-over queue of the initiator thread becomes empty.

Two example ways of implementing the initiator agent cross-over queue are:
  a. In a wide implementation of it, the initiator agent (having full knowledge about the burst being chopped) stores one entry per INT_block burst chop that has all the necessary information indicated above in it (chop_burst_length, chop_burst_height, and chop_partial_burst_length). However, in such implementation, the chop_deadlock_blck field would be redundant as its value would be captured with that of chop_partial_burst_length.
  b. In a deep implementation of the cross-over queue, the initiator agent stores two entries in the turnaround queue for INT_block burst chops: the first entry has a value of 1 on field chop_deadlock_blck, indicating of the existence of the second entry. The first entry will carry the chop_burst_length, and the second entry will carry the chop_partial_burst_length, as described previously. Thus, the cross-over queue can be made narrower, but perhaps needs to be made a little bit deeper. In this case, the initiator agent response logic pops the first entry to be able to access the additional information of the second entry. On the request side, each entry of an INT_block is pushed to the cross-over queue with the first transfer of the associated component block burst.

The initiator agent has a separate epoch_counter for each initiator thread. The epoch_counter is loaded with the relative bandwidth weight value every time it reaches 0, or this initiator agent thread switches to a different target. Note that accesses to different channels of a multi-channel target belong to the same target, and do not cause any reloading of the epoch_counter. The epoch_counter is decremented with each transfer that is sent to the current open target (or multi-channel target) of this initiator thread.

Interleaved block bursts may be classified into two or more categories. The two categories differ in the order in which the first and second component block bursts start and end with respect to each other.

Category (A): The first component block burst ends after the start of the second block burst and before the end of it. A downstream splitter that detects the change of (the header of) p_route within the atomic sequence can readily insert a missing m_epoch=1 on the first transfer of the second component block burst (if it was set on the first transfer of the atomic sequence), and m_lockarb=0 on the last transfer of the first block burst, and successfully split the interleaved block burst.

Category (B): The first component block burst ends before the second component block burst even starts. A downstream splitter that detects the change of p_route within the atomic sequence can still readily set a missing m_epoch=1 for the first transfer of the second block burst, if it was set on the first transfer of the atomic sequence. The splitter can also detect that the first m_burstlast of the atomic sequence is not accompanied with m_lockarb=0, but by the time it examines the p_route of the next transfer for a change, it would be too late to set m_lockarb=0 for the last transfer of the first burst! To correctly reset m_lockarb=0 for the first block burst of an interleaved block burst, either A splitter has to look ahead into the route of the next transfer when it sees p_burstlast=1 and m_lockarb=0; this solution incurs both area and latency penalty.

Alternatively a splitter has to know structurally that it is indeed the splitter for this interleaved block burst based on the p_route of the very first transfer; this may not be even possible, or Additionally, the initiator agent has to explicitly notify this splitter, with the very first transfer of the INT_block burst, that it has to perform splitting, and reset to 0 any m_lockarb=1 in the atomic sequence that is accompanied by p_burstlast=1.

A DL link payload signal p_split_info may be used to notify the splitter. The p_split_info field is zero for non-INT_block bursts. For INT_block bursts, split_info identifies the downstream splitter where the INT_block burst will split into two. The channel splitter whose channel_splitter_id matches p_split_info will split the INT_block burst and reset to 0 any m_lockarb=1 in that atomic sequence that is accompanied by a p_burstlast=1.

Higher Performance Access Protection

The chopping logic in the interconnect may also employ a new higher performance architecture for access protection mechanism (PM) checking. The architecture is a dual look-up architecture. Each request burst issued from the target agent is first qualified by the PM using two look-ups in parallel. The first look-up is based upon the starting address for the burst. The second look-up is based upon the calculated ending address for the burst. Qualification of the access as permitted requires all the conditions as current required in SMX associated with the first look-up, plus 1 new condition. The new condition is that the first and second look-ups must hit the same protection region. This disqualifies bursts that cross a protection region boundary, even if the proper permissions are set in both the starting and the ending regions. It is expected and required that a single protection region covers data sets accessed by bursts.

The second look-up is only performed for INCR bursts at targets with burst_aligned=0, and for block bursts. For WRAP, XOR, STRM, and burst aligned INCR bursts success of the second look-up is guaranteed (by the aligned nature of the bursts, the range of lengths supported, and the minimum granularity of protection region sizes). UNKN and DFLT2 transactions are still only handled as single word transfers at protected the target agents, so the second look-up for these is also assured.

The dual look-up PM eliminates need for conservative locality enforcement by the IA. The most performance costly cases of IA burst chopping are eliminated, block burst support also plays a key role here, as it is believed that the dominant use of UNKN bursts is for 2D transactions. Converting these initiators to use block bursts will permit more efficient handling at targets with PMs and better gate count scaling.

In order to make the ending address calculations for block bursts more hardware and timing efficient, handling is restricted to MBlockHeight values that are binary powers. This burst chopping is performed by the initiator agent merely when the addressed the target agent has a Protection Manager. As a result, it is possible that a single initiator block burst will be chopped into a sequence of target block bursts, each of which must pass a PM check. This offers a possible exception to the requirement for a single protection region that covers the entire initiator burst. It is also possible that earlier portions of the initiated block burst will pass PM checks, and later portions will fail PM checks. If such a burst is a read, some response data may be returned before an error response is returned. No protected data however will be leaked in these cases, as the returned responses were all from addresses to which access was granted, and response ERR and 0 data words were returned from all addresses inclusively after the first violation was detected. An equivalent behavior exists today in SMX when initiator bursts are chopped for PM locality enforcement.

Adding an access protection mechanism to an aggregate target requires adding and identically configured one to each of the individual targets in the aggregate. Soccomp will check that if a PM exists at any target that is a member of a multi-channel target, that one exists at all member targets. Further, the number of regions defined for each of these PMs must be the same.

It is the responsibility of software to maintain the individual PMs for a multi-channel set in such a manner as they are always effectively identical. There may be a time interval between the update of region M at channel X and the update of region M at channel Y. The security manager should not permit use of region M until all channels have been updated.

High Performance, Asynchronous, and Voltage Isolated OCP Bridging

The interconnect supports multiple asynchronous clock inputs. One is designated as the base clock, and corresponds to the single clock provided to SMX. Coincident with the SMX-C0 release, Sonics makes available a high performance OCP2-to-OCP2 asynchronous voltage isolating bridge. SSX permits an asynchronous input clock to be associated with each socket. When such an association is made, an instance of the asynchronous bridge is automatically included for the socket. That bridge can be configured to include tactical cells for voltage isolation. A new top layer of RTL hierarchy is created to facilitate separation of voltage domains within the hierarchy.

Figure 20:
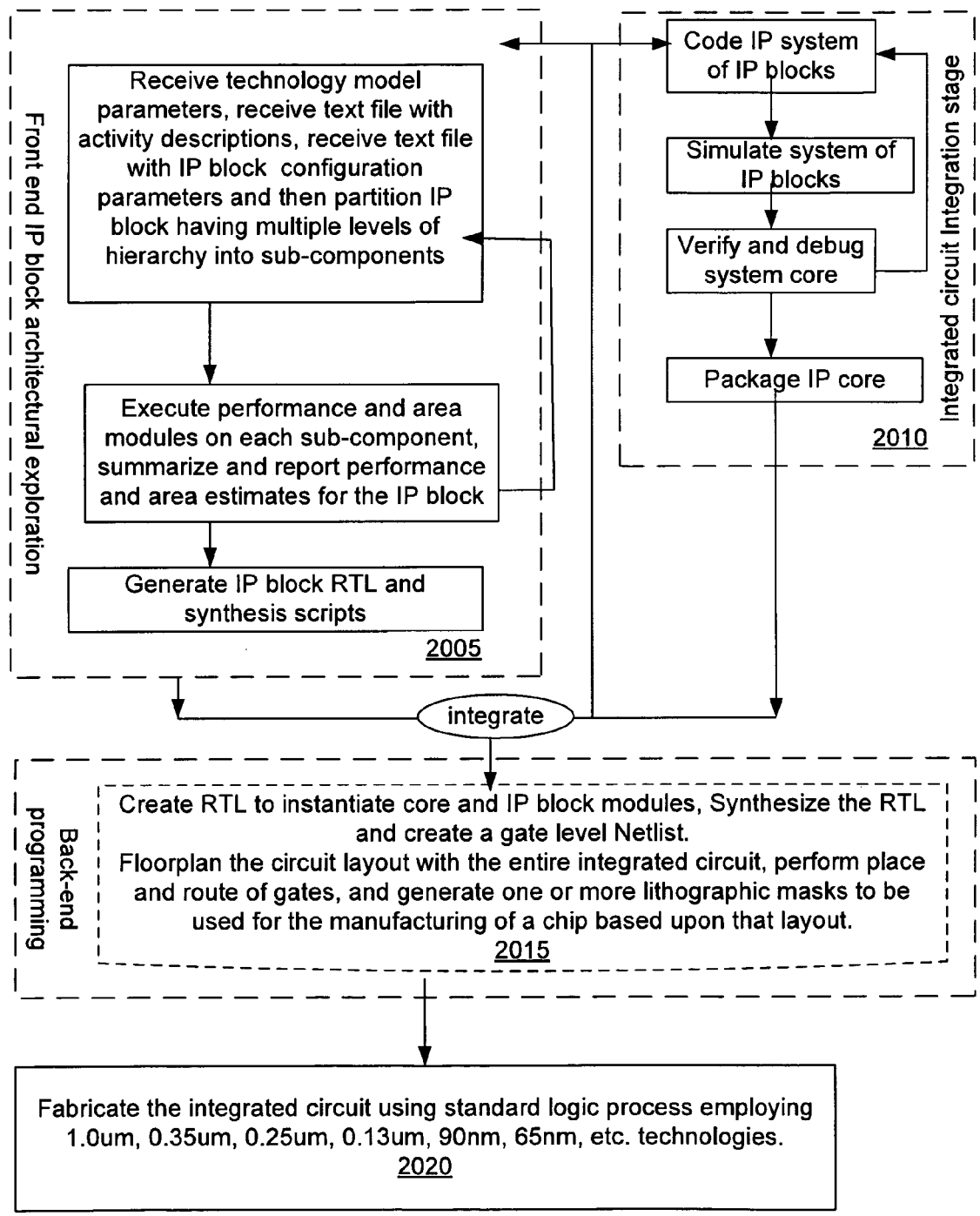
FIG. 20 illustrates a flow diagram of an embodiment of an example of a process for generating a device, such as a System on a Chip, with the designs and concepts discussed above for the Interconnect.

FIG. 20 illustrates a flow diagram of an embodiment of an example of a process for generating a device, such as a System on a Chip, with the designs and concepts discussed above for the Interconnect. The example process for generating a device with from designs of the Interconnect may utilize an electronic circuit design generator, such as a System on a Chip compiler, to form part of an Electronic Design Automation (EDA) toolset. Hardware logic, coded software, and a combination of both may be used to implement the following design process steps using an embodiment of the EDA toolset. The EDA toolset such may be a single tool or a compilation of two or more discrete tools. The information representing the apparatuses and/or methods for the circuitry in the Interconnect, etc may be contained in an Instance such as in a cell library, soft instructions in an electronic circuit design generator, or similar machine-readable storage medium storing this information. The information representing the apparatuses and/or methods stored on the machine-readable storage medium may be used in the process of creating the apparatuses, or representations of the apparatuses such as simulations and lithographic masks, and/or methods described herein.

Aspects of the above design may be part of a software library containing a set of designs for components making up the Interconnect and associated parts. The library cells are developed in accordance with industry standards. The library of files containing design elements may be a stand-alone program by itself as well as part of the EDA toolset.

The EDA toolset may be used for making a highly configurable, scalable System-On-a-Chip (SOC) inter block communication system that integrally manages input and output data, control, debug and test flows, as well as other functions. In an embodiment, an example EDA toolset may comprise the following: a graphic user interface; a common set of processing elements; and a library of files containing design elements such as circuits, control logic, and cell arrays that define the EDA tool set. The EDA toolset may be one or more software programs comprised of multiple algorithms and designs for the purpose of generating a circuit design, testing the design, and/or placing the layout of the design in a space available on a target chip. The EDA toolset may include object code in a set of executable software programs. The set of application-specific algorithms and interfaces of the EDA toolset may be used by system integrated circuit (IC) integrators to rapidly create an individual IP core or an entire System of IP cores for a specific application. The EDA toolset provides timing diagrams, power and area aspects of each component and simulates with models coded to represent the components in order to run actual operation and configuration simulations. The EDA toolset may generate a Netlist and a layout targeted to fit in the space available on a target chip. The EDA toolset may also store the data representing the interconnect and logic circuitry on a machine-readable storage medium.

Generally, the EDA toolset is used in two major stages of SOC design: front-end processing and back-end programming.

Front-end processing includes the design and architecture stages, which includes design of the SOC schematic. The front-end processing may include connecting models, configuration of the design, simulating, testing, and tuning of the design during the architectural exploration. The design is typically simulated and tested. Front-end processing traditionally includes simulation of the circuits within the SOC and verification that they should work correctly. The tested and verified components then may be stored as part of a stand-alone library or part of the IP blocks on a chip. The front-end views support documentation, simulation, debugging, and testing.

In block 2005, the EDA tool set may receive a user-supplied text file having data describing configuration parameters and a design for at least part of an individual IP block having multiple levels of hierarchy. The data may include one or more configuration parameters for that IP block. The IP block description may be an overall functionality of that IP block such as an Interconnect. The configuration parameters for the Interconnect IP block may be number of address regions in the system, system addresses, how data will be routed based on system addresses, etc.

The EDA tool set receives user-supplied implementation technology parameters such as the manufacturing process to implement component level fabrication of that IP block, an estimation of the size occupied by a cell in that technology, an operating voltage of the component level logic implemented in that technology, an average gate delay for standard cells in that technology, etc. The technology parameters describe an abstraction of the intended implementation technology. The user-supplied technology parameters may be a textual description or merely a value submitted in response to a known range of possibilities.

The EDA tool set may partition the IP block design by creating an abstract executable representation for each IP sub component making up the IP block design. The abstract executable representation models TAP characteristics for each IP sub component and mimics characteristics similar to those of the actual IP block design. A model may focus on one or more behavioral characteristics of that IP block. The EDA tool set executes models of parts or all of the IP block design.

The EDA tool set summarizes and reports the results of the modeled behavioral characteristics of that IP block. The EDA tool set also may analyze an application's performance and allows the user to supply a new configuration of the IP block design or a functional description with new technology parameters. After the user is satisfied with the performance results of one of the iterations of the supplied configuration of the IP design parameters and the technology parameters run, the user may settle on the eventual IP core design with its associated technology parameters.

The EDA tool set integrates the results from the abstract executable representations with potentially additional information to generate the synthesis scripts for the IP block. The EDA tool set may supply the synthesis scripts to establish various performance and area goals for the IP block after the result of the overall performance and area estimates are presented to the user.

The EDA tool set may also generate an RTL file of that IP block design for logic synthesis based on the user supplied configuration parameters and implementation technology parameters. As discussed, the RTL file may be a high-level hardware description describing electronic circuits with a collection of registers, Boolean equations, control logic such as "if-then-else" statements, and complex event sequences.

In block 2010, a separate design path in an ASIC or SOC chip design is called the integration stage. The integration of the system of IP blocks may occur in parallel with the generation of the RTL file of the IP block and synthesis scripts for that IP block.

The EDA toolset may provide designs of circuits and logic gates to simulate and verify the operation of the design works correctly. The system designer codes the system of IP blocks to work together. The EDA tool set generates simulations of representations of the circuits described above that can be functionally tested, timing tested, debugged and validated. The EDA tool set simulates the system of IP block's behavior. The system designer verifies and debugs the system of IP blocks' behavior. The EDA tool set tool packages the IP core. A machine-readable storage medium may also store instructions for a test generation program to generate instructions for an external tester and the interconnect to run the test sequences for the tests described herein. One of ordinary skill in the art of electronic design automation knows that a design engineer creates and uses different representations to help generating tangible useful information and/or results. Many of these representations can be high-level (abstracted and with less details) or top-down views and can be used to help optimize an electronic design starting from the system level. In addition, a design process usually can be divided into phases and at the end of each phase, a tailor-made representation to the phase is usually generated as output and used as input by the next phase. Skilled engineers can make use of these representations and apply heuristic algorithms to improve the quality of the final results coming out of the final phase. These representations allow the electric design automation world to design circuits, test and verify circuits, derive lithographic mask from Netlists of circuit and other similar useful results.

In block 2015, next, system integration may occur in the integrated circuit design process. Back-end programming generally includes programming of the physical layout of the SOC such as placing and routing, or floor planning, of the circuit elements on the chip layout, as well as the routing of all metal lines between components. The back-end files, such as a layout, physical Library Exchange Format (LEF), etc. are generated for layout and fabrication.

The generated device layout may be integrated with the rest of the layout for the chip. A logic synthesis tool receives synthesis scripts for the IP core and the RTL design file of the IP cores. The logic synthesis tool also receives characteristics of logic gates used in the design from a cell library. RTL code may be generated to instantiate the SOC containing the system of IP blocks. The system of IP blocks with the fixed RTL and synthesis scripts may be simulated and verified. Synthesizing of the design with Register Transfer Level (RTL) may occur. The logic synthesis tool synthesizes the RTL design to create a gate level Netlist circuit design (i.e. a description of the individual transistors and logic gates making up all of the IP sub component blocks). The design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist can also describe the connectivity of an electronic design such as the components included in the design, the attributes of each component and the interconnectivity amongst the components. The EDA tool set facilitates floor planning of components including adding of constraints for component placement in the space available on the chip such as XY coordinates on the chip, and routes metal connections for those components. The EDA tool set provides the information for lithographic masks to be generated from this representation of the IP core to transfer the circuit design onto a chip during manufacture, or other similar useful derivations of the circuits described above. Accordingly, back-end programming may further include the physical verification of the layout to verify that it is physically manufacturable and the resulting SOC will not have any function-preventing physical defects.

In block 2020, a fabrication facility may fabricate one or more chips with the signal generation circuit utilizing the lithographic masks generated from the EDA tool set's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light including X-rays and extreme ultraviolet radiation may pass through these lithographic masks onto the chip to transfer the circuit design and layout for the test circuit onto the chip itself.

The EDA toolset may have configuration dialog plug-ins for the graphical user interface. The EDA toolset may have an RTL generator plug-in for the SocComp. The EDA toolset may have a SystemC generator plug-in for the SocComp. The EDA toolset may perform unit-level verification on components that can be included in RTL simulation. The EDA toolset may have a test validation testbench generator. The EDA toolset may have a dis-assembler for virtual and hardware debug port trace files. The EDA toolset may be compliant with open core protocol standards. The EDA toolset may have Transactor models, Bundle protocol checkers, OCPDis2 to display socket activity, OCPPerf2 to analyze performance of a bundle, as well as other similar programs As discussed, an EDA tool set may be implemented in software as a set of data and instructions, such as an Instance in a software library callable to other programs or an EDA tool set consisting of an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; EPROMs; EEPROMs; FLASH, magnetic or optical cards; or any other type of media suitable for storing electronic instructions. The instructions and operations also may be practiced in distributed computing environments where the machine-readable media is stored on and/or executed by more than one computer system. In addition, the information transferred between computer systems may either be pulled or pushed across the communication media connecting the computer systems.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. A target may be single threaded or multiple threaded. The invention is to be understood as not limited by the specific embodiments described herein, but only by scope of the appended claims.

We claim:

1. An interconnect for an integrated circuit to route transactions between one or more initiator Intellectual Property (IP) cores and multiple target IP cores coupled to the interconnect, based upon a provided transaction address that associates that individual transaction with the target IP core, wherein the interconnect implements an address map with assigned address for the target IP cores, including two or more channels making up a first aggregate target, wherein the two or more channels populate an address space assigned to the first aggregate target and appear as a single target to the initiator IP cores, and the interconnect implements chopping logic to chop an individual transaction from a first initiator IP core whose address sequence crosses a channel address boundary from a first channel to a second channel within the first aggregate target into two or more burst transactions, wherein a first chopped burst transaction is chopped to fit within the address boundaries of the first channel and a second chopped burst transaction is chopped to fit within the address boundaries of the second channel, where the interconnect implements the chopping logic at two or more distributed locations within the interconnect.

2. The apparatus of claim 1, wherein the burst transactions include one or more requests and one or more optional responses and the burst transactions are part of a same thread from the first initiator IP core.

3. The apparatus of claim 1, wherein the first aggregate target of the multiple target IP cores includes two or more memory channels that are interleaved in an address space for the first aggregate target in the address map, where the two or more channels are memory channels, and the chopping logic is configured to both detect and then chop individual burst transactions that cross the channel address boundary in the first aggregate target to allow burst sizes and starting addresses of each burst transaction to be independent from the channel boundary.

4. The apparatus of claim 3, wherein the interconnect implements the address map with assigned address for the target IP cores in the integrated circuit to route the transactions between the target IP cores and the initiator IP cores in the integrated circuit, and each memory channel is divided up in defined memory interleave segments and then interleaved with memory interleave segments from other memory channels, and each memory interleave segment of those memory channels being defined and interleaved in the address space at a size granularity unconstrained by a predefined burst length request.

5. The apparatus of claim of claim 1, wherein the interconnect implements logic configured to support multiple burst transactions issued from a first initiator IP core to the first aggregate target IP core, while maintaining an expected execution order within the multiple burst transactions, wherein the logic supports a second of the burst transactions being issued from the first initiator IP core to a second target IP core before a first of the burst transactions issued from the same first initiator IP core to the first aggregate target IP core has completed while ensuring that the first burst transaction completes before the second burst transaction, and where the logic does not include any reorder buffering and while is configured to ensure that ensuring an expected execution order within the first burst transaction is maintained.

6. The apparatus of claim 1, further comprising:
   wherein the two or more channels of the first aggregate target each populate a separate IP address space but the first aggregate target appears as a single target to the initiator IP cores;
   where the two or more channels are memory channels; and
   an initiator agent interfacing the interconnect for a first initiator IP core is configured to interrogate the address map based on a logical destination address associated with a first request to the first aggregate target of the interleaved two or more memory channels and determines which memory channels will service the first request and how to route the first request to the physical IP addresses of each memory channel in the first aggregate target servicing that request so that the first initiator IP core need not know of a physical IP addresses of each memory channel in the first aggregate target, wherein a size granularity of a memory interleave segment is a defined length between a minimum burst length request allowed by a DRAM memory design specification configured into the DRAM and a predetermined maximum DRAM memory page length as recognized by the memory configuration, and the size of this granularity between the minimum burst length request allowed and the predetermined maximum DRAM memory page length is configurably set in a configuration register.

7. The apparatus of claim 3, wherein the two or more memory channels are interleaved in the address space of the system address map to enable automatic statistical spreading of application requests across each of the memory channels over time, to avoid locations of uneven load balancing between distinct memory channels that can arise when too much traffic targets a subset of the memory channels making up the first aggregated target, and wherein the address map is divided up into two or more regions and each interleaved memory interleave segment is assigned to at least one of those regions and populates the address space for that region.

8. The apparatus of claim 3, further comprising:
memory interleave segments in the address space assigned to a first region having a unique tiling function used in two dimensional (2D) memory page retrieval for the 2-D block request and the memory interleave segments are addressable through a memory scheduler, wherein a first memory channel has defined memory interleave segments in the address space of two or more regions, where a memory controller and the memory scheduler connect downstream of a target agent that interfaces with the interconnect.

9. The apparatus of claim 3, wherein the two or more discreet memories memory channels include on-chip IP memory cores and off-chip memory cores that are interleaved with each other to appear to system software and other initiator IP cores as a single memory in the address space.

10. A non-transitory machine-readable medium having data and instructions stored thereon, which, when executed by a machine, cause the machine to generate a representation of the apparatus of claim 1.

11. The non-transitory machine-readable medium of claim 10, wherein the machine-readable medium stores an Electronic Design Automation (EDA) toolset used in a System-on-a-Chip design process that has the data and instructions to generate the representations of the apparatus.

12. The apparatus of claim 1, wherein a first target IP core partially populates the addressable channels within the first target IP core.

13. The apparatus of claim 4, wherein the memory interleave segments are addressable through a memory scheduler and each memory channel has two or more defined memory interleave segments and is allocated to a region dedicated for 2D data.

14. The apparatus of claim 1, further comprising:
where the chopping logic is internal to the interconnect and is configured to chop individual burst transactions that cross channel boundaries headed for channels in the first aggregate target into two or more requests.

15. The apparatus of claim 14, wherein the chopping logic is configured to chop the individual transactions that cross channel boundaries headed for channels in the first aggregate target so that the two or more or resulting requests retain their 2D burst attributes.

16. A method, comprising:
routing transactions over an interconnect for an Integrated Circuit between one or more initiator IP cores and multiple target IP cores including one or more aggregate targets coupled to the interconnect, wherein two or more channels populate an address space assigned to a first aggregate target and appear as a single target to the initiator IP cores; and
chopping an individual transaction from a first initiator IP core that crosses a channel address boundary from a first channel to a second channel within the first aggregate target into two or more burst transactions that each fit within the address boundaries of a single channel, where the interconnect implements the chopping logic at two or more distributed locations within the interconnect.

17. A non-transitory machine-readable medium having data and instructions stored thereon, which, when executed by a machine, cause the machine to perform the operations in claim 16, wherein the machine-readable medium stores an Electronic Design Automation (EDA) toolset used in a System-on-a-Chip design process that has the data and instructions to perform the operations in claim 16.

18. An Integrated Circuit, comprising:
multiple initiator IP cores;
multiple target IP cores including memory IP cores; and
an interconnect coupled to the multiple initiator IP cores and the multiple target IP cores, where the interconnect is configured to implement implements an address map with assigned address for the target IP cores in the Integrated Circuit to route requests between the target IP cores and the initiator IP cores and a first aggregate target of the target IP cores includes two or more memory channels that are interleaved in an address space for the first aggregate target in the address map, where each memory channel is divided up in defined memory interleave segments and then interleaved with memory interleave segments from other memory channels, and each memory interleave segment of those memory channels being defined and interleaved in the address space at a size granularity unconstrained by a predefined burst length request, where the address map has a plurality of regions, where each region in the address map has its own configuration register to set its own configurable parameters to control the size granularity of the memory interleave segments in the address space assigned to that region, wherein each region's configuration register cooperates with chopping logic distributed in two or more discrete locations within the interconnect to allow the size granularity of memory interleave segment to be a defined length between a minimum burst length request allowed by a DRAM memory design specification configured into the DRAM and an anticipated a predetermined maximum DRAM memory page length as recognized by the memory configuration, and the size of this granularity between the minimum burst length request allowed and the predetermined maximum DRAM memory page length is configurably set in that region's configuration register, and where a memory controller and a memory scheduler for the memory IP cores connect downstream of a target agent that interfaces with the interconnect.

19. The system of claim 18, wherein the two or more memory channels are interleaved in the address space of the system address map to enable automatic statistical spreading of application requests across each of the memory channels over time, to avoid locations of uneven load balancing between distinct memory channels that can arise when too much traffic targets a subset of the memory channels making up the first aggregated target.

20. The system of claim 18, wherein a first memory channel has defined memory interleave segments in the address space of two or more regions and memory interleave segments in the address space assigned to a first region having a unique tiling function used in two dimensional (2D) memory page retrieval for the 2-D block request and the memory interleave segments are addressable through the memory scheduler.

* * * * *